US012211796B2

(12) United States Patent
Waidhas et al.

(10) Patent No.: US 12,211,796 B2
(45) Date of Patent: Jan. 28, 2025

(54) MICROELECTRONIC ASSEMBLIES HAVING TOPSIDE POWER DELIVERY STRUCTURES

(71) Applicant: Intel Corporation, Santa Clara, CA (US)

(72) Inventors: Bernd Waidhas, Pettendorf (DE); Carlton Hanna, Santa Jose, CA (US); Stephen Morein, San Jose, CA (US); Lizabeth Keser, San Diego, CA (US); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 683 days.

(21) Appl. No.: 17/355,747

(22) Filed: Jun. 23, 2021

(65) Prior Publication Data

US 2022/0415806 A1 Dec. 29, 2022

(51) Int. Cl.
H01L 23/538 (2006.01)
H01L 23/50 (2006.01)
H01L 23/522 (2006.01)

(52) U.S. Cl.
CPC .......... H01L 23/5384 (2013.01); H01L 23/50 (2013.01); H01L 23/5222 (2013.01); H01L 23/5227 (2013.01); H01L 23/5385 (2013.01); H01L 23/5386 (2013.01)

(58) Field of Classification Search
CPC . H01L 23/5384; H01L 23/50; H01L 23/5222; H01L 23/5227; H01L 23/5385; H01L 23/5386
See application file for complete search history.

(56) References Cited

U.S. PATENT DOCUMENTS

| 6,873,529 | B2 | 3/2005 | Ikuta et al. |
|---|---|---|---|
| 6,961,245 | B2 | 11/2005 | Ikuta et al. |
| 7,173,842 | B2 | 2/2007 | Isenberger et al. |
| 7,245,507 | B2 | 7/2007 | DiBene et al. |
| 7,279,795 | B2 | 10/2007 | Periaman et al. |
| 7,517,787 | B2 | 4/2009 | Agraharam et al. |
| 7,786,591 | B2 | 8/2010 | Khan et al. |
| 8,089,777 | B2 | 1/2012 | Negishi |
| 8,294,252 | B1 * | 10/2012 | Patel ................ H01L 25/0652 438/109 |
| 8,363,402 | B2 | 1/2013 | Brunschwiler et al. |
| 8,890,628 | B2 | 11/2014 | Nair et al. |
| 10,236,209 | B2 | 3/2019 | Sharan et al. |
| 10,950,550 | B2 | 3/2021 | Qian et al. |
| 2004/0188813 | A1 | 9/2004 | Agraharam et al. |

(Continued)

Primary Examiner — Peniel M Gumedzoe
(74) Attorney, Agent, or Firm — Akona IP PC

(57) ABSTRACT

Microelectronic assemblies, related devices and methods, are disclosed herein. In some embodiments, a microelectronic assembly may include a package substrate including a first conductive pathway electrically coupled to a power source; a first microelectronic component, embedded in an insulating material on the surface of the package substrate, including a through-substrate via (TSV) electrically coupled to the first conductive pathway; a second microelectronic component embedded in the insulating material; and a redistribution layer on the insulating material including a second conductive pathway electrically coupling the TSV, the second microelectronic component, and the first microelectronic component.

20 Claims, 28 Drawing Sheets

(56) References Cited

U.S. PATENT DOCUMENTS

| | | |
|---|---|---|
| 2014/0110788 A1 | 4/2014 | Cho et al. |
| 2014/0225248 A1* | 8/2014 | Henderson .......... H01L 23/5383 |
| | | 438/122 |
| 2016/0358848 A1 | 12/2016 | Meyer et al. |
| 2017/0284636 A1 | 10/2017 | Dittes et al. |
| 2018/0286815 A1 | 10/2018 | Qi et al. |
| 2019/0333876 A1* | 10/2019 | Yudanov ............... H01L 23/645 |
| 2020/0043891 A1 | 2/2020 | Yu et al. |
| 2020/0321275 A1 | 10/2020 | Haba et al. |
| 2021/0005592 A1 | 1/2021 | Lee et al. |
| 2021/0111147 A1 | 4/2021 | Liff et al. |
| 2021/0208649 A1 | 7/2021 | Ji et al. |

\* cited by examiner

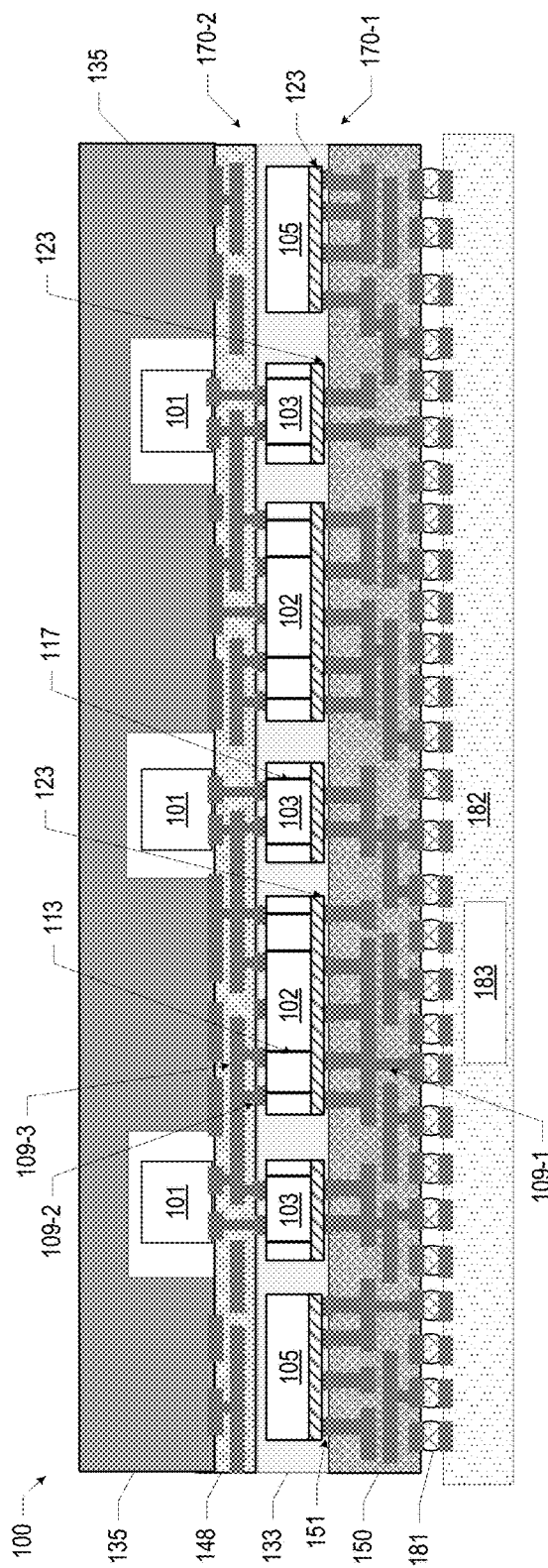
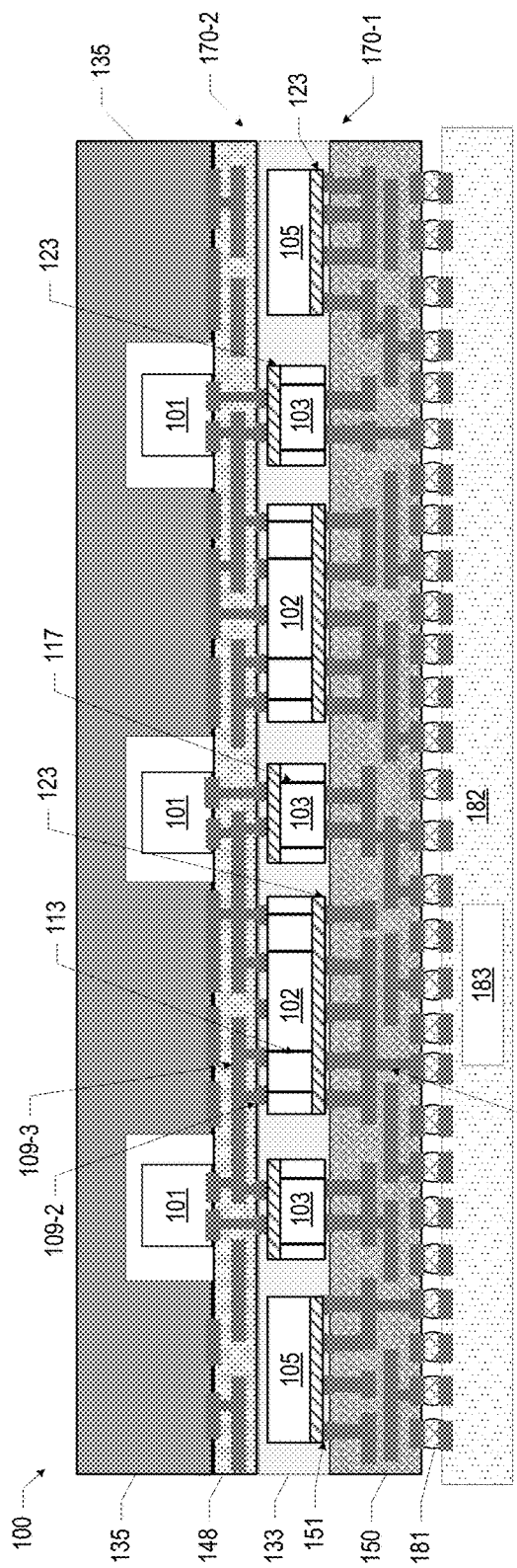
FIG. 1
FIG. 2

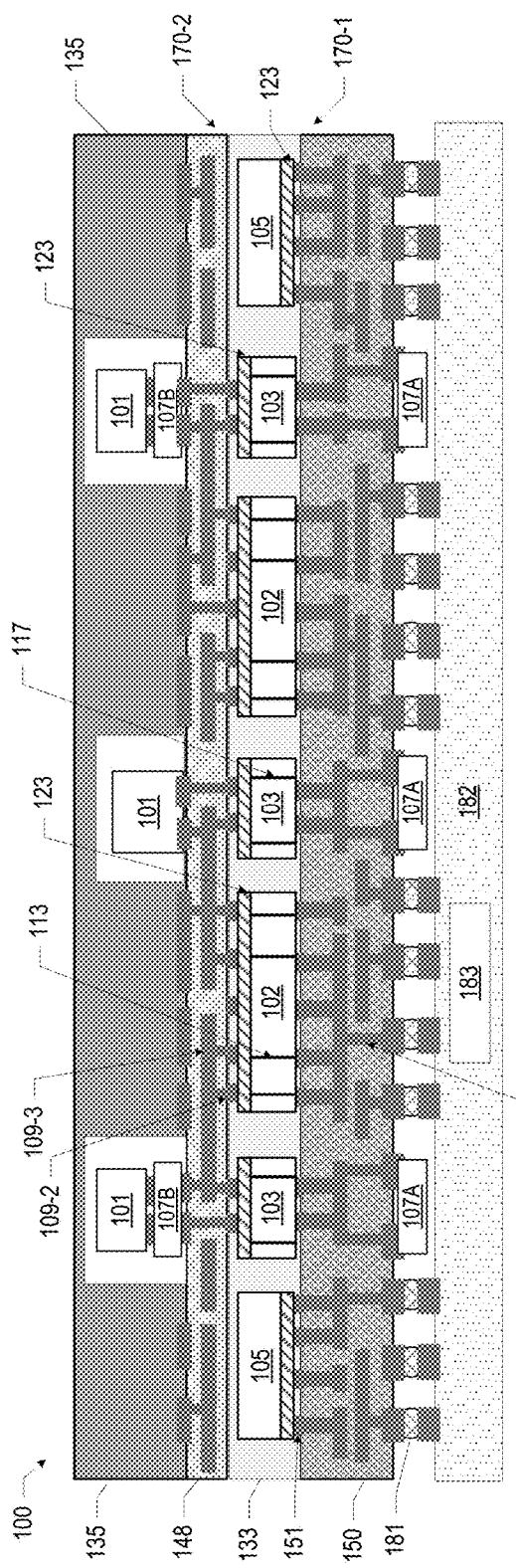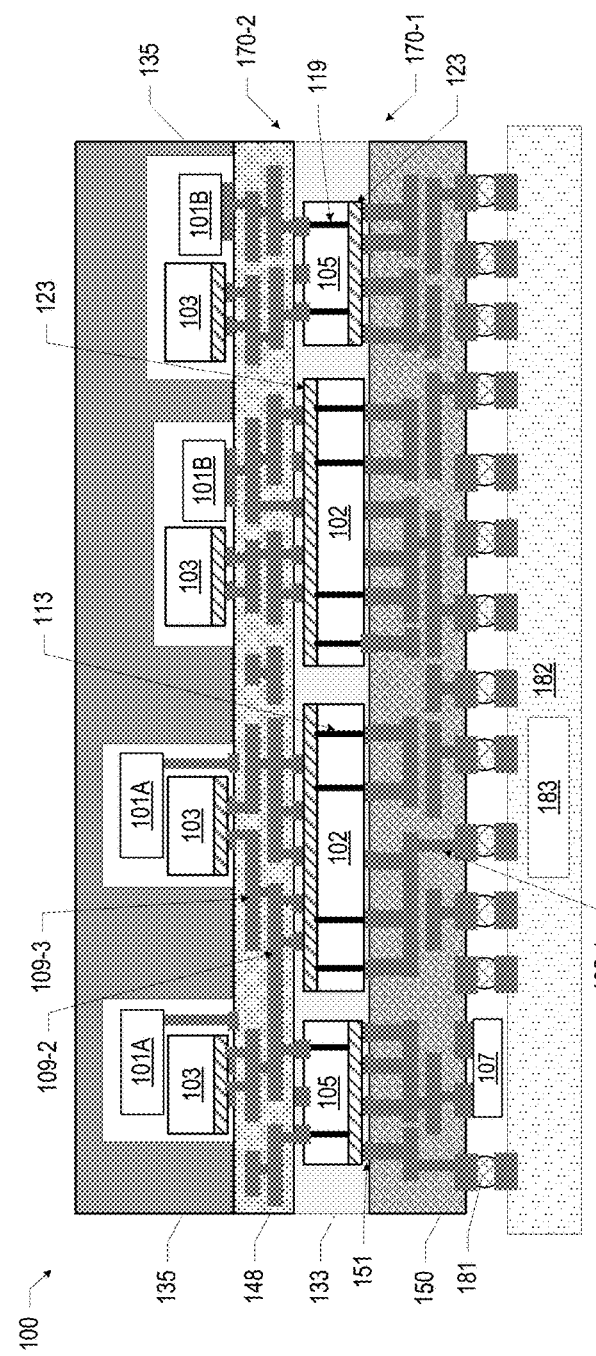

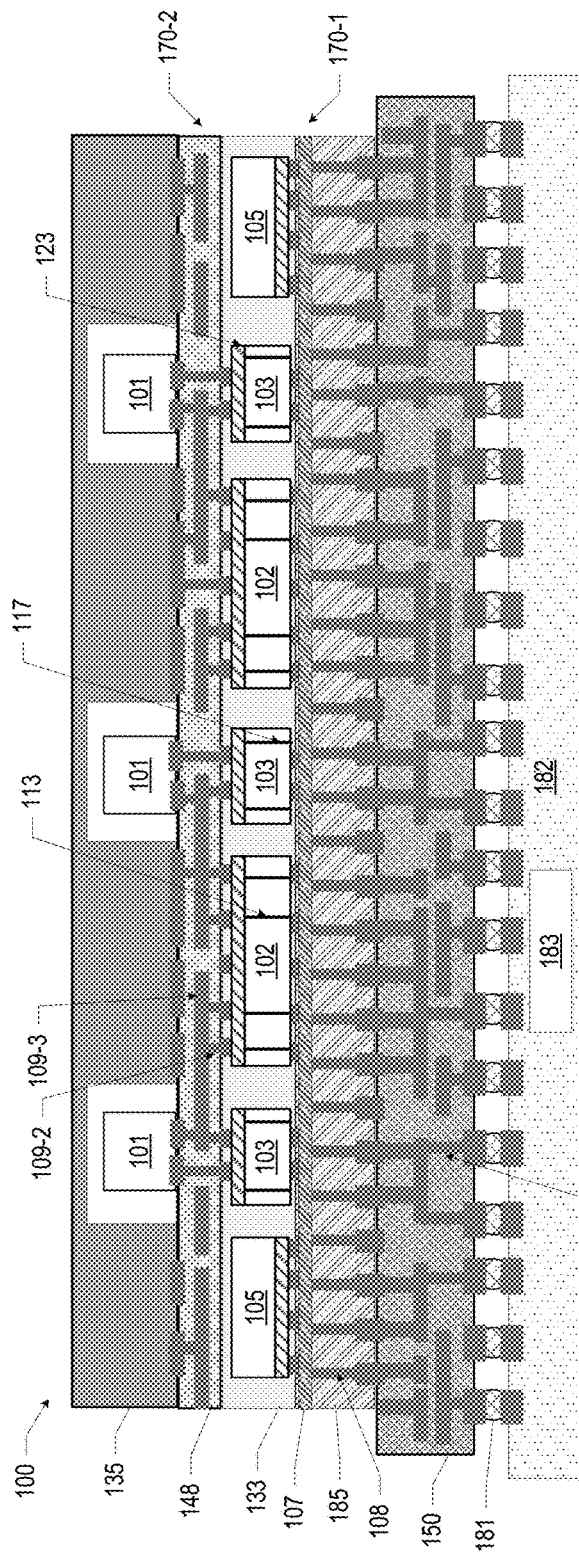
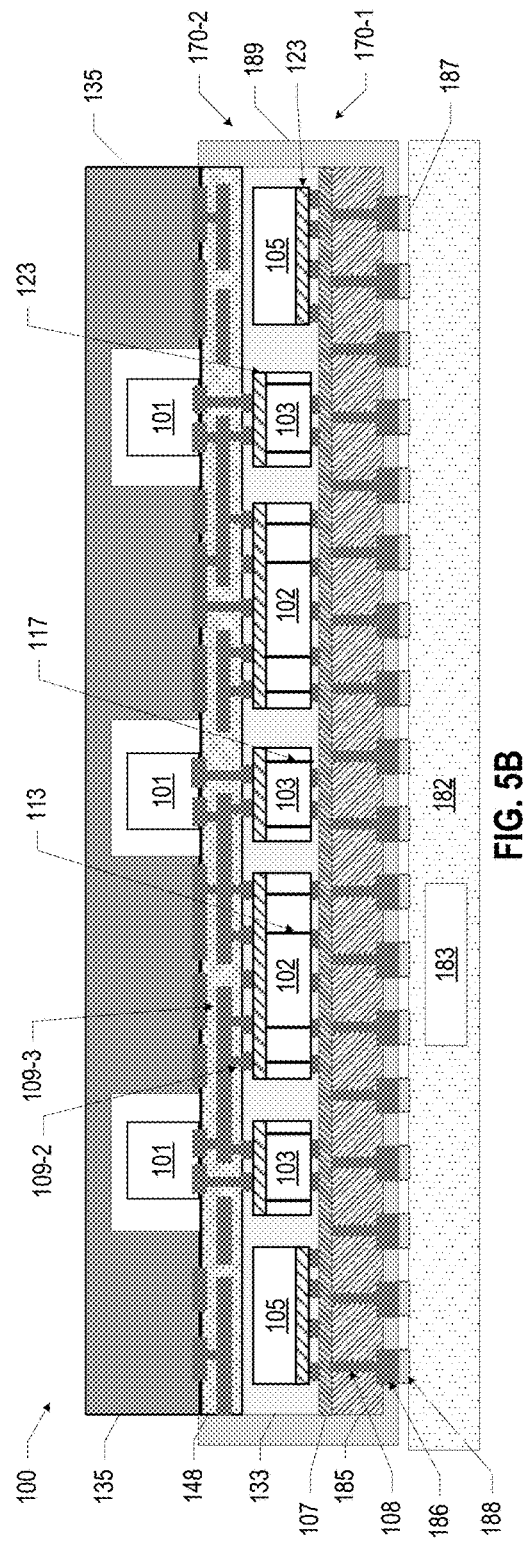
FIG. 5A
FIG. 5B

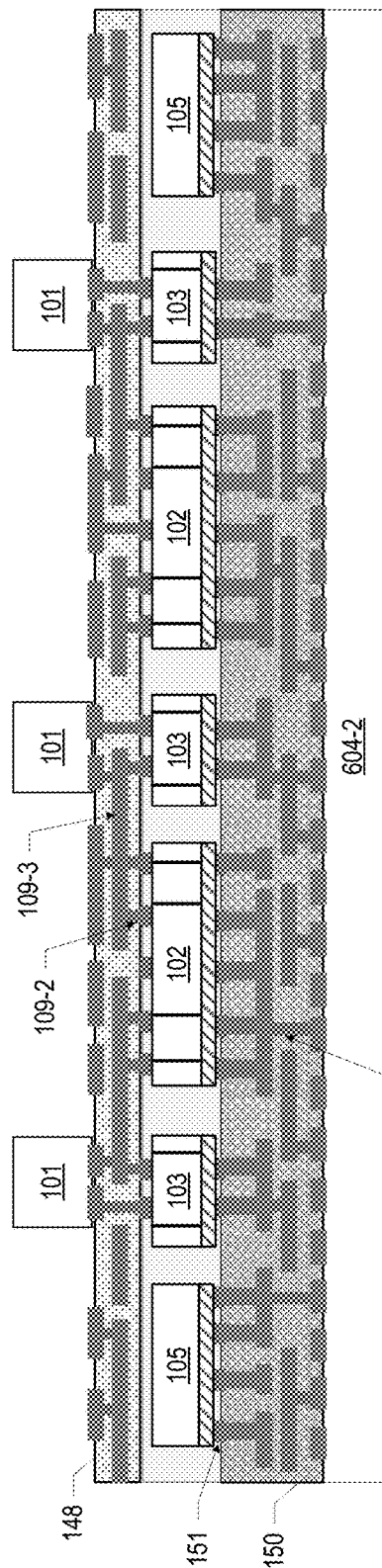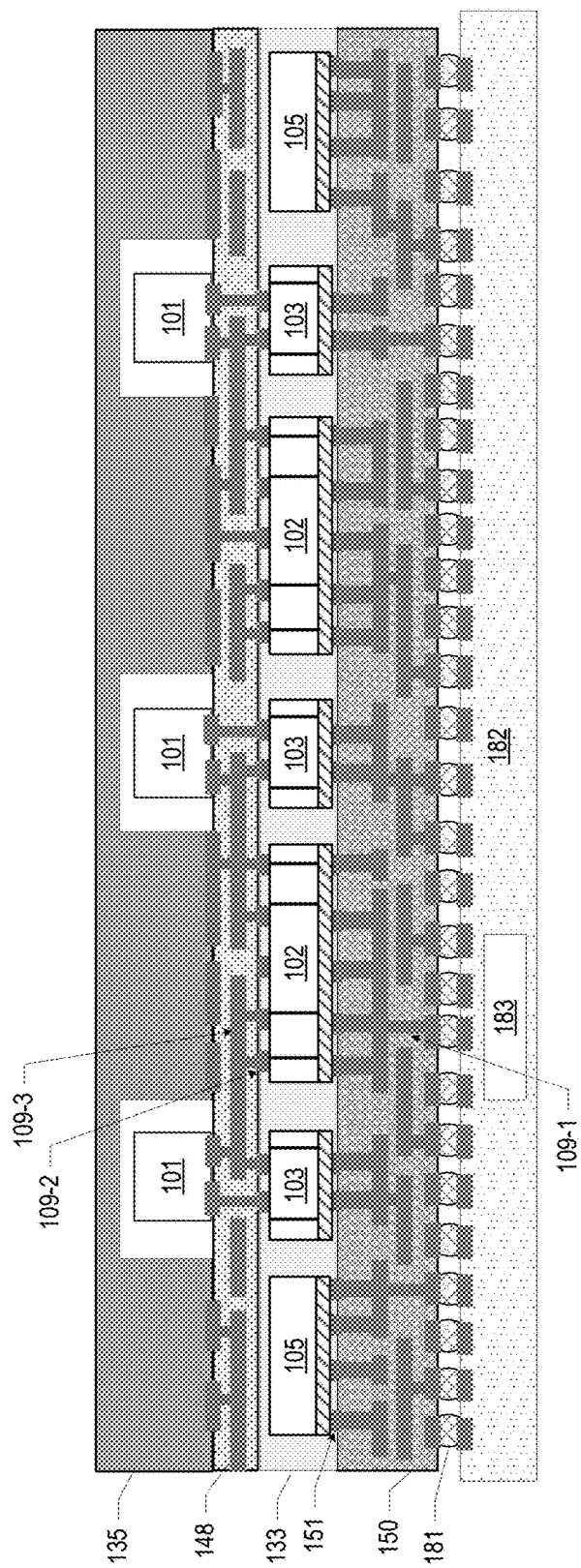

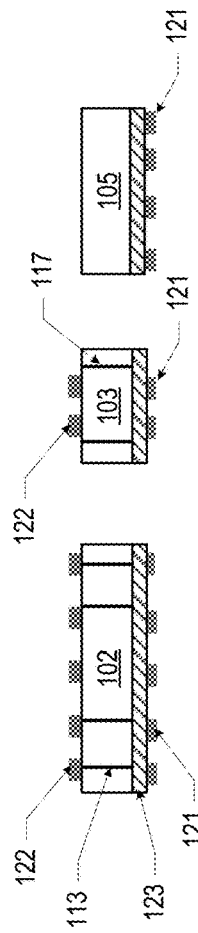
FIG. 7A
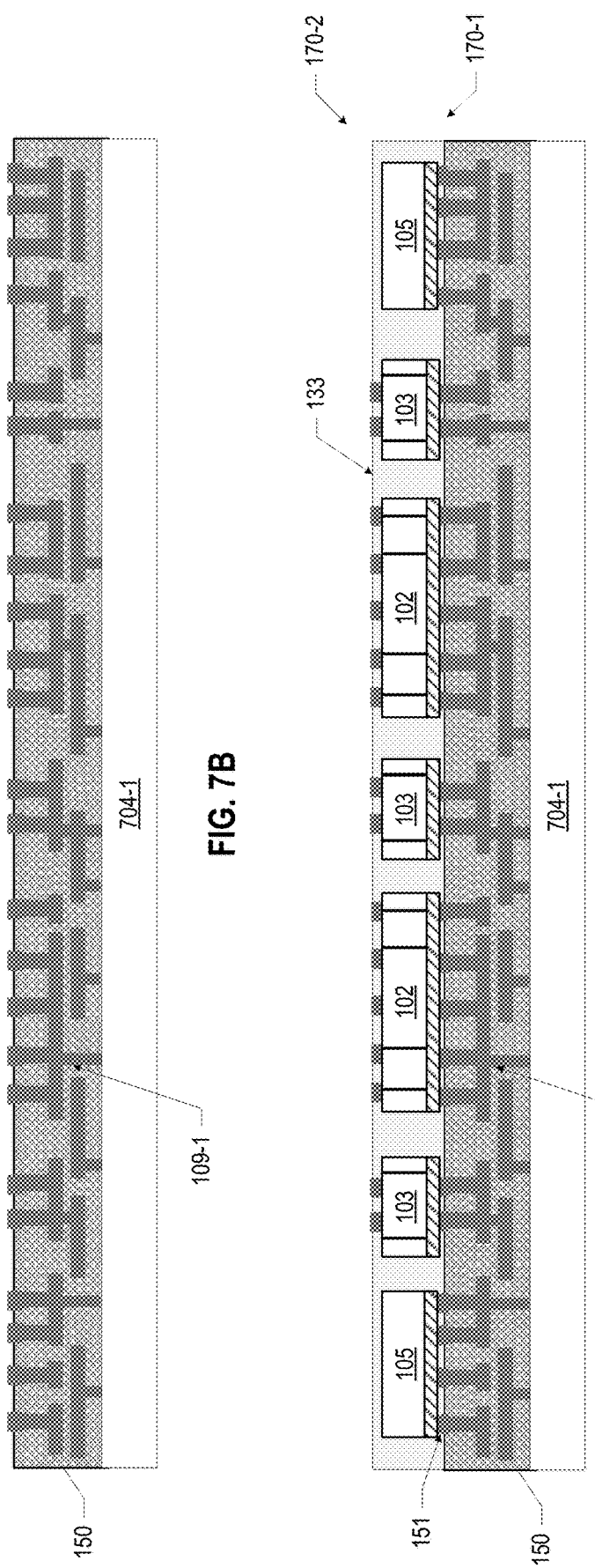
FIG. 7B
FIG. 7C

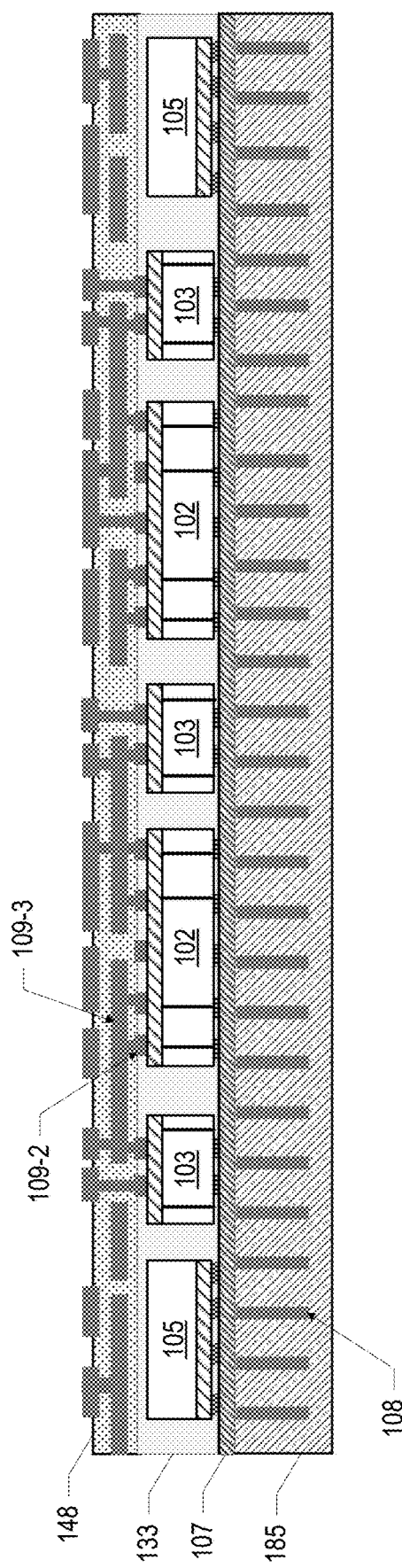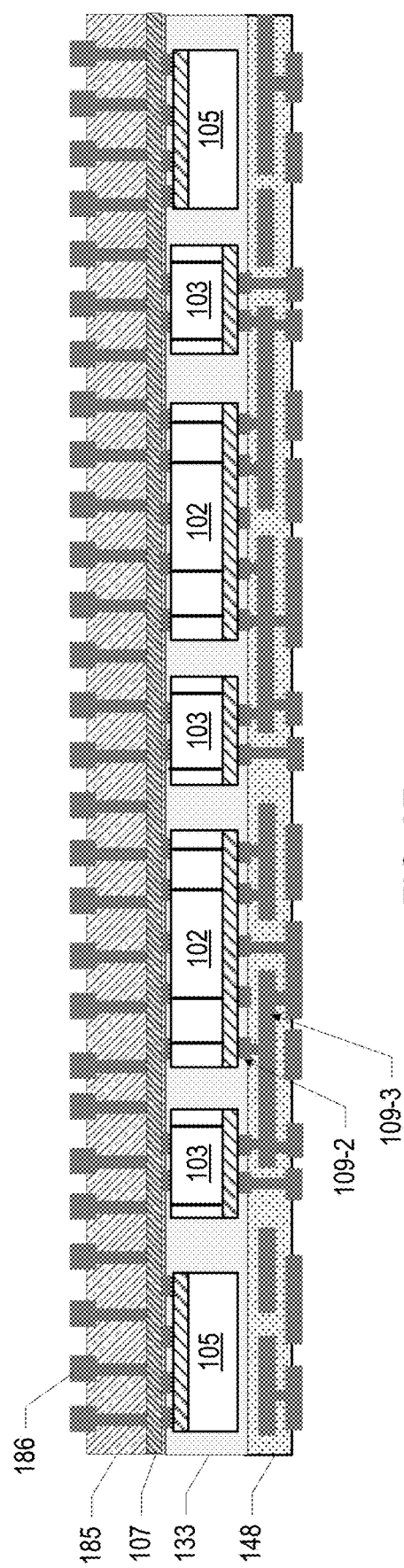
FIG. 8D
FIG. 8E

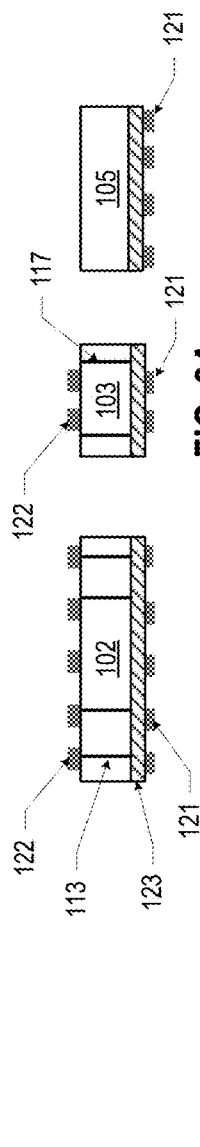
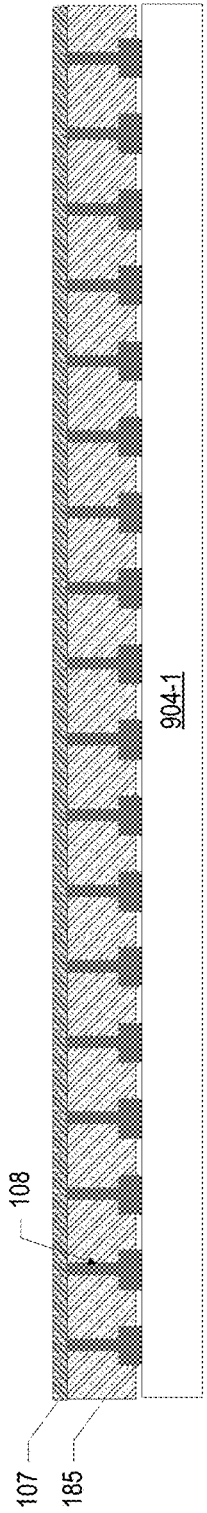
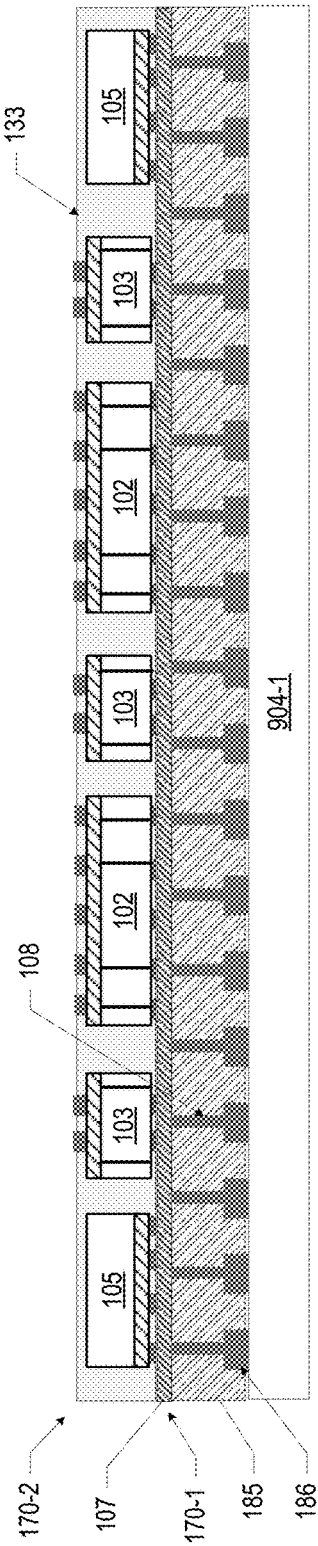
FIG. 9A
FIG. 9B
FIG. 9C
FIG. 9D

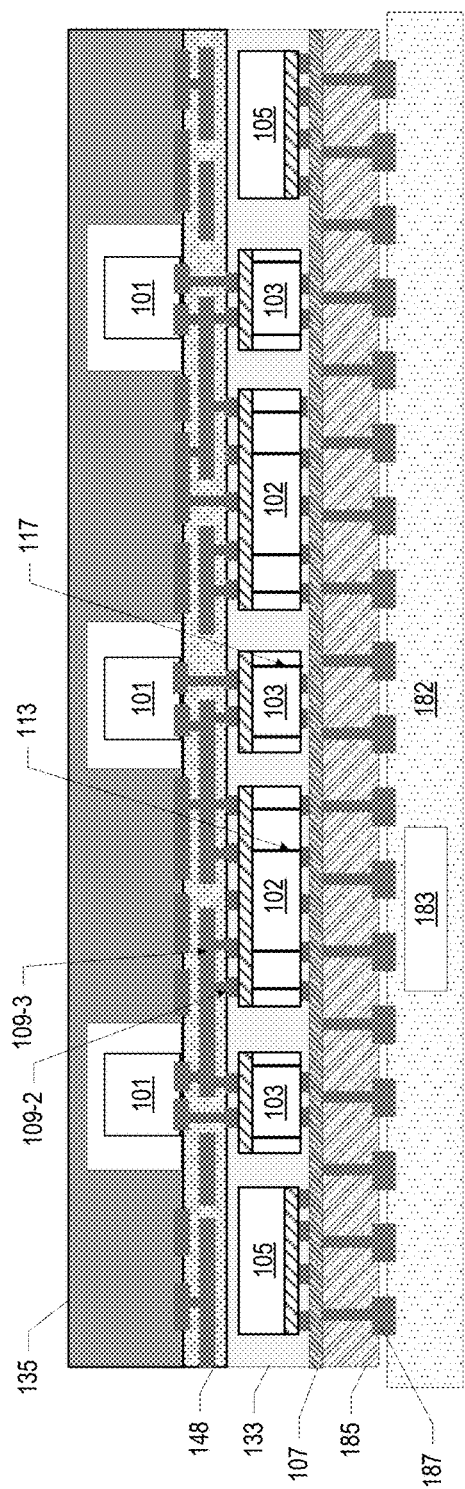
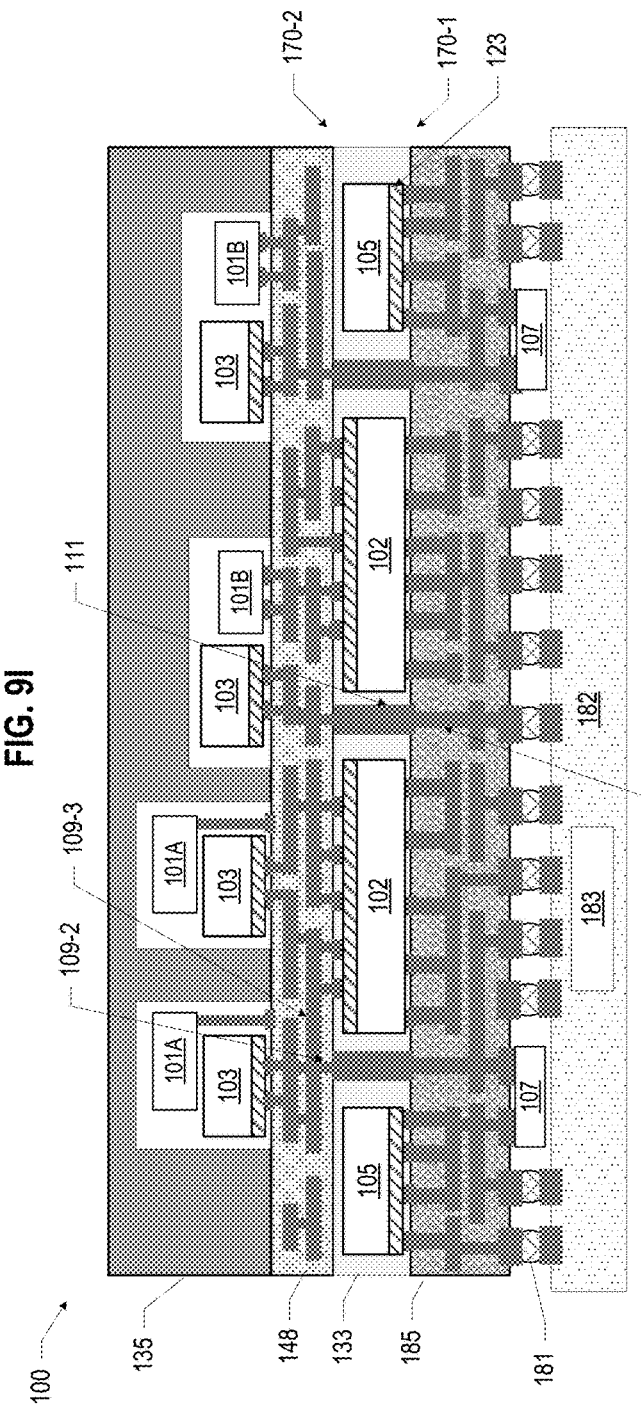

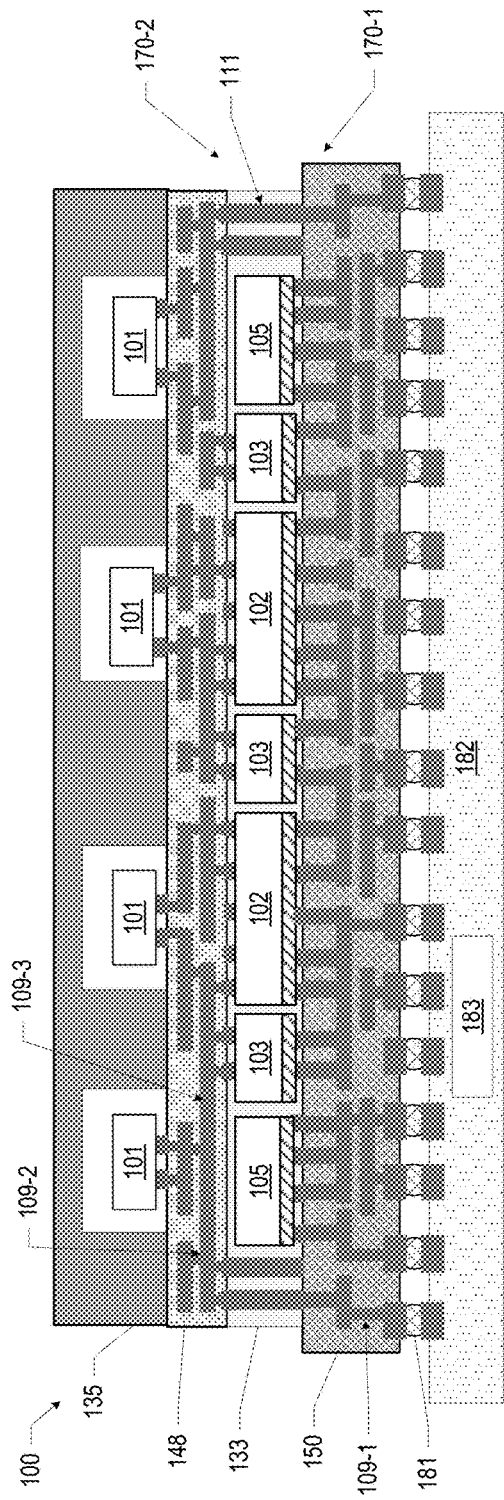
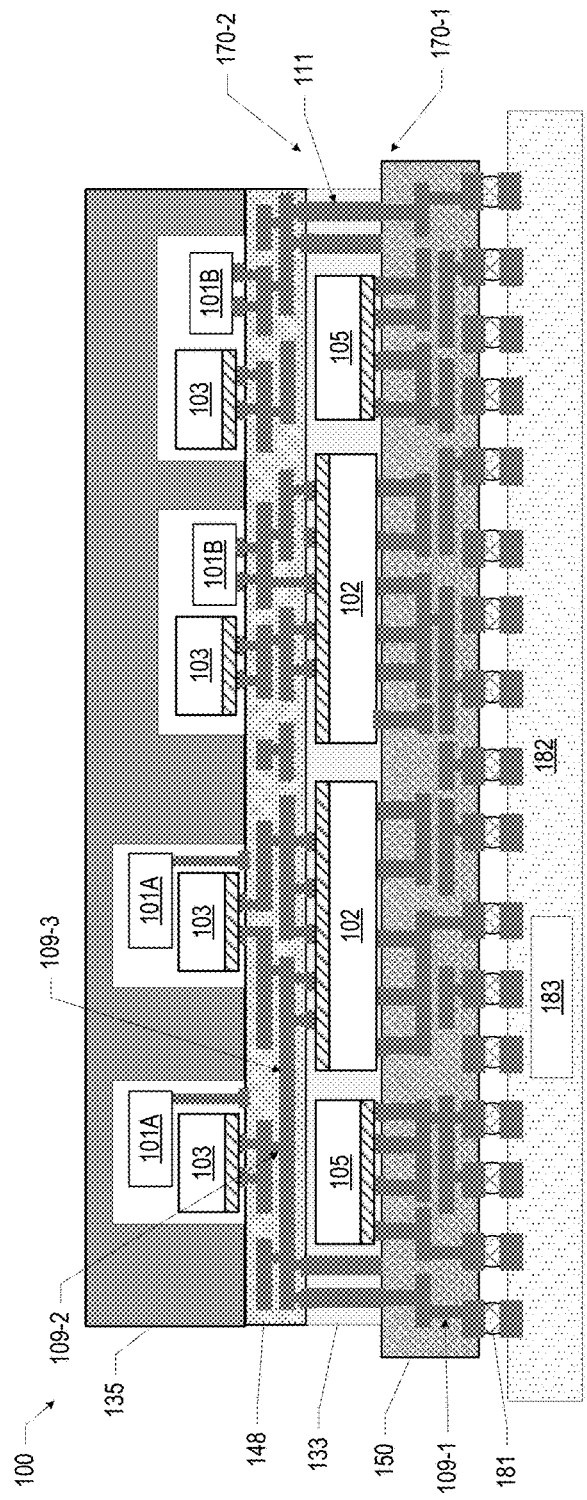
FIG. 12A
FIG. 12B

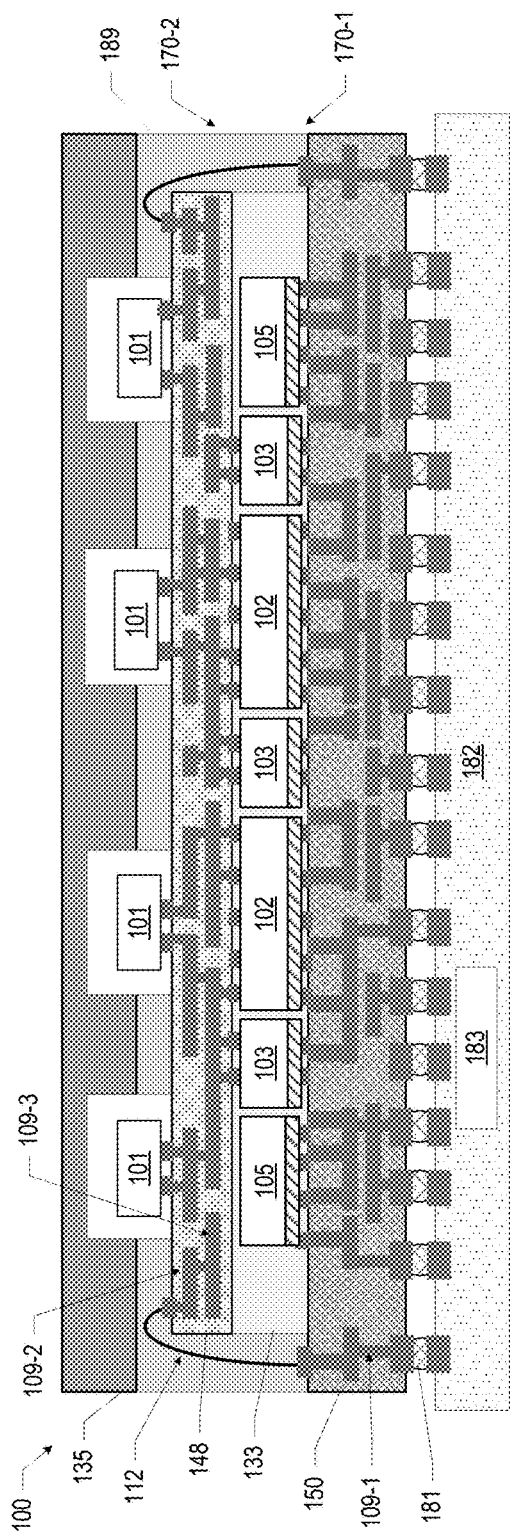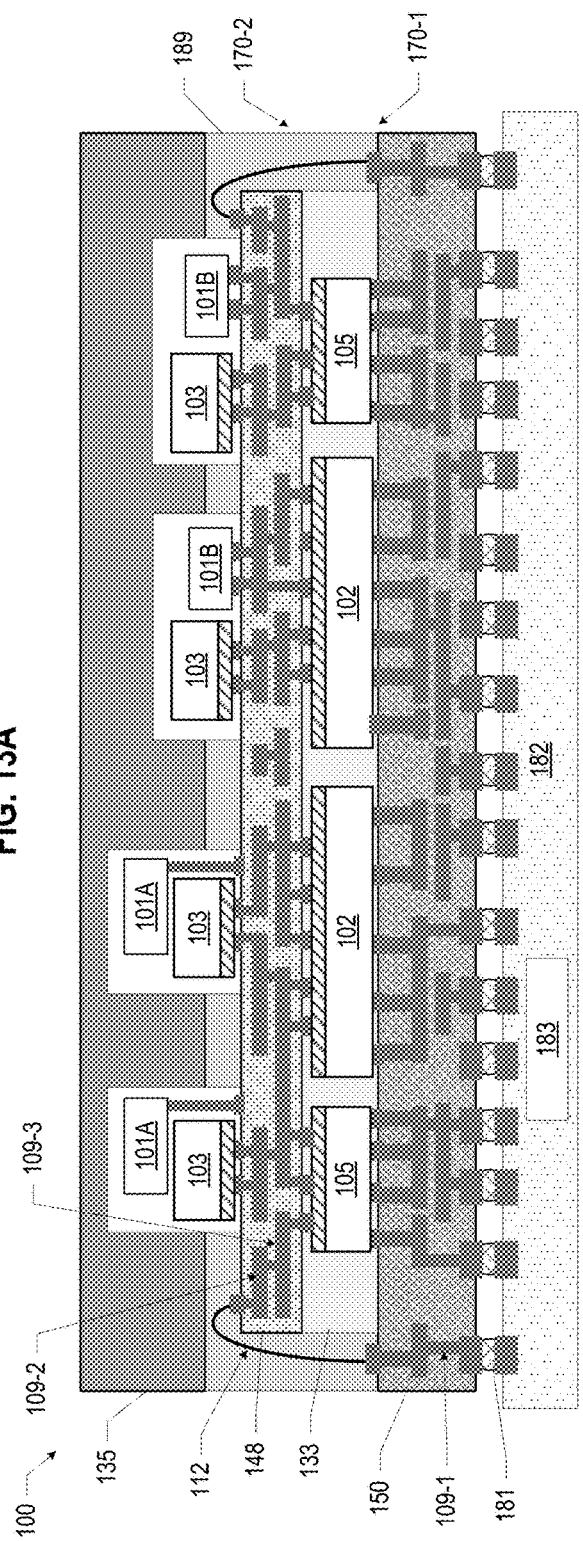

MICROELECTRONIC ASSEMBLIES HAVING TOPSIDE POWER DELIVERY STRUCTURES

BACKGROUND

An integrated circuit (IC) package may include a power delivery network having a processing component, a voltage regulator, and an input/output (I/O) die to manage power delivery to the IC components in the IC package. An IC package may include thousands of power interconnects to deliver low voltage power to the IC components in the IC package.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 1 is a side, cross-sectional view of an example microelectronic assembly, in accordance with various embodiments.

FIG. 2 is a side, cross-sectional view of an example microelectronic assembly, in accordance with various embodiments.

FIG. 3 is a side, cross-sectional view of an example microelectronic assembly, in accordance with various embodiments.

FIG. 4 is a side, cross-sectional view of an example microelectronic assembly, in accordance with various embodiments.

FIGS. 5A and 5B are side, cross-sectional views of example microelectronic assemblies, in accordance with various embodiments.

FIGS. 6A-6G are side, cross-sectional views of various stages in an example process for manufacturing the microelectronic assembly of FIG. 1, in accordance with various embodiments.

FIGS. 7A-7G are side, cross-sectional views of various stages in another example process for manufacturing the microelectronic assembly of FIG. 1, in accordance with various embodiments.

FIGS. 8A-8H are side, cross-sectional views of various stages in an example process for manufacturing the microelectronic assembly of FIG. 5A, in accordance with various embodiments.

FIGS. 9A-9I are side, cross-sectional views of various stages in an example process for manufacturing the microelectronic assembly of FIG. 5B, in accordance with various embodiments.

FIG. 10 is a side, cross-sectional view of an example microelectronic assembly, in accordance with various embodiments.

FIGS. 12A and 12B are side, cross-sectional views of example microelectronic assemblies, in accordance with various embodiments.

FIGS. 13A and 13B are side, cross-sectional views of example microelectronic assemblies, in accordance with various embodiments.

DETAILED DESCRIPTION

Figure 6A:
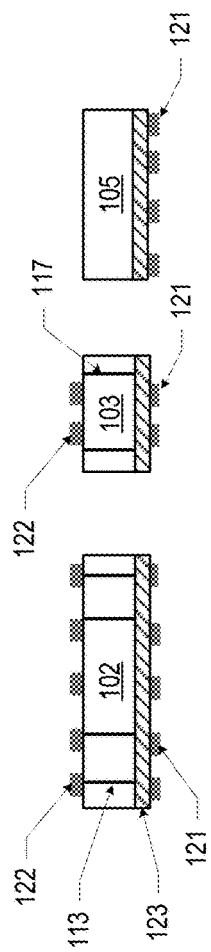

Microelectronic assemblies, related devices and methods, for topside power delivery to a microelectronic component are disclosed herein. For example, in some embodiments, a microelectronic assembly may include a package substrate, having a surface, including a first conductive pathway electrically coupled to a power source; an insulating material on the surface of the package substrate; a first microelectronic component, having a first surface and an opposing second surface, the first surface facing the package substrate, embedded in the insulating material; a second microelectronic component, having a first surface and an opposing second surface, the first surface facing the package substrate, embedded in the insulating material; a redistribution layer on the insulating material including a second conductive pathway electrically coupling the second surface of the second microelectronic component and the second surface of the first microelectronic component; and a wire bond electrically coupling the first conductive pathway and the second conductive pathway. In some embodiments, a microelectronic assembly may include a package substrate, having a surface, including a first conductive pathway electrically coupled to a power source; an insulating material on the surface of the package substrate; a first microelectronic component, having a first surface and an opposing second surface, embedded in the insulating material with the first surface facing the package substrate; a second microelectronic component, having a first surface and an opposing second surface, embedded in the insulating material with the first surface facing the package substrate; a through-mold via (TMV), positioned along a perimeter of the insulating material, extending through the insulating material and electrically coupled to the first conductive pathway; and a redistribution layer on the mold material including a second conductive pathway electrically coupling the TMV, the second microelectronic component, and the second surface of the first microelectronic component. In some embodiments, a microelectronic assembly may include a package substrate, having a surface, including a first conductive pathway electrically coupled to a power source; a first microelectronic component, having a first surface electrically coupled to the surface of the package substrate and an opposing second surface, embedded in an insulating material on the surface of the package substrate and including a through-substrate via (TSV) electrically coupled to the first conductive pathway; a second microelectronic component, having a first surface electrically coupled to the surface of the package substrate and an opposing second surface, embedded in the insulating material; and a redistribution layer on the insulating material including a second conductive pathway electrically coupling the TSV, the second surface of the second microelectronic component, and the second surface of the first microelectronic component. In some embodiments, a microelectronic assembly may include a package substrate, having a surface, including a first conductive pathway electrically coupled to a power source; a first microelectronic component, having a first surface electrically coupled to the surface of the package substrate and an opposing second surface, embedded in an insulating material on the surface of the package substrate and including a TSV electrically coupled to the first conductive pathway; a redistribution layer, having a first surface on the insulating material and an opposing second surface, including a second conductive pathway electrically coupled to the TSV; and a second microelectronic component at the second surface of the redistribution layer and electrically coupled to the second conductive pathway, wherein the second conductive pathway electrically couples the TSV, the second microelectronic component, and the second surface of the first microelectronic component. In some embodiments, a microelectronic assembly may include a package substrate, having a surface, including a first conductive pathway electrically coupled to a power source; a mold material on the surface of the package substrate including a first microelectronic component, having a first surface and an opposing second surface, embedded in the mold material, a second microelectronic component embedded in the mold material, and a TMV, between the first and second microelectronic components, the TMV electrically coupled to the first conductive pathway; a redistribution layer, having a first surface on the mold material and an opposing second surface, including a second conductive pathway electrically coupled to the TMV; and a third microelectronic component at the second surface of the redistribution layer and electrically coupled to the second conductive pathway, wherein the second conductive pathway electrically couples the TMV, the third microelectronic component, and the second surface of the first microelectronic component.

Communicating large numbers of signals in a multi-die IC package is difficult due to the small size of such dies, design challenges with routing a growing number of signal and power interconnects, and constraints associated with power delivery, among others. Power delivery networks (PDNs) typically include voltage regulators (VRs) are commonly used in electronics and communications applications to regulate voltage for power delivery. Conventional VRs, such as buck regulators, typically include a voltage input, a voltage output, an input capacitor, an output capacitor, an inductor, a switching transistor and/or a diode, and a control circuit having a plurality of transistors to perform voltage regulation and to control the switching transistor and/or diode. Power delivery for integrated multi-die IC packages is becoming increasingly complex with different components having different functionalities and different voltage requirements. For example, a high power processing IC package may include multiple dies having multiple cores and multiple VRs associated with each die and/or each core, where each VR regulates power delivery at a same or different voltage/frequency. These cores typically require power delivery from an external power supply, which requires a significant number of power interconnects (e.g., approximately 7,000 power interconnects) that compete with signal interconnects for space on the IC package. Various ones of the embodiments disclosed herein may improve IC package performance with greater design flexibility, at a lower cost, and/or with a reduced size relative to conventional approaches by delivering power to a top surface of the components. Various ones of the microelectronic assemblies disclosed herein may exhibit better power delivery while decreasing the required number of power interconnects and reducing the size of the package relative to conventional approaches. The microelectronic assemblies disclosed herein may be particularly advantageous for high performance applications in computers, servers, deep learning, and artificial intelligence (AI) training.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and describe a relative orientation of one component to another component, such that the relative orientations still apply even when the drawing is inverted. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. As used herein, the term "thickness" refers to a dimension of a certain element or layer as measured along the z-axis, the term "width" refers to a dimension of a certain element or layer as measured along the y-axis, while the term "length" refers to a dimension of a certain element or layer as measured along the x-axis. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). For convenience, the phrase "FIG. 5" may be used to refer to the collection of drawings of FIGS. 5A and 5B, the phrase "FIG. 6" may be used to refer to the collection of drawings of FIGS. 6A-6G, etc.

FIG. 1 is a side, cross-sectional view of a microelectronic assembly 100, in accordance with various embodiments. The microelectronic assembly 100 of FIG. 1 may have a topside power delivery pathway that includes a TSV 113, 119. A microelectronic assembly 100 may include a circuit board 182 having a power source 183 electrically coupled to a package substrate 150 having a first conductive pathway 109-1, a first microelectronic component 102 having a through-substrate via (TSV) 113 and a second microelectronic component 103 embedded in an insulting material 133 electrically coupled at a first surface 170-1 to the package substrate 150 and electrically coupled at a second surface 170-2 to a redistribution layer (RDL) 148 having a second conductive pathway 109-2 and a third conductive pathway 109-3. In particular, the first conductive pathway 109-1 in the package substrate 150 may be electrically coupled to the power source 183, the first surface 170-1 of the TSV 113 may be electrically coupled to the first conductive pathway 109-1, the second surface 170-2 of the TSV 113 and the second surface 170-2 of the second microelectronic component 103 may be electrically coupled to the second conductive pathway 109-2, and the second surface 170-2 of the second microelectronic component 103 and the second surface 170-2 of the first microelectronic component 102 may be electrically coupled to the third conductive pathway 109-3, such that power may be supplied to the second surface 170-2 of the first microelectronic component 102 from the power source 183. In some embodiments, the second and third conductive pathways 190-2, 109-3 are a same conductive pathway in the RDL 148.

The second microelectronic component 103 of the microelectronic assembly 100 may further include a TSV 117. In particular, the first surface 170-1 of the TSV 117 may be electrically coupled to the first conductive pathway 109-1 in the package substrate 150 and the second surface 170-2 of the TSV 117 may be electrically coupled to the second conductive pathway 109-2 in the RDL 148, such that power may be supplied to the second surface 170-2 of the first microelectronic component 102 from the power source 183.

The TSVs 113, 117 may be made of any suitable conductive material, such as copper, silver, nickel, gold, aluminum, or other metals or alloys, for example. The TSVs 113, 117 may have any suitable dimensions, for example, the TSVs 113, 117 used for supplying power may have a thickness (e.g., z-height) and/or a width (e.g., y-dimension) that is greater than a thickness or a width of a TSV used to transmit signals. In some embodiments, the TSVs 113, 117 used for supplying power may have a same thickness and/or a width as a TSV used to transmit signals. In some embodiments, a plurality of TSVs 113, 117 may be coupled to an individual conductive contact on a bottom surface 170-1 and/or a top surface 170-2 of a respective microelectronic component 102, 103.

The microelectronic assembly 100 of FIG. 1 may also include a third microelectronic component 105 embedded in the insulating material 133 electrically coupled at the first surface 170-1 to the package substrate 150, and a fourth microelectronic component 101 mounted on a top surface of the RDL 148 and electrically coupled to the second surface of the second microelectronic component 103 (e.g., electrically coupled to the topside power delivery pathway) via the conductive pathways in the RDL 148.

The microelectronic components 101, 102, 103, 105 may include any suitable component configured for supplying power or being supplied power. In some embodiments, the first microelectronic component 102 is a central processing unit, a graphics processing unit, a digital signal processor, an application specific integrated circuit, a server processor, or a crypto processor. In some embodiments, the second microelectronic component 103 is a VR. In some such embodiments, the VR is configured to convert a low current high voltage signal to a low voltage high current signal. In some embodiments, the third microelectronic component 105 is a die having I/O circuitry. In some embodiments, the fourth microelectronic component 101 is an inductor.

In some embodiments, a microelectronic component 102 may include an IC die (packaged or unpackaged) or a stack of an IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 16. In particular, a microelectronic component 102 may include active and/or passive circuitry (e.g., transistors, diodes, resistors, inductors, and capacitors, among others).

The first, second, and third microelectronic components 102, 103, 105 include an active surface 123, which is the surface containing one or more active devices and a majority of interconnects, and an opposing backside surface (not labeled). As shown in FIG. 1, the active surface 123 of the first, second, and third microelectronic components 102, 103, 105 is at the first surface 170-1 (e.g., the active surface faces the package substrate 150). Although FIG. 1 shows the first and second microelectronic components 102, 103 as a double-sided component and the third microelectronic component 105 as single-sided component, the first, second, and third microelectronic components 102, 103, 105 may be a single-sided or a double-sided component and may be a single-pitch component or a mixed-pitch component. In this context, a double-sided component refers to a microelectronic component that has connections on both surfaces (e.g., a first surface 170-1 and a second surface 170-2). In some embodiments, a double-sided component (e.g., the first and second microelectronic components 102, 103) may include TSVs (e.g., TSVs 113, 117) to form connections on both surfaces. In such embodiments, the double-sided component may include TSVs configured to transmit signal data and/or TSVs configured to deliver power. The active surface of a double-sided component may face either direction depending on the design and electrical requirements (as described in more detail below with reference to FIGS. 2 and 3). In some embodiments of the microelectronic assemblies 100 disclosed herein, the microelectronic components 102, 103, and/or 105 embedded in the insulating material 133 may have different thicknesses. The fourth microelectronic component 101 further includes an active surface (not shown) at the bottom surface electrically coupled to the top surface of the RDL 148. In some embodiments, additional components may be disposed on the top surface of the RDL 148. Additional passive components, such as surface-mount resistors, capacitors, and/or additional inductors, may be disposed on the top surface or the bottom surface of the package substrate 150, or may be embedded in the package substrate 150.

The insulating material 133 may include any suitable material. In some embodiments, the insulating material 133 is a mold material, such as an organic polymer with inorganic silica particles. In some embodiments, the insulating material 133 is a dielectric material. In some embodiments, the dielectric material may include an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The insulting material 133 may be formed using any suitable process, including lamination, or slit coating and curing.

The RDL 148 may include an insulating material (e.g., a dielectric material formed in multiple layers, as known in the art) and one or more conductive pathways to route power (e.g., second and third conductive pathways 109-2, 109-3), ground, and signals through the dielectric material (e.g., including conductive traces and/or conductive vias, as shown). The insulating material 133 may extend around and/or between one or more of the microelectronic components 102, 103, 105 on the package substrate 150. In some embodiments, the insulating material 133 may extend above one or more of the microelectronic components 102, 103, 105 on a package substrate 150 (not shown). The conductive pathways, including the second and third conductive pathways 109-2, 109-3, may be made of any suitable conductive material, such as copper, silver, nickel, gold, aluminum, or other metals or alloys, for example. The conductive pathways may have any suitable dimensions, for example, the second and third conductive pathways 109-2, 109-3 used for supplying power may have a thickness (e.g., z-height) and/or a width (e.g., y-dimension) that is greater than a thickness or a width of a conductive pathway used to transmit signals. For example, in some embodiments, the second and third conductive pathways 109-2, 109-3 may have a thickness and/or a width between 5 microns and 25 microns. In some embodiments, the second and third conductive pathways 109-2, 109-3 may have a thickness and/or a width between 5 microns and 15 microns. The RDL 148 may be manufactured using any suitable technique, such as a standard printed board (PCB) technique or a redistribution layer technique. Any of the microelectronic assemblies 100 disclosed herein may include any number of RDLs and may be positioned at the first surface 170-1 and/or the second surface 170-2 of the insulating material 133.

In some embodiments, the package substrate 150 may include a power source (not shown) electrically coupled to the first conductive pathway 109-1. The conductive contacts on the first surface 170-1 of the first, second, and third microelectronic components 102, 103, 105 may be coupled to conductive contacts on a top surface of the package substrate 150 via first level interconnects (FLIs) 151. The FLIs 151 disclosed herein may take any suitable form. In some embodiments, the FLIs 151 may include small conductive bumps (e.g., copper bumps) attached by solder. In some embodiments, the FLIs 151 may include an anisotropic conductive material. In some embodiments, some or all of the FLIs 151 may be metal-to-metal interconnects (e.g., copper-to-copper interconnects, or plated interconnects). In some embodiments, the FLIS 151 may be hybrid bonded interconnects.

The package substrate 150 may include an insulating material (e.g., a dielectric material formed in multiple layers, as known in the art) and one or more conductive pathways to route power, ground, and signals through the dielectric material (e.g., including conductive traces and/or conductive vias, as shown). In some embodiments, the insulating material of the package substrate 150 may be a dielectric material, such as an organic dielectric material, a fire retardant grade 4 material (FR-4), bismaleimide-triazine (BT) resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the package substrate 150 is formed using standard PCB processes, the package substrate 150 may include FR-4, and the conductive pathways in the package substrate 150 may be formed by patterned sheets of copper separated by build-up layers of the FR-4. The conductive pathways in the package substrate 150 may be bordered by liner materials, such as adhesion liners and/or barrier liners, as suitable. The first conductive pathway 109-1—may be made of any suitable conductive material, such as copper, silver, nickel, gold, aluminum, or other metals or alloys, for example. The first conductive pathway 109-1 may have any suitable dimensions, for example, the first conductive pathway 109-1 used for supplying power may have a thickness (e.g., z-height) and/or a width (e.g., y-dimension) that is greater than a thickness or a width of a conductive pathway used to transmit signals. In some embodiments, the first conductive pathway 109-1 used for supplying power may have a same thickness and/or a width as a conductive pathway used to transmit signals. In some embodiments, a plurality of first conductive pathways 109-1 may be coupled to an individual conductive contact on a bottom surface and/or a top surface of package substrate 150.

In some embodiments, the package substrate 150 may be formed using a lithographically defined via packaging process. In some embodiments, the package substrate 150 may be manufactured using standard organic package manufacturing processes, and thus the package substrate 150 may take the form of an organic package. In some embodiments, the package substrate 150 may be a set of redistribution layers formed on a panel carrier by laminating or spinning on a dielectric material, and creating conductive vias and lines by laser drilling and plating. In some embodiments, the package substrate 150 may be formed on a removable carrier using any suitable technique, such as a redistribution layer technique. Any method known in the art for fabrication of the package substrate 150 may be used, and for the sake of brevity, such methods will not be discussed in further detail herein. In other embodiments, the package substrate may be a silicon or glass interposer.

In some embodiments, the package substrate 150 may be a lower density medium and the first, second, and/or third microelectronic components 102, 103, 105 may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a printed circuit board (PCB) manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process.

The microelectronic assembly 100 of FIG. 1 may also include a circuit board 182. In some embodiments, the circuit board 182 may include a power source 183. In some embodiments, the power source 183 may be a component attached to a surface of the circuit board 182. In some embodiments, the power source 183 may be an integrated power source, for example, the circuit board 182 may include a power plane, which may include an input voltage and an output voltage, and a ground plane. The power plane may be a high voltage power plane, a low voltage power plane, or a high/low power plane where the input voltage is a high voltage and the output voltage is a low voltage. As used herein, a power plane may refer to a conductive structure that transmits power and may refer to a conductive planar structure or may refer to a linear conductive structure (e.g., a corridor). As used herein, a ground plane may refer to a conductive structure that connects to ground and may refer to a conductive planar structure or may refer to a linear conductive structure (e.g., a corridor). The power source 183 may be electrically coupled to the first conductive pathway 109-1 in the package substrate 150 via second-level interconnects (SLIs) 181 at the bottom surface of the package substrate 150. The SLIs 181 may be any suitable second-level interconnects, including solder balls for a ball grid array arrangement (as shown), pins in a pin grid array arrangement or lands in a land grid array arrangement. The circuit board 182 may be a motherboard, for example, and may have other components attached to it. The circuit board 182 may include conductive pathways and other conductive contacts for routing power, ground, and signals through the circuit board, as known in the art. In some embodiments, the second-level interconnects 181 may not couple the package substrate 150 to a circuit board 182, but may instead couple the package substrate 150 to another IC package, an interposer, or any other suitable component.

The microelectronic assembly 100 of FIG. 1 may also include a heat transfer structure 135, for example, a heat spreader. The heat transfer structure 135 may be used to move heat away from the microelectronic components 102, 103, 105 (e.g., so that the heat may be more readily dissipated by a heat sink or other thermal management device). The heat transfer structure 135 may include any suitable thermally conductive material (e.g., metal, appropriate ceramics, etc.), and may include any suitable features (e.g., fins). In some embodiments, the heat transfer structure 333 may be an integrated heat transfer structure. The microelectronic assembly 100 of FIG. 1 may also include a highly thermally conductive mold material or a thermal interface material (TIM) (not shown) between the top surface of the RDL 148 and the bottom surface of the heat transfer structure 135. The TIM may include a thermally conductive material (e.g., metal particles) in a polymer or other binder. The TIM may be a thermal interface material paste or a thermally conductive epoxy (which may be a fluid when applied and may harden upon curing, as known in the art). The TIM may provide a path for heat generated by the microelectronic components 102, 103, 105 to readily flow to the heat transfer structure 135, where it may be spread and/or dissipated.

The microelectronic assembly 100 of FIG. 1 also may include an underfill material (not shown). In some embodiments, the underfill material may extend between and around the FLIs 151 and/or the SLIs 181. The underfill material may be an insulating material, such as an appropriate epoxy material. In some embodiments, the underfill material may include a capillary underfill, non-conductive film (NCF), or molded underfill. In some embodiments, the underfill material may include an epoxy flux. The underfill material may be selected to have a coefficient of thermal expansion (CTE) that may mitigate or minimize the stress between the insulating material 133 around the embedded microelectronic components 102, 103, 105 and the package substrate 150 arising from uneven thermal expansion in the microelectronic assembly 100. In some embodiments, the CTE of the underfill material may have a value that is intermediate to the CTE of the package substrate 150 (e.g., the CTE of the dielectric material of the package substrate 150) and the insulating material 133.

Although FIG. 1 shows a particular number and arrangement of a microelectronic assembly 100 including a plurality of embedded first, second, and third microelectronic components 102, 103, 105, a single RDL 148, and a plurality of fourth microelectronic components 101 mounted on a top surface of the RDL 148, a microelectronic assembly 100 may include any number and arrangement of microelectronic components 102, 103, 105, 101 and RDLs 148 having conductive pathways electrically coupled to a power source for delivering power to a top surface of microelectronic component.

A number of elements are illustrated in FIG. 1 as included in the microelectronic assembly 100, but a number of these elements may not be present in a microelectronic assembly 100. For example, in various embodiments, the support component 182, the underfill material, the heat transfer structure 135, and/or TIM may not be included. Further, FIG. 1 illustrates a number of elements that are omitted from subsequent drawings for ease of illustration, but may be included in any of the microelectronic assemblies 100 disclosed herein. Examples of such elements include the support component 182, the underfill material, the heat transfer structure 135, and/or the TIM. Many of the elements of the microelectronic assembly 100 of FIG. 1 are included in other ones of the accompanying figures; the discussion of these elements is not repeated when discussing these figures, and any of these elements may take any of the forms disclosed herein. In some embodiments, individual ones of the microelectronic assemblies 100 disclosed herein may serve as a system-in-package (SiP) in which multiple microelectronic components 102 having different functionality are included. In such embodiments, the microelectronic assembly 100 may be referred to as an SiP.

FIG. 2 is a side, cross-sectional view of a microelectronic assembly 100, in accordance with various embodiments. The microelectronic assembly 100 of FIG. 2 may include the elements of FIG. 1 and may further include the second microelectronic component 103 having an active surface 123 at the second surface 170-2.

FIG. 3 is a side, cross-sectional view of a microelectronic assembly 100, in accordance with various embodiments. The microelectronic assembly 100 of FIG. 3 may have a topside power delivery pathway that includes a TSV 113, 117. The microelectronic assembly 100 of FIG. 3 may include the elements of FIG. 2 and may further include the first microelectronic component 102 having an active surface 123 at the second surface 170-2. The microelectronic assembly 100 may further include a capacitive element 107 electrically coupled to the topside power delivery pathway. In particular, the microelectronic assembly 100 may further include a capacitive element 107A electrically coupled to a bottom surface of the package substrate 150 and/or a capacitive element 107B between and electrically coupled to the top surface of the RDL 148 and the fourth microelectronic component 101.

FIG. 4 is a side, cross-sectional view of a microelectronic assembly 100, in accordance with various embodiments. The microelectronic assembly 100 of FIG. 4 may have a topside power delivery pathway that includes a TSV 113, 119. The microelectronic assembly 100 of FIG. 4 may include a circuit board 182 having a power source 183 electrically coupled to a package substrate 150 having a first conductive pathway 109-1, a first microelectronic component 102 having a TSV 113 and a third microelectronic component 105 having a TSV 119 embedded in an insulting material 133 electrically coupled at a first surface 170-1 to the package substrate 150 and electrically coupled at a second surface 170-2 to an RDL 148 having a second conductive pathway 109-2 and a third conductive pathway 109-3. In particular, the first conductive pathway 109-1 in the package substrate 150 may be electrically coupled to the power source 183, the first surface 170-1 of the TSVs 113, 119 may be electrically coupled to the first conductive pathway 109-1, the second surface 170-2 of the TSVs 113, 119 may be electrically coupled to the second conductive pathway 109-2, and the second surface 170-2 of the first microelectronic component 102 and the second surface 170-2 of the third microelectronic component 105 may be electrically coupled to the third conductive pathway 109-3, such that power may be supplied to the second surface 170-2 of the first microelectronic component 102 from the power source 183. In some embodiments, the second and third conductive pathways 190-2, 109-3 are a same conductive pathway in the RDL 148. The conductive pathways 109 may be coupled to the other components (e.g., the package substrate 150 and the microelectronic components 101, 102, 103, 105) via interconnects (e.g., conductive contacts, such as pads and/or bumps, and solder) in the interface between the respective other component. The TSV 119 may be made of any suitable conductive material and may have any suitable dimensions, as described above with reference to TSV 113 in FIG. 1.

The microelectronic assembly 100 of FIG. 4 may also include a second microelectronic component 103 and a fourth microelectronic component 101 mounted on a top surface of the RDL 148 and electrically coupled to the second and/or third conductive pathway 109-2, 109-3 in the RDL 148 (e.g., electrically coupled to the topside power delivery pathway). In some embodiments, the fourth microelectronic component 101A may be mounted on a top surface of the second microelectronic component 103 and electrically coupled to the second microelectronic component 103 by conductive pathways in the RDL 148 (as shown) or by conductive contacts on the top and bottom surfaces of the second and fourth microelectronic components 103, 101, respectively (not shown). In some embodiments, the fourth microelectronic component 101B may be mounted on a top surface of the RDL 148 adjacent to (e.g., side-by-side) the second microelectronic component 103 and electrically coupled to the second microelectronic component 103 by conductive pathways in the RDL 148.

FIG. 5A is a side, cross-sectional view of a microelectronic assembly 100, in accordance with various embodiments. The microelectronic assemblies 100 of FIGS. 5A and 5B may have a topside power delivery pathway that includes a TSV 113, 117. The microelectronic assembly 100 of FIG. 5A may include the elements of FIG. 1 and may further include the first and second microelectronic components 102, 103 having an active surface 123 at the second surface 170-2. The microelectronic assembly 100 may further include a plurality of capacitive elements 107 embedded in an interposer 185 electrically coupled to the topside power delivery pathway. In particular, the microelectronic assembly 100 may include a plurality of capacitive elements 107 embedded in an interposer 185 having TSVs 108, the interposer 185 may be between a top surface of the package substrate 150 and a bottom surface (e.g., the first surface 170-1) of the microelectronic components 102, 103, 105 embedded in the insulating material 133. The plurality of capacitive elements 107 embedded in the interposer 185 may be electrically coupled to the first conductive pathway 109-1 in the package substrate 150 and to the TSVs 113, 117 in the first and second microelectronic components 102, 103. The capacitive elements 107 may include any suitable element that has capacitance, for example, a capacitor, a digitally tunable capacitor (DTC), or a metal-insulator-metal (MIM) capacitor, among others. The interposer 185 may include any suitable material, such as silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photoimageable dielectrics, and/or benzocyclobutene-based polymers). In some further embodiments, the material of the interposer 185 may include a semiconductor material, such as silicon, germanium, or a III-V material (e.g., gallium nitride), and one or more additional materials, for example, silicon oxide or silicon nitride.

FIG. 5B is a side, cross-sectional view of a microelectronic assembly 100, in accordance with various embodiments. The microelectronic assembly 100 of FIG. 5B may include the elements of FIG. 1, excluding the package substrate 150, and may further include the first and second microelectronic components 102, 103 having an active surface 123 at the second surface 170-2. The microelectronic assembly 100 may further include a plurality of capacitive elements 107 embedded in an interposer 185 electrically coupled to the topside power delivery pathway. In particular, the microelectronic assembly 100 may include a plurality of capacitive elements 107 embedded in an interposer 185 having TSVs 108, the interposer 185 may be between a top surface of the circuit board 182 and a bottom surface (e.g., the first surface 170-1) of the microelectronic components 102, 103, 105 embedded in the insulating material 133. The plurality of capacitive elements 107 embedded in the interposer 185 may be electrically coupled to the power source 183 on the circuit board 182 by land grid array (LGA) interconnects 187 and to the TSVs 113, 117 in the first and second microelectronic components 102, 103. The microelectronic assembly 100 of FIG. 5B also may include a mold material 189. The mold material 189 may extend around the interposer 185, the insulating material 133, and the RDL 148 on the circuit board 182. The mold material 189 may include any suitable material. In some embodiments, the mold material 189 is an organic polymer with inorganic silica particles. In some embodiments, the mold material 189 is a dielectric material, as described above with reference to the insulating material 133 of FIG. 1. The microelectronic assembly 100 of FIG. 5B also may include conductive columns 186 with solder 188 at a bottom surface and coupled to the TSV 108 at a top surface. The conductive columns 186 may be surrounded by the mold material 189 and may function as a stress buffer for the LGA interconnects 187.

Any suitable techniques may be used to manufacture the microelectronic assemblies 100 disclosed herein. For example, FIGS. 6A-6G are side, cross-sectional views of various stages in an example process for manufacturing the microelectronic assembly 100 of FIG. 1, in accordance with various embodiments. Although the operations discussed below with reference to FIGS. 6A-6G (and others of the accompanying drawings representing manufacturing processes) are illustrated in a particular order, these operations may be performed in any suitable order.

FIG. 6A illustrates a first microelectronic component 102 having a TSV 113 and a second microelectronic component 103 having a TSV 117 subsequent to removing non-electrical material from the backside surface (e.g., the backside surface opposes the active surface 123), revealing the top surface of the TSVs 113, 117, and forming conductive contacts 122 on the top surface of the first and second microelectronic components 102, 103. The non-electrical material, which is an inactive portion of the microelectronic components 102, 103, may include silicon, germanium, indium antimonide, lead telluride, indium arsenide, indium phosphide, gallium arsenide, gallium antimonide, further materials classified as group III-V, or an insulating material, such as silicon dioxide (glass), ceramic, or quartz, among other materials. The inactive material may be removed using any suitable technique, including, for example, grinding, etching, such as reactive ion etching (RIE) or chemical etching. In some embodiments, the backside surface may be polished to reveal the top surface of the TSVs 113, 117. In some embodiments, a backside RDL may be formed on the backside of the first and second microelectronic components 102, 103 and the conductive contacts 122 may be formed by applying copper/tin bumping. In some embodiments, the first and second microelectronic components 102, 103 may be processed at the wafer level and subsequently singulated. FIG. 6A further illustrates the first microelectronic component 102, the second microelectronic component 103, and a third microelectronic component 105 having conductive contacts 121 at an active surface 123.

Figure 6B:
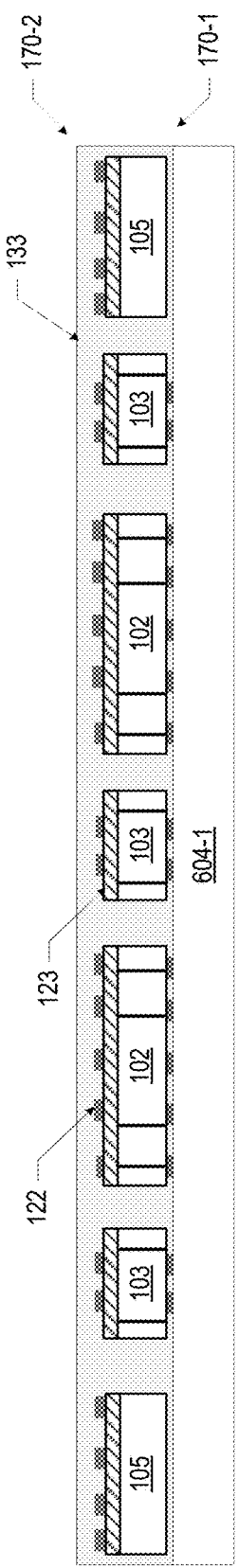

FIG. 6B illustrates an assembly subsequent to placing the first, second, and third microelectronic components 102, 103, 105 on a first carrier 604-1 with the active surfaces 123 facing away from the first carrier 604-1 and depositing an insulating material 133 on and around the first, second, and third microelectronic components 102, 103, 105. The carrier 604 may include any suitable material, and in some embodiments, may include a semiconductor wafer (e.g., a silicon wafer) or glass (e.g., a glass panel). The first, second, and third microelectronic components 102, 103, 105 may be attached to the first carrier 604-1 using any suitable technique, including a temporary adhesive layer or a die attach film (DAF). In some embodiments, the insulating material 133 may be initially deposited on and over the top surface 170-2 of the first, second, and third microelectronic components 102, 103, 105 (as shown), then polished back to expose the conductive contacts 122 at the top surface of the first, second, and third microelectronic components 102, 103, 105. The insulating material 133 may be formed using any suitable process, including lamination, or slit coating and curing. If the insulating material 133 is formed to completely cover the first, second, and third microelectronic components 102, 103, 105, the insulating material 133 may be removed to expose the conductive contacts 122 at the top surface of the first, second, and third microelectronic components 102, 103, 105 using any suitable technique, including grinding, or etching, such as a wet etch, a dry etch (e.g., a plasma etch), a wet blast, or a laser ablation (e.g., using excimer laser). In some embodiments, the thickness of the insulating material 133 may be minimized to reduce the etching time required.

Figure 6C:
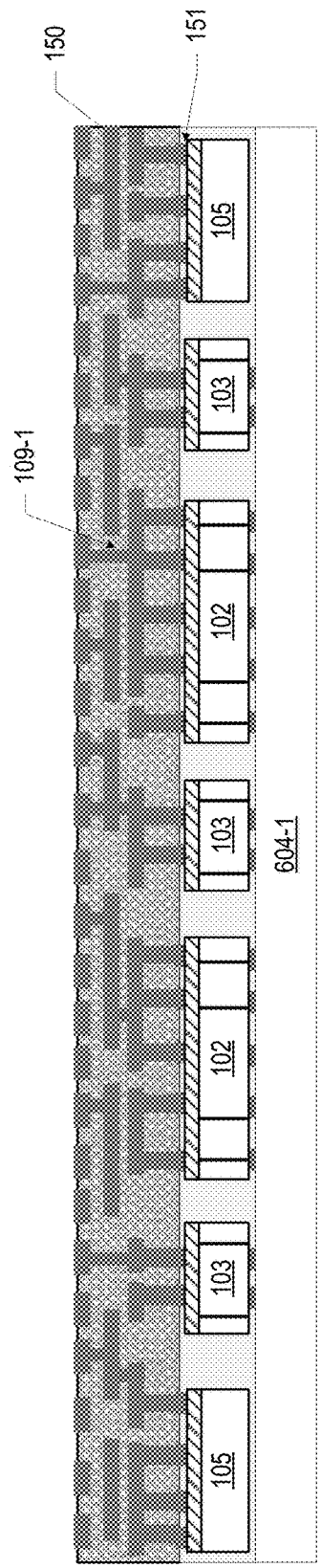

FIG. 6C illustrates an assembly subsequent to forming a package substrate 150 on the top surface 170-2 of the assembly of FIG. 6B and electrically coupling the first, second, and third microelectronic components 102, 103, 105 to the package substrate 150 via FLIs 151. The package substrate 150 may include a first conductive pathway 109-1, and the first and second microelectronic components 102, 103 may be electrically coupled to the first conductive pathway 109-1 via the FLIs 151. In some embodiments, the third microelectronic component 105 also may be electrically coupled to the first conductive pathway 109-1 via the FLIs 151. The package substrate 150 may be formed using any suitable technique, such as any of the techniques discussed above with reference to the formation of the package substrate 150 of FIG. 1.

Figure 6D:
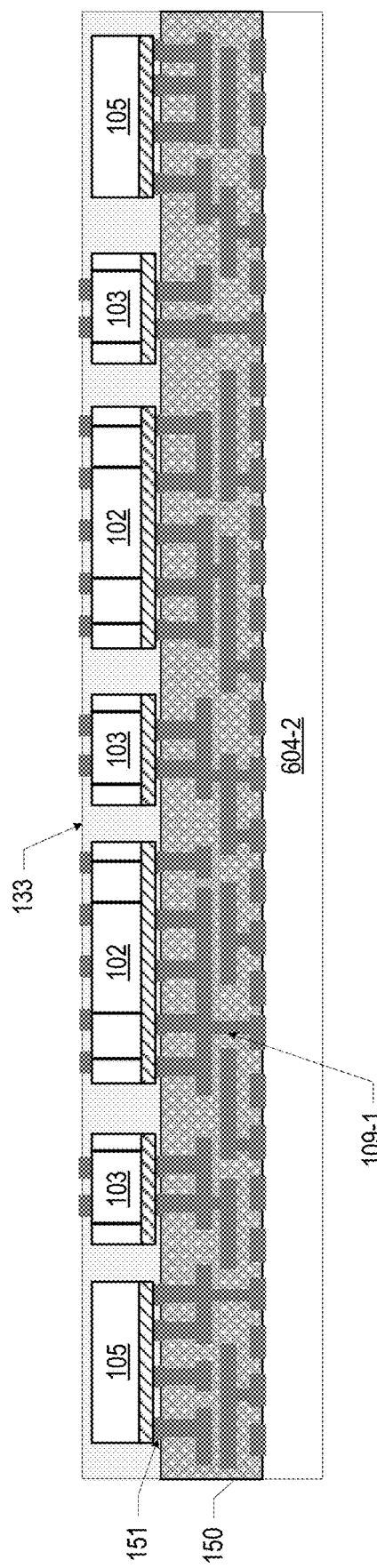

FIG. 6D illustrates an assembly subsequent to mounting a second carrier 604-2 to the top surface of the package substrate 150, inverting the assembly, and removing the first carrier 604-1 from the assembly of FIG. 6C.

Figure 6E:
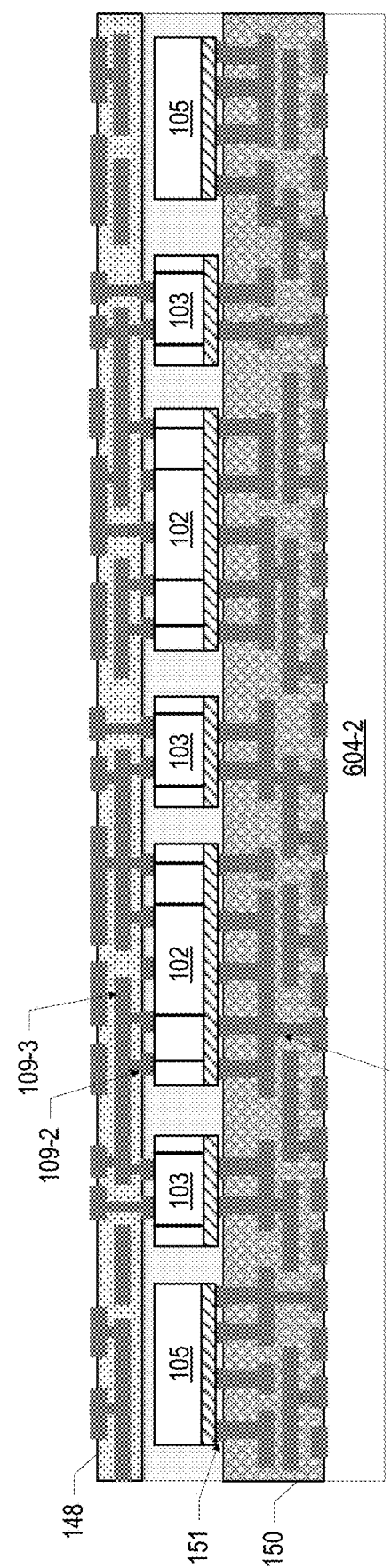

FIG. 6E illustrates an assembly subsequent to forming an RDL 148 on the top surface of the assembly of FIG. 6D. The RDL 148 may include a second conductive pathway 109-2 and a third conductive pathway 109-3. The RDL 148 may include conductive contacts on a bottom surface and conductive contacts on a top surface of the RDL 148. The first and second microelectronic components 102, 103 may be electrically coupled to the second and/or third conductive pathways 109-2, 109-3 via conductive contacts on the bottom surface of the RDL 148. The RDL 148 may be manufactured using any suitable technique, such as a PCB technique or a redistribution layer technique.

FIG. 6F illustrates an assembly subsequent to placing and electrically coupling a fourth microelectronic component 101 to the top surface of the RDL 148. The fourth microelectronic component 101 may be placed and electrically coupled using any suitable techniques. For example, in some embodiments, a solder paste may be printed on the conductive contacts at the top surface of the RDL 148, the fourth microelectronic component 101 may be placed on the solder paste using a pick-n-place tool, the solder paste may be subject to thermal reflow, and cleaned. The fourth microelectronic component 101 may be electrically coupled to the second and/or third conductive pathways 109-2, 109-3 via the conductive contacts on the top surface of the RDL 148. The assembly of FIG. 6F may itself be a microelectronic assembly 100, as shown. Further manufacturing operations may be performed on the microelectronic assembly 100 of FIG. 6F to form other microelectronic assemblies 100, for example, as shown in FIG. 6G.

FIG. 6G illustrates the assembly subsequent to removing the second carrier 604-2, depositing a solder resist layer, attaching solder balls, electrically coupling via SLIs 181 a circuit board 182 to the bottom surface of the package substrate 150, and providing a heat transfer structure 135 on the top surface of the assembly of FIG. 6F, similar to the microelectronic assembly 100 of FIG. 1. The first conductive pathway 109-1 may be electrically coupled to the power source 183 on the circuit board 182 via the SLIs 181. If multiple microelectronic assemblies 100 are manufactured together, the microelectronic assemblies 100 may be singulated after removal of the second carrier 604-2.

Additionally, although particular microelectronic assemblies 100 are illustrated in FIGS. 6A-6G (and others of the accompanying drawings representing manufacturing processes), the operations discussed below with reference to FIGS. 6A-6G may be used to form any suitable microelectronic assemblies 100. For example, the operations discussed above with reference to FIGS. 6A-6G may be used to form the microelectronic assemblies 100 of FIGS. 2, 3, and 4 by placing the first and/or second microelectronic components 102, 103 on the first carrier 604-1 with the active surfaces 123 facing towards the first carrier 604-1, as described in FIG. 6B, and by placing and coupling additional components (e.g., the capacitive element 107B of FIG. 3 and the second microelectronic component 103 of FIG. 4) on the top surface of the RDL 148, as described in FIG. 6F. The capacitive element 107 of FIG. 4 may be coupled to the bottom surface of the package substrate 150, as described below with reference to FIG. 11E.

Figure 7D:
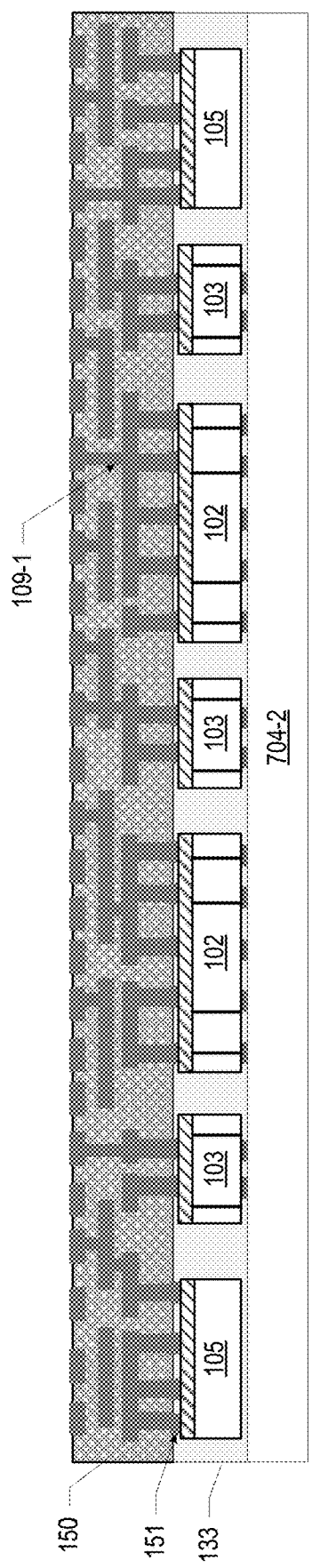

FIGS. 7A-7G are side, cross-sectional views of various stages in another example process for manufacturing the microelectronic assembly 100 of FIG. 1, in accordance with various embodiments. FIG. 7A illustrates a first microelectronic component 102 having a TSV 113 and a second microelectronic component 103 having a TSV 117 subsequent to removing non-electrical material from the backside surface (e.g., the backside surface opposes the active surface 123), revealing the top surface of the TSVs 113, 117, and forming conductive contacts 122 on the top surface of the first and second microelectronic components 102, 103. FIG. 7A further illustrates the first microelectronic component 102, the second microelectronic component 103, and a third microelectronic component 105 having conductive contacts 121 at an active surface 123. The first, second, and third microelectronic components 102, 103, 105 may be processed as described above with reference to FIG. 6A.

FIG. 7B illustrates an assembly subsequent to forming a package substrate 150 on the surface of a first carrier 704-1. The package substrate 150 may include a first conductive pathway 109-1. The package substrate 150 may be formed using any suitable technique, such as any of the techniques discussed above with reference to the formation of the package substrate 150 of FIG. 1. The carrier 704 may include any suitable material, and in some embodiments, may include a semiconductor wafer (e.g., a silicon wafer) or glass (e.g., a glass panel).

FIG. 7C illustrates an assembly subsequent to placing the first, second, and third microelectronic components 102, 103, 105 on the package substrate 150 with the active surfaces 123 facing towards the package substrate 150 (e.g., the active surface 123 facing towards a first surface 170-1), depositing an insulating material 133 on and around the first, second, and third microelectronic components 102, 103, 105, and electrically coupling the first, second, and third microelectronic components 102, 103, 105 to the package substrate 150 via FLIs 151. The first and second microelectronic components 102, 103 may be electrically coupled to the first conductive pathway 109-1 via the FLIs 151. In some embodiments, the third microelectronic component 105 also may be electrically coupled to the first conductive pathway 109-1 via the FLIs 151. The insulating material 133 may be deposited using any suitable technique, as described above with reference to FIG. 6.

FIG. 7D illustrates an assembly subsequent to mounting a second carrier 704-2 to the top surface of the assembly of FIG. 7C, inverting the assembly, removing the first carrier 704-1, and forming conductive contacts and performing surface finishing on the surface of the package substrate 150.

Figure 7E:
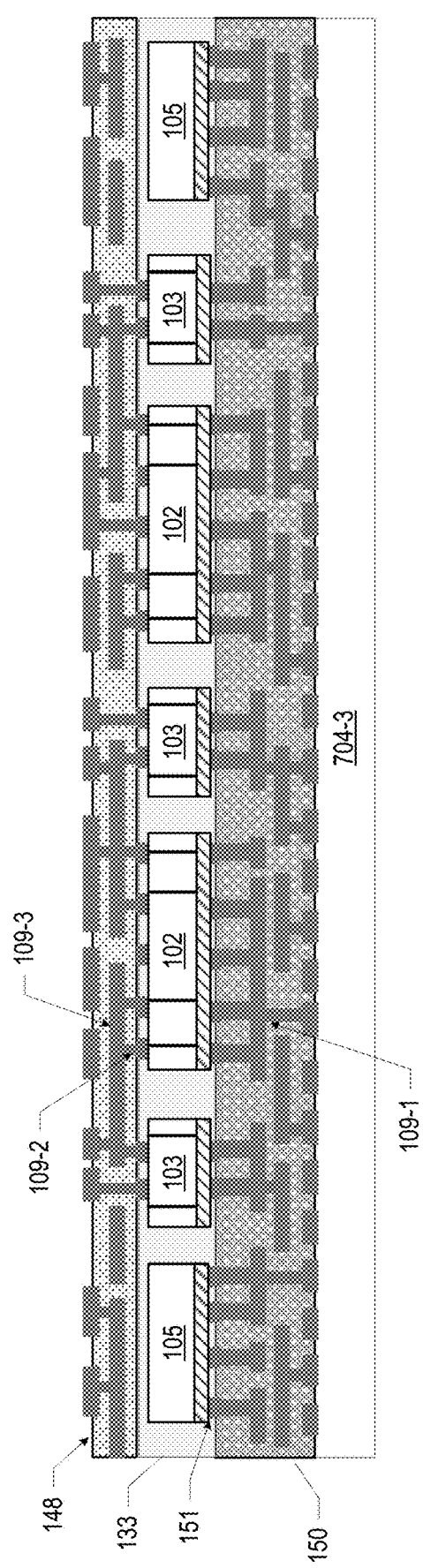

FIG. 7E illustrates an assembly subsequent to mounting a third carrier 704-3 to the top surface of the assembly of FIG. 7C, inverting the assembly, removing the second carrier 704-2, and forming an RDL 148 on the top surface of the insulating material 133. The RDL 148 may include a second conductive pathway 109-2 and a third conductive pathway 109-3. The RDL 148 may include conductive contacts on a bottom surface and conductive contacts on a top surface of the RDL 148. The first and second microelectronic components 102, 103 may be electrically coupled to the second and/or third conductive pathways 109-2, 109-3 via conductive contacts on the bottom surface of the RDL 148. The RDL 148 may be manufactured using any suitable technique, such as a PCB technique or a redistribution layer technique.

Figure 7F:
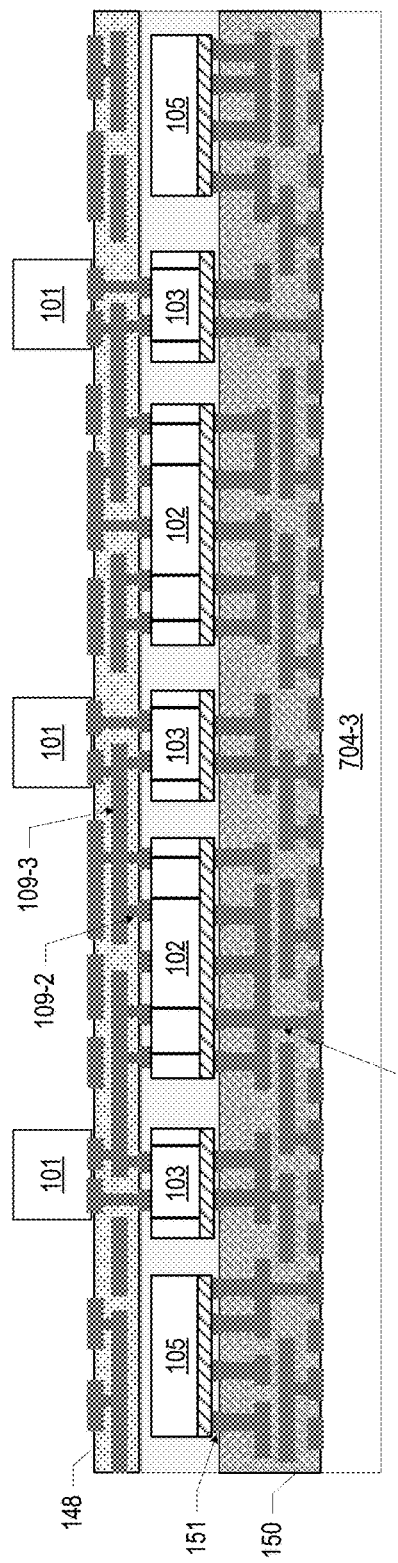

FIG. 7F illustrates an assembly subsequent to placing and electrically coupling a fourth microelectronic component 101 to the top surface of the RDL 148. The fourth microelectronic component 101 may be placed and electrically coupled using any suitable techniques, for example, as described above with reference to FIG. 6. The fourth microelectronic component 101 may be electrically coupled to the second and/or third conductive pathways 109-2, 109-3 via the conductive contacts on the top surface of the RDL 148. The assembly of FIG. 7F may itself be a microelectronic assembly 100, as shown. Further manufacturing operations may be performed on the microelectronic assembly 100 of FIG. 7F to form other microelectronic assemblies 100, for example, as shown in FIG. 7G.

Figure 7G:
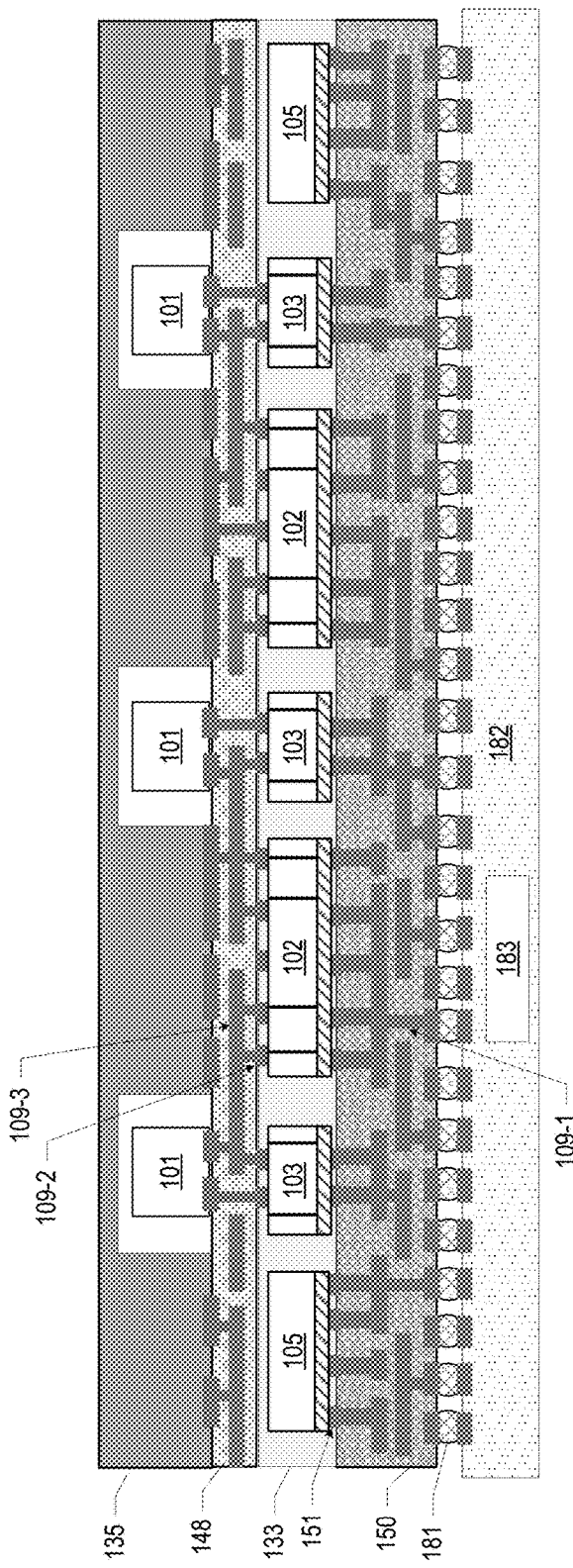

FIG. 7G illustrates the assembly subsequent to removing the third carrier 704-3, depositing a solder resist layer and attaching solder balls to the bottom surface of the package substrate 150, electrically coupling the bottom surface of the package substrate 150 to a circuit board 182 by SLIs 181, and providing a heat transfer structure 135 on the top surface of the assembly of FIG. 7F, similar to the microelectronic assembly 100 of FIG. 1. The first conductive pathway 109-1 may be electrically coupled to the power source 183 on the circuit board 182 via the SLIs 181. If multiple microelectronic assemblies 100 are manufactured together, the microelectronic assemblies 100 may be singulated after removal of the third carrier 704-3.

Figure 8A:
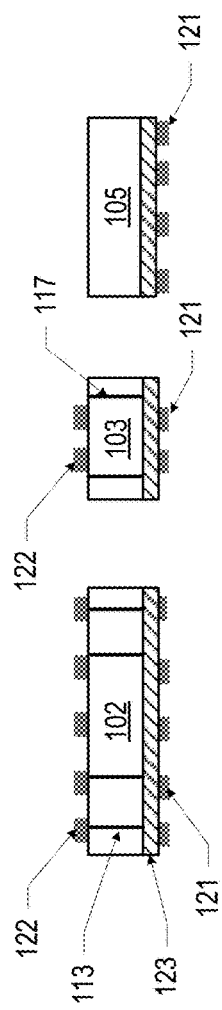

FIGS. 8A-8H are side, cross-sectional views of various stages in another example process for manufacturing the microelectronic assembly 100 of FIG. 5A, in accordance with various embodiments. FIG. 8A illustrates a first microelectronic component 102 having a TSV 113 and a second microelectronic component 103 having a TSV 117 subsequent to removing non-electrical material from the backside surface (e.g., the backside surface opposes the active surface 123), revealing the top surface of the TSVs 113, 117, and forming conductive contacts 122 on the top surface of the first and second microelectronic components 102, 103. FIG. 8A further illustrates the first microelectronic component 102, the second microelectronic component 103, and a third microelectronic component 105 having conductive contacts 121 at an active surface 123. The first, second, and third microelectronic components 102, 103, 105 may be processed as described above with reference to FIG. 6A.

Figure 8B:
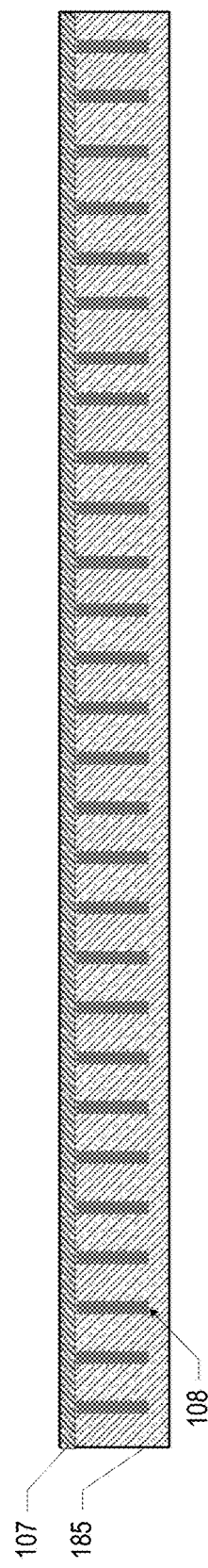

FIG. 8B illustrates an interposer 185 including TSVs 108 and embedded capacitive elements 107. In some embodiments, the interposer 185 may include a passive or active wafer.

Figure 8C:
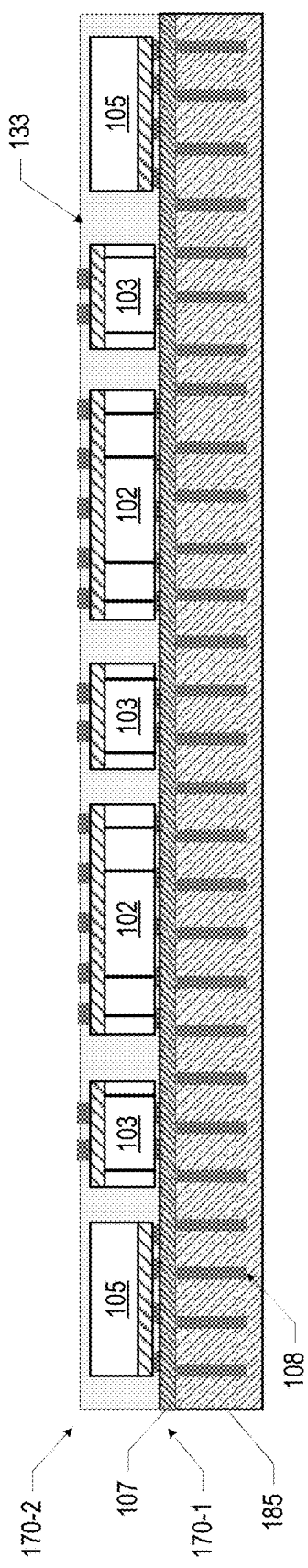

FIG. 8C illustrates an assembly subsequent to placing the first, second, and third microelectronic components 102, 103, 105 on the interposer 185, depositing an insulating material 133 on and around the first, second, and third microelectronic components 102, 103, 105, and electrically coupling the first, second, and third microelectronic components 102, 103, 105 to the interposer 185. The first and second microelectronic components 102, 103 may be placed on the interposer 185 with the active surface 123 facing away from the interposer (e.g., the active surface 123 facing towards a second surface 170-2) and the third microelectronic component 105 may be placed with the active surface 123 facing towards the interposer 185 (e.g., the active surface 123 facing towards a first surface 170-1). The insulating material 133 may be deposited using any suitable technique, as described above with reference to FIG. 6.

FIG. 8D illustrates an assembly subsequent to forming an RDL 148 on the top surface of the insulating material 133 (e.g., on the top surface of the assembly of FIG. 8C). The RDL 148 may include a second conductive pathway 109-2 and a third conductive pathway 109-3. The RDL 148 may include conductive contacts on a bottom surface and conductive contacts on a top surface of the RDL 148. The first and second microelectronic components 102, 103 may be electrically coupled to the second and/or third conductive pathways 109-2, 109-3 via conductive contacts on the bottom surface of the RDL 148. The RDL 148 may be manufactured using any suitable technique, such as a PCB technique or a redistribution layer technique.

FIG. 8E illustrates an assembly subsequent to inverting the assembly of FIG. 8D, removing material from the interposer 185, revealing the top surface of the TSVs 108, and forming conductive contacts on the top surface of the TSVs 108 for coupling to the package substrate 150. The interposer material may be removed using any suitable technique, including grinding.

Figure 8F:
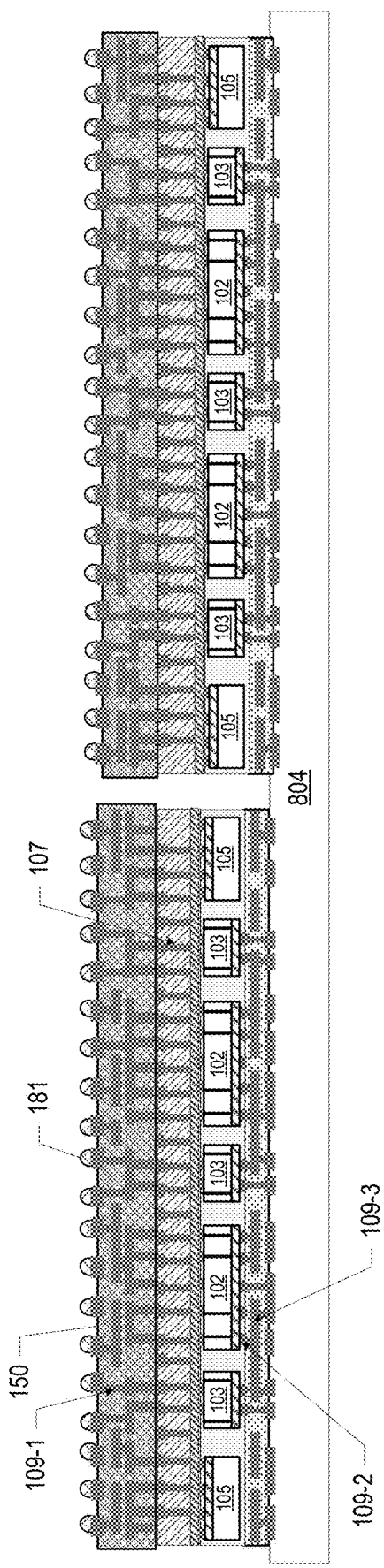

FIG. 8F illustrates an assembly subsequent to singulating and reconstituting the assemblies of FIG. 8E on a carrier 804, forming a package substrate 150 on the surface of the interposer 185, and forming conductive contacts, attaching solder balls, and performing surface finishing on the surface of the package substrate 150. The package substrate 150 may include a first conductive pathway 109-1. The package substrate 150 may be formed using any suitable technique, such as any of the techniques discussed above with reference to the formation of the package substrate 150 of FIG. 1. The carrier 804 may include any suitable material, and in some embodiments, may include a semiconductor wafer (e.g., a silicon wafer) or glass (e.g., a glass panel).

Figure 8G:
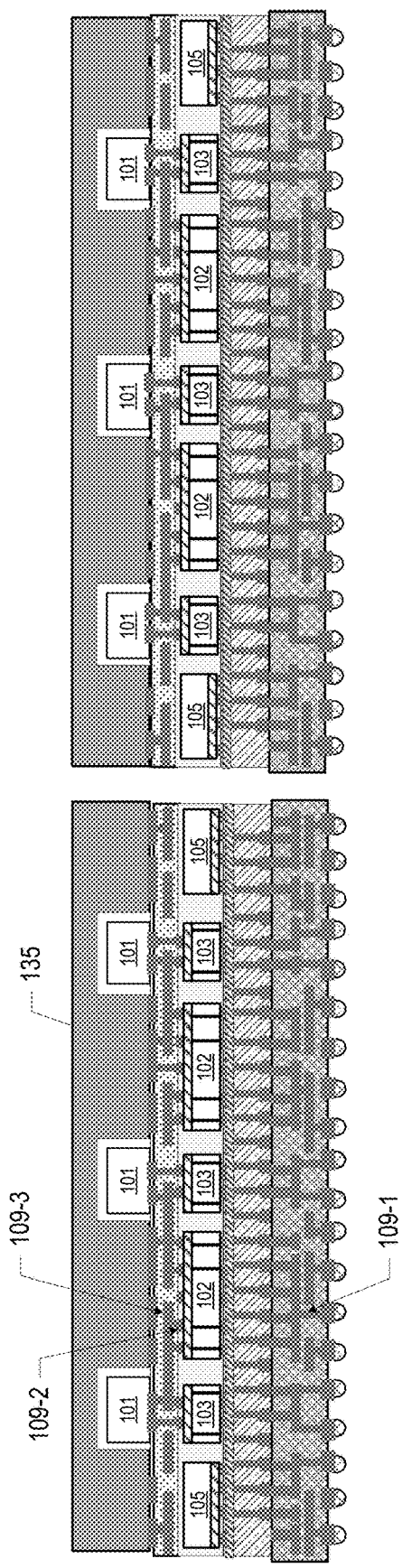

FIG. 8G illustrates an assembly subsequent to inverting the assembly of FIG. 8F, removing the carrier 804, placing and electrically coupling a fourth microelectronic component 101 to the top surface of the RDL 148, and providing a heat transfer structure 135 on the top surface of the RDL 148. The fourth microelectronic component 101 may be placed and electrically coupled using any suitable techniques, for example, as described above with reference to FIG. 6. The fourth microelectronic component 101 may be electrically coupled to the second and/or third conductive pathways 109-2, 109-3 via the conductive contacts on the top surface of the RDL 148.

Figure 8H:
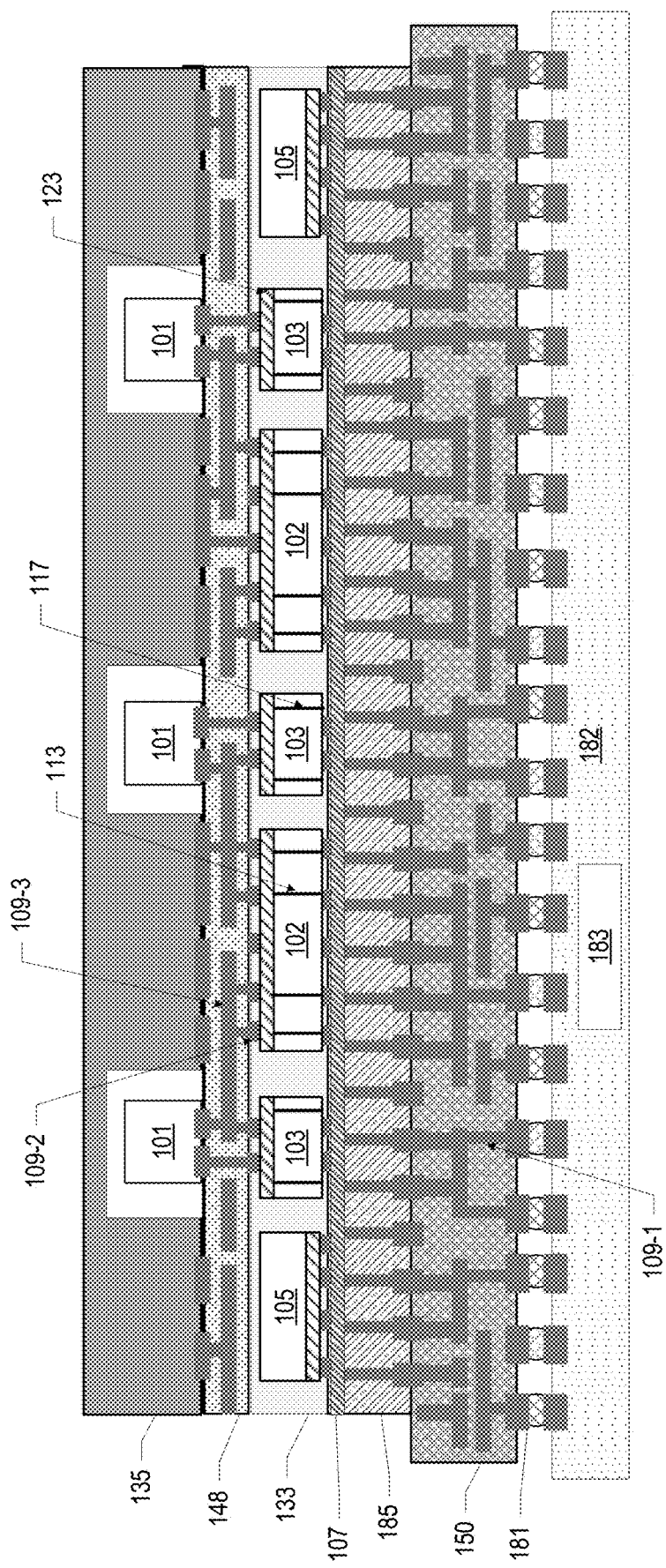

FIG. 8H illustrates an assembly subsequent to singulating the assemblies of FIG. 8F and electrically coupling the bottom surface of the package substrate 150 to a circuit board 182 by SLIs 181, similar to the microelectronic assembly 100 of FIG. 5A. The first conductive pathway 109-1 may be electrically coupled to the power source 183 on the circuit board 182 via the SLIs 181.

Figure 9E:
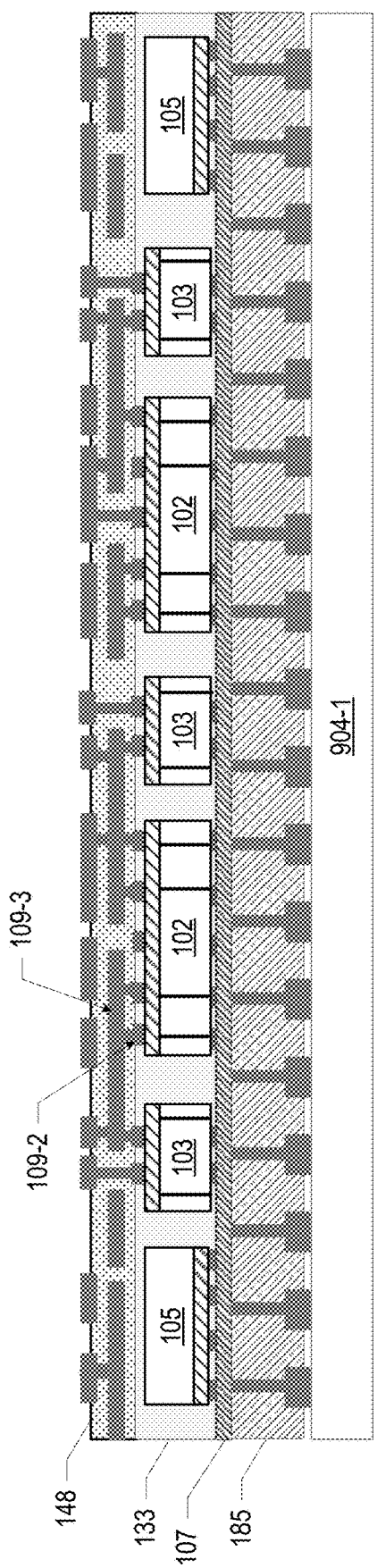

FIGS. 9A-9I are side, cross-sectional views of various stages in another example process for manufacturing the microelectronic assembly 100 of FIG. 5B, in accordance with various embodiments. FIG. 9A illustrates a first microelectronic component 102 having a TSV 113 and a second microelectronic component 103 having a TSV 117 subsequent to removing non-electrical material from the backside surface (e.g., the backside surface opposes the active surface 123), revealing the top surface of the TSVs 113, 117, and forming conductive contacts 122 on the top surface of the first and second microelectronic components 102, 103. FIG. 9A further illustrates the first microelectronic component 102, the second microelectronic component 103, and a third microelectronic component 105 having conductive contacts 121 at an active surface 123. The first, second, and third microelectronic components 102, 103, 105 may be processed as described above with reference to FIG. 6A.

FIG. 9B illustrates an interposer 185 including TSVs 108 and embedded capacitive elements 107. In some embodiments, the interposer 185 may include a passive or active wafer.

FIG. 9C illustrates an assembly subsequent to removing material from the interposer 185, revealing the TSVs 108, forming conductive contacts (e.g., conductive columns 186) on the surface of the TSVs 108, and mounting the assembly to a first carrier 904-1 with the capacitive elements 107 facing away from the carrier 904-1. The interposer material may be removed using any suitable technique, including grinding. The conductive contacts may be formed on the TSVs 108 using any suitable technique, including, for example, copper-pillar bumping. The carrier 904 may include any suitable material, and in some embodiments, may include a semiconductor wafer (e.g., a silicon wafer) or glass (e.g., a glass panel). In some embodiments, when solder 188 is used, the solder 188 may be deposited on a surface of the conductive contacts prior to mounting the assembly on the carrier 904-1.

FIG. 9D illustrates an assembly subsequent to placing the first, second, and third microelectronic components 102, 103, 105 on the interposer 185, depositing an insulating material 133 on and around the first, second, and third microelectronic components 102, 103, 105, and electrically coupling the first, second, and third microelectronic components 102, 103, 105 to the interposer 185. The first and second microelectronic components 102, 103 may be placed on the interposer 185 with the active surface 123 facing away from the interposer (e.g., the active surface 123 facing towards a second surface 170-2) and the third microelectronic component 105 may be placed with the active surface 123 facing towards the interposer 185 (e.g., the active surface 123 facing towards a first surface 170-1). In some embodiments, the first and second microelectronic components 102, 103 may be placed on the interposer 185 with the active surface 123 facing toward the interposer (e.g., the active surface 123 facing towards a first surface 170-1). The insulating material 133 may be deposited using any suitable technique, as described above with reference to FIG. 6.

FIG. 9E illustrates an assembly subsequent to forming an RDL 148 on the top surface of the insulating material 133 (e.g., on the top surface of the assembly of FIG. 9D). The RDL 148 may include a second conductive pathway 109-2 and a third conductive pathway 109-3. The RDL 148 may include conductive contacts on a bottom surface and conductive contacts on a top surface of the RDL 148. The first and second microelectronic components 102, 103 may be electrically coupled to the second and/or third conductive pathways 109-2, 109-3 via conductive contacts on the bottom surface of the RDL 148. The RDL 148 may be manufactured using any suitable technique, such as a PCB technique or a redistribution layer technique.

Figure 9F:
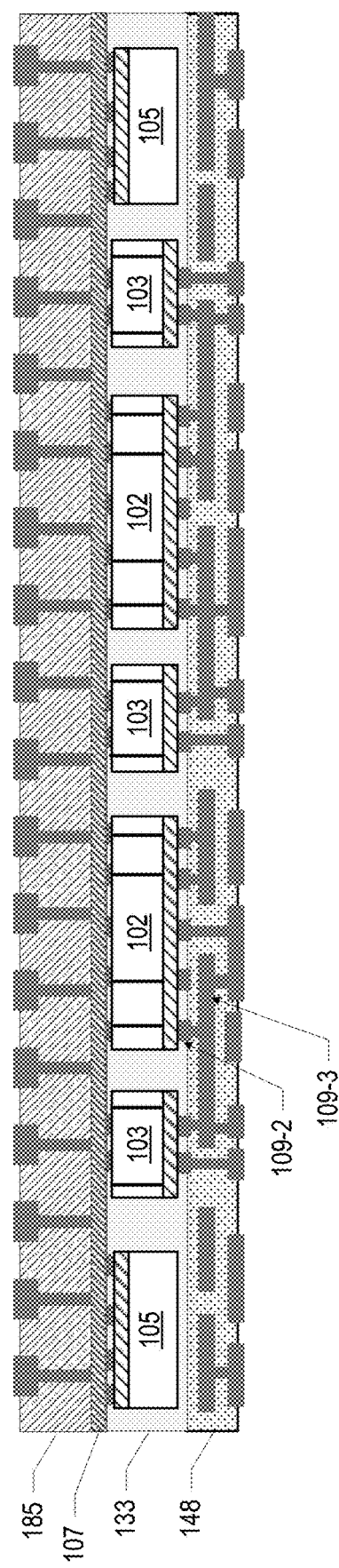

FIG. 9F illustrates an assembly subsequent to inverting the assembly of FIG. 9E and removing the first carrier 904-1.

Figure 9G:
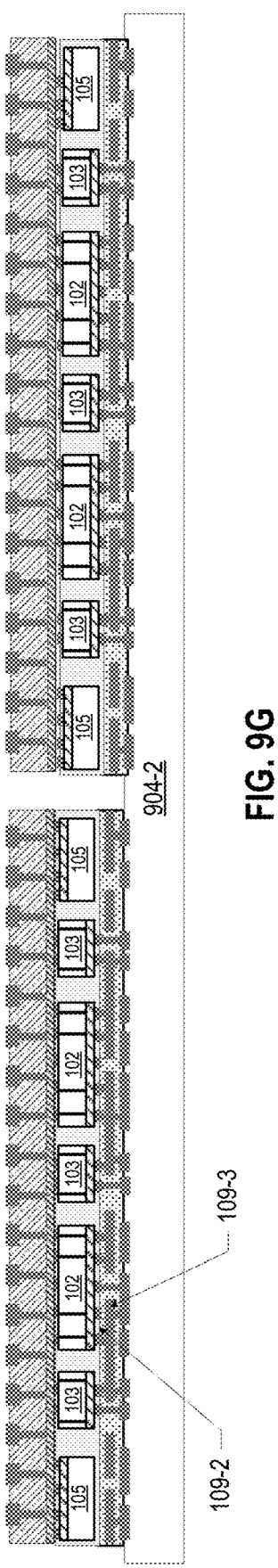

FIG. 9G illustrates an assembly subsequent to singulating and reconstituting the assemblies of FIG. 9F on a second carrier 904-2. In some embodiments using a mold material 189 (not shown), the mold material 189 may be provided on and around the assemblies of FIG. 9F. The mold material 189 may be formed using any suitable process, including compression molding, or lamination.

Figure 9H:
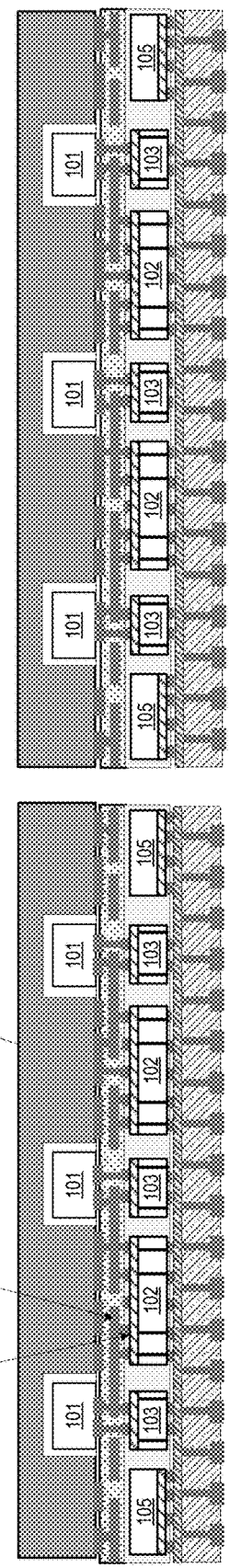

FIG. 9H illustrates an assembly subsequent to inverting the assembly of FIG. 9G, removing the second carrier 904-2, placing and electrically coupling a fourth microelectronic component 101 to the top surface of the RDL 148, and providing a heat transfer structure 135 on the top surface of the RDL 148. The fourth microelectronic component 101 may be placed and electrically coupled using any suitable techniques, for example, as described above with reference to FIG. 6. The fourth microelectronic component 101 may be electrically coupled to the second and/or third conductive pathways 109-2, 109-3 via the conductive contacts on the top surface of the RDL 148.

FIG. 9I illustrates an assembly subsequent to singulating the assemblies of FIG. 9H and electrically coupling the bottom surface of the interposer 185 to a circuit board 182 by LGA interconnects 187, similar to the microelectronic assembly 100 of FIG. 5B.

FIG. 10 is a side, cross-sectional view of a microelectronic assembly 100, in accordance with various embodiments. The microelectronic assembly 100 of FIG. 10 may have a topside power delivery pathway that includes a TMV 111. The microelectronic assembly 100 of FIG. 10 may include a circuit board 182 having a power source 183 electrically coupled to a package substrate 150 having a first conductive pathway 109-1, an insulating material 133 on the package substrate having a through-mold via (TMV) 111 and a first and a third microelectronic component 102, 105 embedded therein, an RDL 148 on the insulating material 133 having a second conductive pathway 109-2 and a third conductive pathway 109-3, and a second microelectronic component 103 mounted on a top surface of the RDL 148. In particular, the first conductive pathway 109-1 in the package substrate 150 may be electrically coupled to the power source 183. The TMV 111 may be electrically coupled at a first surface 170-1 to the first conductive pathway 109-1 in the package substrate 150 and electrically coupled at a second surface 170-2 to the second and/or third conductive pathways 109-2, 109-3 in the RDL 148. The first microelectronic component 102 may be electrically coupled at a first surface 170-1 to the package substrate 150 and electrically coupled at a second surface 170-2 (e.g., an active surface 123) to the second and third conductive pathways 109-2, 109-3 in the RDL 148, such that power may be supplied to the second surface 170-2 of the first microelectronic component 102 from the power source 183. The second microelectronic component 103 may be electrically coupled to the first microelectronic component 102 by the second and third conductive pathways 109-2, 109-3 in the RDL 148. In some embodiments, the second and third conductive pathways 190-2, 109-3 are a same conductive pathway in the RDL 148. The third microelectronic component 105 may be electrically coupled at the first surface 170-1 (e.g., an active surface 123) to the package substrate 150 and also may be electrically coupled to the first conductive pathway 109-1. The TMV 111 may be made of any suitable conductive material, such as copper, silver, nickel, gold, aluminum, or other metals or alloys, for example. The TMV 111 may have any suitable dimensions. In some embodiments, the TMV 111 may have a diameter (e.g., a cross-section dimension) between 5 microns and 20 microns and a thickness (e.g., z-height) between 40 microns and 100 microns.

The microelectronic assembly 100 of FIG. 10 may also include a fourth microelectronic component 101 mounted on a top surface of the RDL 148 and electrically coupled to the second and/or third conductive pathway 109-2, 109-3 in the RDL 148 (e.g., electrically coupled to the topside power delivery pathway). In some embodiments, the fourth microelectronic component 101A may be mounted on a top surface of the second microelectronic component 103 and electrically coupled to the second microelectronic component 103 by conductive pathways in the RDL 148 (as shown) or by conductive contacts on the top and bottom surfaces of the second and fourth microelectronic components 103, 101, respectively (not shown). In some embodiments, the fourth microelectronic component 101B may be mounted on a top surface of the RDL 148 adjacent to (e.g., side-by-side) the second microelectronic component 103 and electrically coupled to the second microelectronic component 103 by conductive pathways in the RDL 148. The microelectronic assembly 100 of FIG. 10 may further include a capacitive element 107 electrically coupled to the topside power delivery pathway. In particular, the microelectronic assembly 100 may further include a capacitive element 107 electrically coupled to a bottom surface of the package substrate 150 and to the power source 183 via the first conductive pathway 109-1.

Figure 11A:
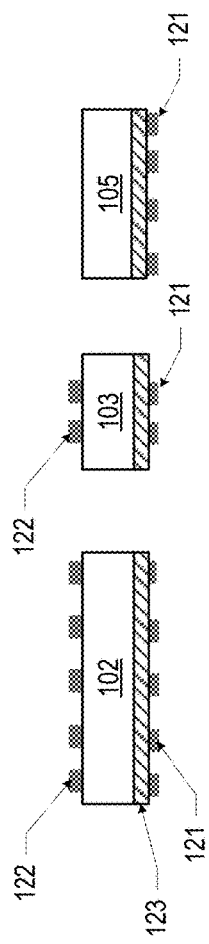
FIGS. 11A-11G are side, cross-sectional views of various stages in an example process for manufacturing the microelectronic assembly of FIG. 10, in accordance with various embodiments.

FIGS. 11A-11G are side, cross-sectional views of various stages in another example process for manufacturing the microelectronic assembly 100 of FIG. 10, in accordance with various embodiments. FIG. 11A illustrates a first microelectronic component 102 and a second microelectronic component 103 subsequent to removing non-electrical material from the backside surface (e.g., the backside surface opposes the active surface 123) and forming conductive contacts 122 on the top surface of the first and second microelectronic components 102, 103. FIG. 11A further illustrates the first microelectronic component 102, the second microelectronic component 103, and a third microelectronic component 105 having conductive contacts 121 at an active surface 123. The first, second, and third microelectronic components 102, 103, 105 may be processed as described above with reference to FIG. 6A.

Figure 11B:
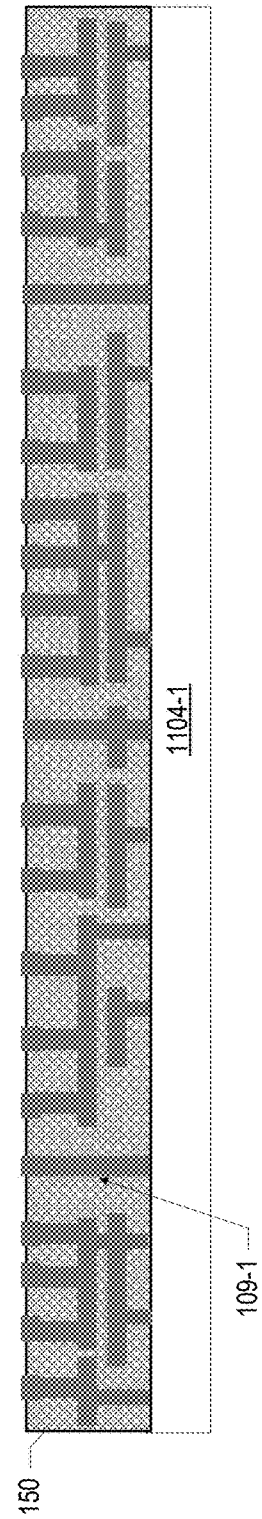

FIG. 11B illustrates an assembly subsequent to forming a package substrate 150 on the surface of a first carrier 1104-1. The package substrate 150 may include a first conductive pathway 109-1. The package substrate 150 may be formed using any suitable technique, such as any of the techniques discussed above with reference to the formation of the package substrate 150 of FIG. 1. The carrier 1104 may include any suitable material, and in some embodiments, may include a semiconductor wafer (e.g., a silicon wafer), a metal (e.g., stainless steel), or glass (e.g., a glass panel).

Figure 11C:
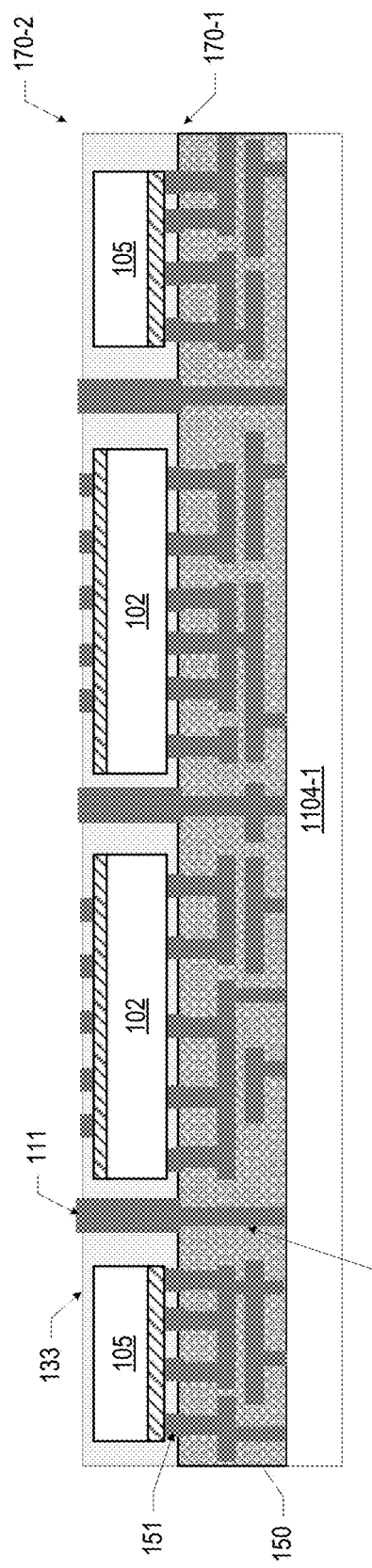

FIG. 11C illustrates an assembly subsequent to placing the first microelectronic component 102 on the package substrate 150 with the active surface 123 facing away from the package substrate 150 (e.g., the active surface 123 facing towards a second surface 170-2), placing the third microelectronic component 105 on the package substrate 150 with the active surface 123 facing towards the package substrate 150 (e.g., the active surface 123 facing towards a first surface 170-1), forming a TMV 111 on the first conductive pathways 109-1, depositing an insulating material 133 on and around and the TMV 111 and the first and third microelectronic components 102, 105, and electrically coupling the first and third microelectronic components 102, 105 to the package substrate 150 via FLIs 151. The insulating material 133 may be deposited using any suitable technique, as described above with reference to FIG. 6. The TMV 111 may be formed using any suitable technique, including, a lithographic process or an additive process, such as cold spray or 3-dimensional printing. For example, the TMV 111 may be formed by depositing, exposing, and developing a photoresist layer on the top surface of the first conductive pathway 109-1. The photoresist layer may be patterned to form a cavity in the shape of the TMV 111. Conductive material, such as copper, may be deposited in the openings in the patterned photoresist layer to form the TMV 111. The conductive material may be depositing using any suitable process, such as electroplating, sputtering, or electroless plating. The photoresist may be removed to expose the TMV 111. In another example, a photo-imageable dielectric may be used to form the TMV 111. In some embodiments, a seed layer (not shown) may be formed on the top surface of the first conductive pathways 109-1 prior to depositing the photoresist material and the conductive material. The seed layer may be any suitable conductive material, including copper. The seed layer may be removed, after removing the photoresist layer, using any suitable process, including chemical etching, among others. In some embodiments, the seed layer may be omitted.

Figure 11D:
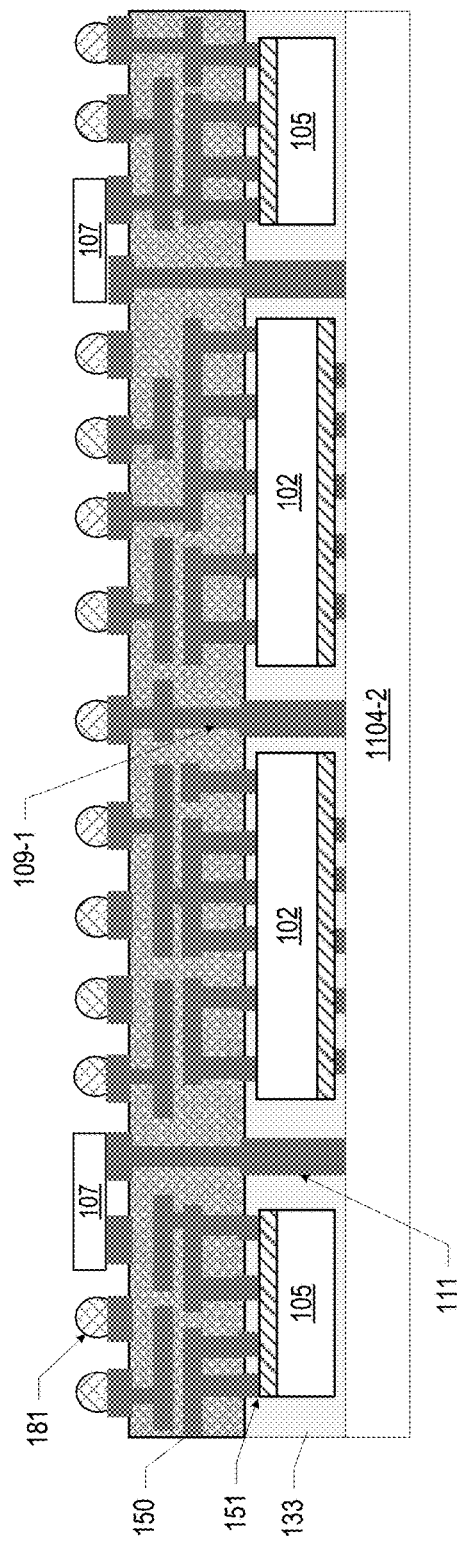

FIG. 11D illustrates an assembly subsequent to mounting a second carrier 1104-2 to the top surface of the assembly of FIG. 11C, inverting the assembly, removing the first carrier 1104-1, forming conductive contacts, attaching a capacitive element 107, attaching solder balls 181, and performing surface finishing on the bottom surface of the package substrate 150.

Figure 11E:
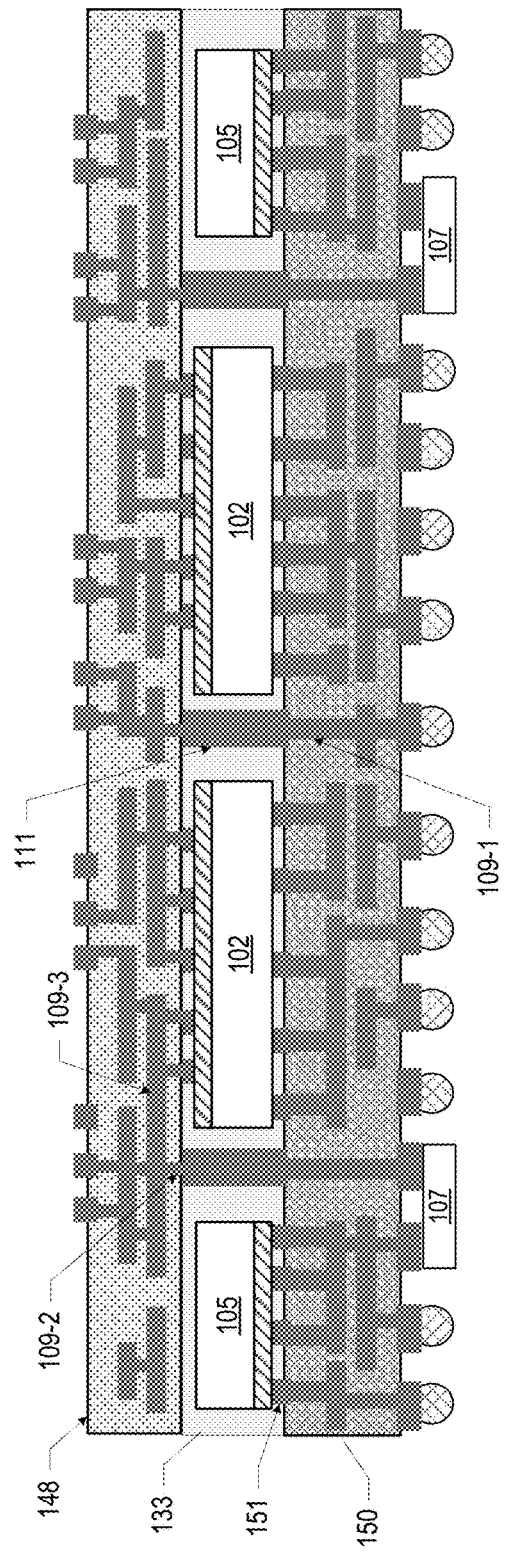

FIG. 11E illustrates an assembly subsequent to inverting the assembly of FIG. 11D, removing the second carrier 704-2, and forming an RDL 148 on the top surface of the insulating material 133. The RDL 148 may include a second conductive pathway 109-2 and a third conductive pathway 109-3. The RDL 148 may include conductive contacts on a bottom surface and conductive contacts on a top surface of the RDL 148. The first and second microelectronic components 102, 103 may be electrically coupled to the second and/or third conductive pathways 109-2, 109-3 via conductive contacts on the bottom surface of the RDL 148. The RDL 148 may be manufactured using any suitable technique, such as a PCB technique or a redistribution layer technique.

Figure 11F:
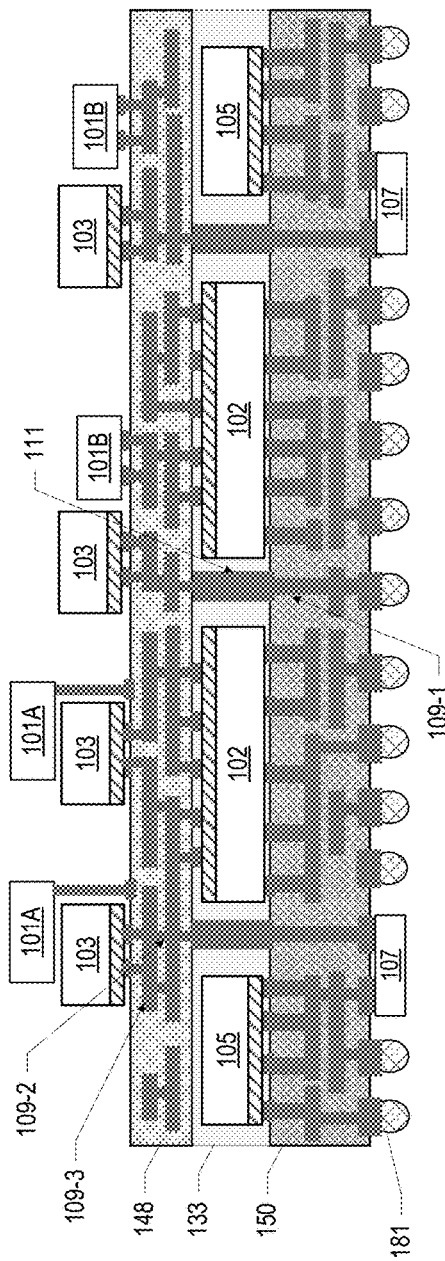

FIG. 11F illustrates an assembly subsequent to placing and electrically coupling a second microelectronic component 103 and a fourth microelectronic component 101 to the top surface of the RDL 148. The second and fourth microelectronic components 103, 101 may be placed and electrically coupled using any suitable techniques, for example, as described above with reference to FIG. 6. The second and fourth microelectronic components 103, 101 may be electrically coupled to the second and/or third conductive pathways 109-2, 109-3 via the conductive contacts on the top surface of the RDL 148. In some embodiments, the fourth microelectronic component 101A may be mounted on a top surface of the second microelectronic component 103 and electrically coupled to the second microelectronic component 103 by conductive pathways in the RDL 148 (as shown) or by conductive contacts on the top and bottom surfaces of the second and fourth microelectronic components 103, 101, respectively (not shown). In some embodiments, the fourth microelectronic component 101B may be mounted on a top surface of the RDL 148 adjacent to (e.g., side-by-side) the second microelectronic component 103 and electrically coupled to the second microelectronic component 103 by conductive pathways in the RDL 148. The assembly of FIG. 11F may itself be a microelectronic assembly 100, as shown. Further manufacturing operations may be performed on the microelectronic assembly 100 of FIG. 11F to form other microelectronic assemblies 100, for example, as shown in FIG. 11G.

Figure 11G:
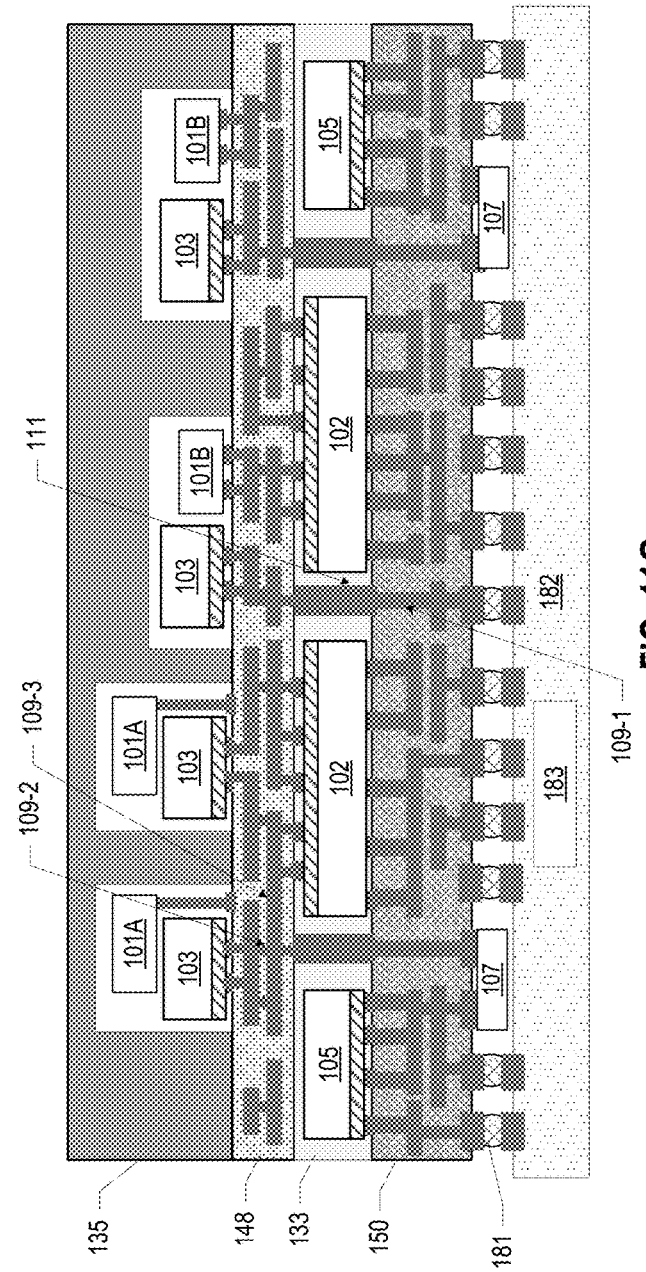

FIG. 11G illustrates the assembly subsequent to electrically coupling the bottom surface of the package substrate 150 to a circuit board 182 by SLIs 181 and providing a heat transfer structure 135 on the top surface of the assembly of FIG. 11F, similar to the microelectronic assembly 100 of FIG. 10. The first conductive pathway 109-1 may be electrically coupled to the power source 183 on the circuit board 182 via the SLIs 181.

FIGS. 12A and 12B are side, cross-sectional views of microelectronic assemblies 100, in accordance with various embodiments. The microelectronic assemblies 100 of FIGS. 12A and 12B may have a topside power delivery pathway that includes a TMV 111 along a perimeter. The microelectronic assembly 100 of FIG. 12A may include a circuit board 182 having a power source 183 electrically coupled to a package substrate 150 having a first conductive pathway 109-1, an insulating material 133 on the package substrate having a through-mold via (TMV) 111 and a first, a second, and a third microelectronic component 102, 103, 105 embedded therein, and an RDL 148 on the insulating material 133 having a second conductive pathway 109-2 and a third conductive pathway 109-3. In particular, the first conductive pathway 109-1 in the package substrate 150 may be electrically coupled to the power source 183. The TMV 111 may be electrically coupled at a first surface 170-1 to the first conductive pathway 109-1 in the package substrate 150 and electrically coupled at a second surface 170-2 to the second and/or third conductive pathways 109-2, 109-3 in the RDL 148. The TMV 111 may be positioned along a perimeter (e.g., outer edge) of the insulating material 133. The first and second microelectronic components 102, 103 may be electrically coupled at a first surface 170-1 (e.g., an active surface 123) to the package substrate 150 and electrically coupled at a second surface 170-2 to the second and third conductive pathways 109-2, 109-3 in the RDL 148, such that power may be supplied to the second surface 170-2 of the first microelectronic component 102 from the power source 183. The second surface of the second microelectronic component 103 may be electrically coupled to the second surface of the first microelectronic component 102 by the second and third conductive pathways 109-2, 109-3 in the RDL 148. In some embodiments, the second and third conductive pathways 190-2, 109-3 are a same conductive pathway in the RDL 148. The third microelectronic component 105 may be electrically coupled at the first surface 170-1 (e.g., an active surface 123) to the package substrate 150 and also may be electrically coupled to the first conductive pathway 109-1. In some embodiments, the third microelectronic component 105 may be electrically coupled at a first surface 170-1 to the package substrate 150 and electrically coupled at a second surface 170-2 (e.g., an active surface 123) to the RDL 148. The microelectronic assembly 100 of FIG. 12A may also include a fourth microelectronic component 101 mounted on a top surface of the RDL 148 and electrically coupled to the second and/or third conductive pathway 109-2, 109-3 in the RDL 148 (e.g., electrically coupled to the topside power delivery pathway).

FIG. 12B is a side, cross-sectional view of a microelectronic assembly 100, in accordance with various embodiments. The microelectronic assembly 100 of FIG. 12B may include a circuit board 182 having a power source 183 electrically coupled to a package substrate 150 having a first conductive pathway 109-1, an insulating material 133 on the package substrate having a through-mold via (TMV) 111 and a first and a third microelectronic component 102, 105 embedded therein, an RDL 148 on the insulating material 133 having a second conductive pathway 109-2 and a third conductive pathway 109-3, and a second microelectronic component 103 mounted on a top surface of the RDL 148. In particular, the first conductive pathway 109-1 in the package substrate 150 may be electrically coupled to the power source 183. The TMV 111 may be electrically coupled at a first surface 170-1 to the first conductive pathway 109-1 in the package substrate 150 and electrically coupled at a second surface 170-2 to the second and/or third conductive pathways 109-2, 109-3 in the RDL 148. The TMV 111 may be positioned along a perimeter (e.g., outer edge) of the insulating material 133. The first microelectronic component 102 may be electrically coupled at a first surface 170-1 to the package substrate 150 and electrically coupled at a second surface 170-2 (e.g., an active surface 123) to the second and third conductive pathways 109-2, 109-3 in the RDL 148, such that power may be supplied to the second surface 170-2 of the first microelectronic component 102 from the power source 183. The second microelectronic component 103 may be electrically coupled to the first microelectronic component 102 by the second and/or third conductive pathways 109-2, 109-3 in the RDL 148. In some embodiments, the second and third conductive pathways 190-2, 109-3 are a same conductive pathway in the RDL 148. The third microelectronic component 105 may be electrically coupled at the first surface 170-1 (e.g., an active surface 123) to the package substrate 150 and also may be electrically coupled to the first conductive pathway 109-1. In some embodiments, the third microelectronic component 105 may be electrically coupled at a first surface 170-1 to the package substrate 150 and electrically coupled at a second surface 170-2 (e.g., an active surface 123) to the RDL 148. The microelectronic assembly 100 of FIG. 12B may also include a fourth microelectronic component 101 mounted on a top surface of the RDL 148 and electrically coupled to the second and/or third conductive pathway 109-2, 109-3 in the RDL 148 (e.g., electrically coupled to the topside power delivery pathway). In some embodiments, the fourth microelectronic component 101A may be mounted on a top surface of the second microelectronic component 103 and electrically coupled to the second microelectronic component 103 by conductive pathways in the RDL 148 (as shown) or by conductive contacts on the top and bottom surfaces of the second and fourth microelectronic components 103, 101, respectively (not shown). In some embodiments, the fourth microelectronic component 101B may be mounted on a top surface of the RDL 148 adjacent to (e.g., side-by-side) the second microelectronic component 103 and electrically coupled to the second microelectronic component 103 by conductive pathways in the RDL 148. The microelectronic assemblies 100 of FIGS. 12A and 12B may be manufactured using any suitable techniques, including, for example, the processes described above with reference to FIG. 11.

FIGS. 13A and 13B are side, cross-sectional views of microelectronic assemblies 100, in accordance with various embodiments. The microelectronic assemblies 100 of FIGS. 13A and 13B may have a topside power delivery pathway that includes a wire bond 112. The microelectronic assembly 100 of FIG. 13A may include a circuit board 182 having a power source 183 electrically coupled to a package substrate 150 having a first conductive pathway 109-1, an insulating material 133 on the package substrate having a first, a second, and a third microelectronic component 102, 103, 105 embedded therein, an RDL 148 on the insulating material 133 having a second conductive pathway 109-2 and a third conductive pathway 109-3, and a wire bond electrically coupling the first conductive pathway 109-1 and the second and/or third conductive pathways 109-2, 109-3. In particular, the first conductive pathway 109-1 in the package substrate 150 may be electrically coupled to the power source 183. The wire bond 112 may be electrically coupled to the first conductive pathway 109-1 in the package substrate 150 and electrically coupled to the second and/or third conductive pathways 109-2, 109-3 in the RDL 148. The wire bond 112 may be positioned along a perimeter (e.g., outer edge) of the package substrate 150 and the RDL 148. The first and second microelectronic components 102, 103 may be electrically coupled at a first surface 170-1 (e.g., an active surface 123) to the package substrate 150 and electrically coupled at a second surface 170-2 to the second and third conductive pathways 109-2, 109-3 in the RDL 148, such that power may be supplied to the second surface 170-2 of the first microelectronic component 102 from the power source 183. The second surface of the second microelectronic component 103 may be electrically coupled to the second surface of the first microelectronic component 102 by the second and/or third conductive pathways 109-2, 109-3 in the RDL 148. In some embodiments, the second and third conductive pathways 190-2, 109-3 are a same conductive pathway in the RDL 148. The third microelectronic component 105 may be electrically coupled at the first surface 170-1 (e.g., an active surface 123) to the package substrate 150 and also may be electrically coupled to the first conductive pathway 109-1. In some embodiments, the third microelectronic component 105 may be electrically coupled at a first surface 170-1 to the package substrate 150 and electrically coupled at a second surface 170-2 (e.g., an active surface 123) to the RDL 148. The microelectronic assembly 100 of FIG. 13A may also include a fourth microelectronic component 101 mounted on a top surface of the RDL 148 and electrically coupled to the second and/or third conductive pathway 109-2, 109-3 in the RDL 148 (e.g., electrically coupled to the topside power delivery pathway). The microelectronic assembly 100 of FIG. 13A may also include a mold material 189. The mold material 189 may include any suitable material. In some embodiments, the mold material 189 is an organic polymer with inorganic silica particles. In some embodiments, the mold material 189 is a dielectric material, as described above with reference to the insulating material 133 of FIG. 1. The mold material 189 may extend around the wire bonds 112, the insulating material 133, the RDL 148, the second and fourth microelectronic components 103, 101, and on the surface of the package substrate 150.

FIG. 13B is a side, cross-sectional view of a microelectronic assembly 100, in accordance with various embodiments. The microelectronic assembly 100 of FIG. 13B may have a topside power delivery pathway that includes a circuit board 182 having a power source 183 electrically coupled to a package substrate 150 having a first conductive pathway 109-1, an insulating material 133 on the package substrate having a first and a third microelectronic component 102, 105 embedded therein, an RDL 148 on the insulating material 133 having a second conductive pathway 109-2 and a third conductive pathway 109-3, and a wire bond electrically coupling the first conductive pathway 109-1 and the second and/or third conductive pathways 109-2, 109-3, and a second microelectronic component 103 mounted on a top surface of the RDL 148. In particular, the first conductive pathway 109-1 in the package substrate 150 may be electrically coupled to the power source 183. The TMV 111 may be electrically coupled at a first surface 170-1 to the first conductive pathway 109-1 in the package substrate 150 and electrically coupled at a second surface 170-2 to the second and/or third conductive pathways 109-2, 109-3 in the RDL 148. The wire bond 112 may be electrically coupled to the first conductive pathway 109-1 in the package substrate 150 and electrically coupled to the second and/or third conductive pathways 109-2, 109-3 in the RDL 148. The wire bond 112 may be positioned along a perimeter (e.g., outer edge) of the package substrate 150 and the RDL 148. The first microelectronic component 102 may be electrically coupled at a first surface 170-1 to the package substrate 150 and electrically coupled at a second surface 170-2 (e.g., an active surface 123) to the second and/or third conductive pathways 109-2, 109-3 in the RDL 148, such that power may be supplied to the second surface 170-2 of the first microelectronic component 102 from the power source 183. The second microelectronic component 103 may be electrically coupled to the first microelectronic component 102 by the second and/or third conductive pathways 109-2, 109-3 in the RDL 148. In some embodiments, the second and third conductive pathways 190-2, 109-3 are a same conductive pathway in the RDL 148. The third microelectronic component 105 may be electrically coupled at the first surface 170-1 (e.g., an active surface 123) to the package substrate 150 and also may be electrically coupled to the first conductive pathway 109-1. In some embodiments, the third microelectronic component 105 may be electrically coupled at a first surface 170-1 to the package substrate 150 and electrically coupled at a second surface 170-2 (e.g., an active surface 123) to the RDL 148. The microelectronic assembly 100 of FIG. 13B may also include a fourth microelectronic component 101 mounted on a top surface of the RDL 148 and electrically coupled to the second and/or third conductive pathway 109-2, 109-3 in the RDL 148 (e.g., electrically coupled to the topside power delivery pathway). In some embodiments, the fourth microelectronic component 101A may be mounted on a top surface of the second microelectronic component 103 and electrically coupled to the second microelectronic component 103 by conductive pathways in the RDL 148 (as shown) or by conductive contacts on the top and bottom surfaces of the second and fourth microelectronic components 103, 101, respectively (not shown). In some embodiments, the fourth microelectronic component 101B may be mounted on a top surface of the RDL 148 adjacent to (e.g., side-by-side) the second microelectronic component 103 and electrically coupled to the second microelectronic component 103 by conductive pathways in the RDL 148. The microelectronic assembly 100 of FIG. 13B may also include a mold material 189. The mold material 189 may extend around the wire bonds 112, the insulating material 133, the RDL 148, the second and fourth microelectronic components 103, 101, and on the surface of the package substrate 150.

FIGS. 14A-14I are side, cross-sectional views of various stages in an example process for manufacturing the microelectronic assembly 100 of FIG. 13B, in accordance with various embodiments. FIG. 6A illustrates a first microelectronic component 102, a second microelectronic component 103, and a third microelectronic component 105 having conductive contacts 121 at an active surface 123 and conductive contacts 122 at a backside surface.

Figure 14A:
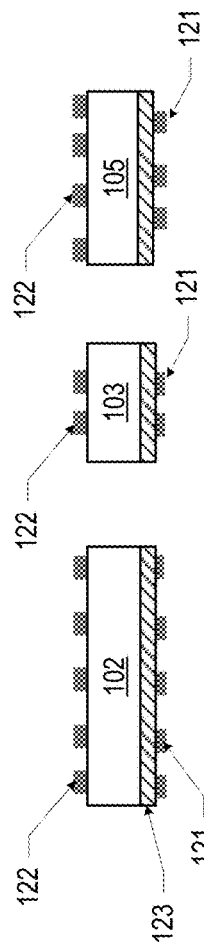
FIGS. 14A-14I are side, cross-sectional views of various stages in an example process for manufacturing the microelectronic assembly of FIG. 13B, in accordance with various embodiments.
Figure 14B:
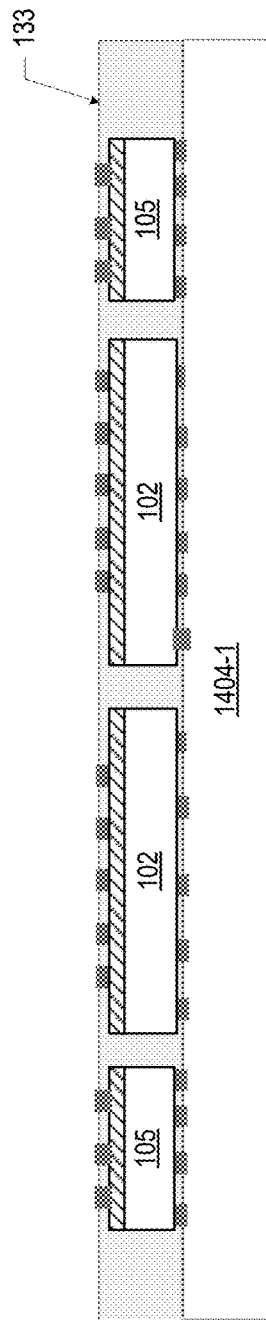

FIG. 14B illustrates an assembly subsequent to placing the first and third microelectronic components 102, 105 on a first carrier 1404-1 with the active surfaces 123 facing away from the first carrier 1404-1 and depositing an insulating material 133 on and around the first and third microelectronic components 102, 105. The carrier 1404 may include any suitable material, and in some embodiments, may include a semiconductor wafer (e.g., a silicon wafer) or glass (e.g., a glass panel). The first and third microelectronic components 102, 105 may be attached to the first carrier 1404-1 and the insulating material 133 may be deposited using any suitable technique, as described above with reference to FIG. 6.

Figure 14C:
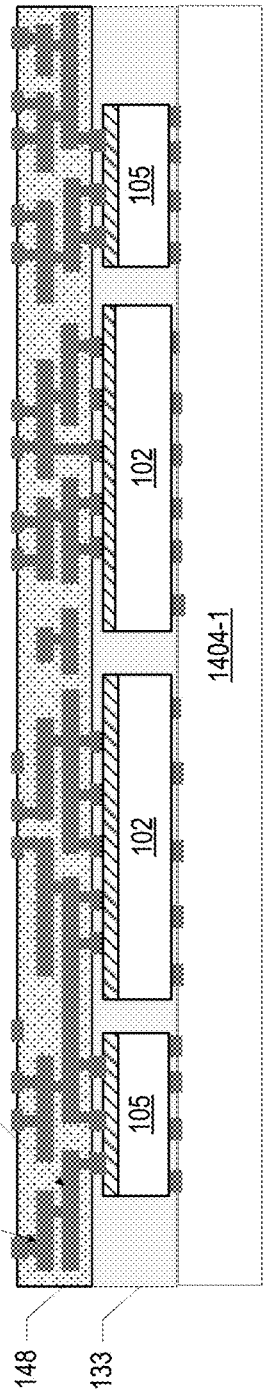

FIG. 14C illustrates an assembly subsequent to forming an RDL 148 on the top surface of the assembly of FIG. 14B. The RDL 148 may include a second conductive pathway 109-2 and a third conductive pathway 109-3. The RDL 148 may include conductive contacts on a bottom surface and conductive contacts on a top surface of the RDL 148. The first and third microelectronic components 102, 105 may be electrically coupled to the second and/or third conductive pathways 109-2, 109-3 via conductive contacts on the bottom surface of the RDL 148. The RDL 148 may be manufactured using any suitable technique, such as a PCB technique or a redistribution layer technique.

Figure 14D:
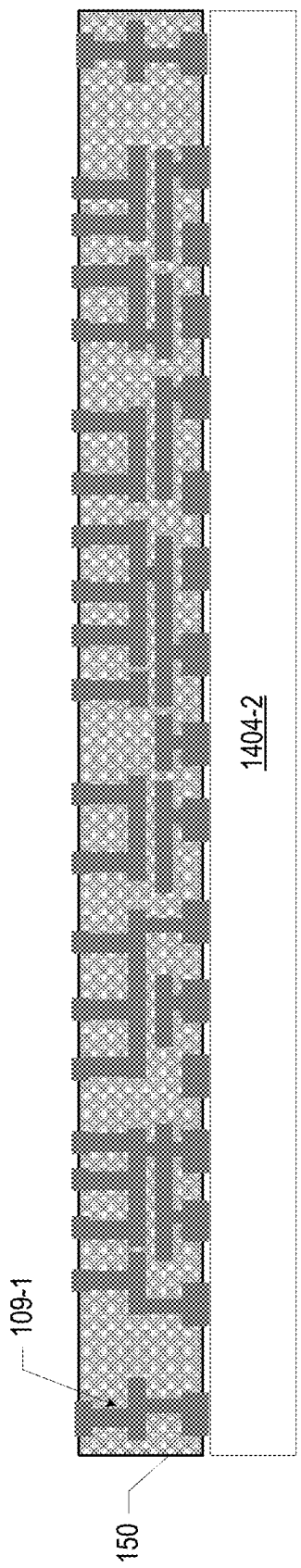

FIG. 14D illustrates an assembly subsequent to forming a package substrate 150 on a surface of a second carrier 1404-2. The package substrate 150 may include a first conductive pathway 109-1. The package substrate 150 may be formed using any suitable technique, such as any of the techniques discussed above with reference to the formation of the package substrate 150 of FIG. 1.

Figure 14E:
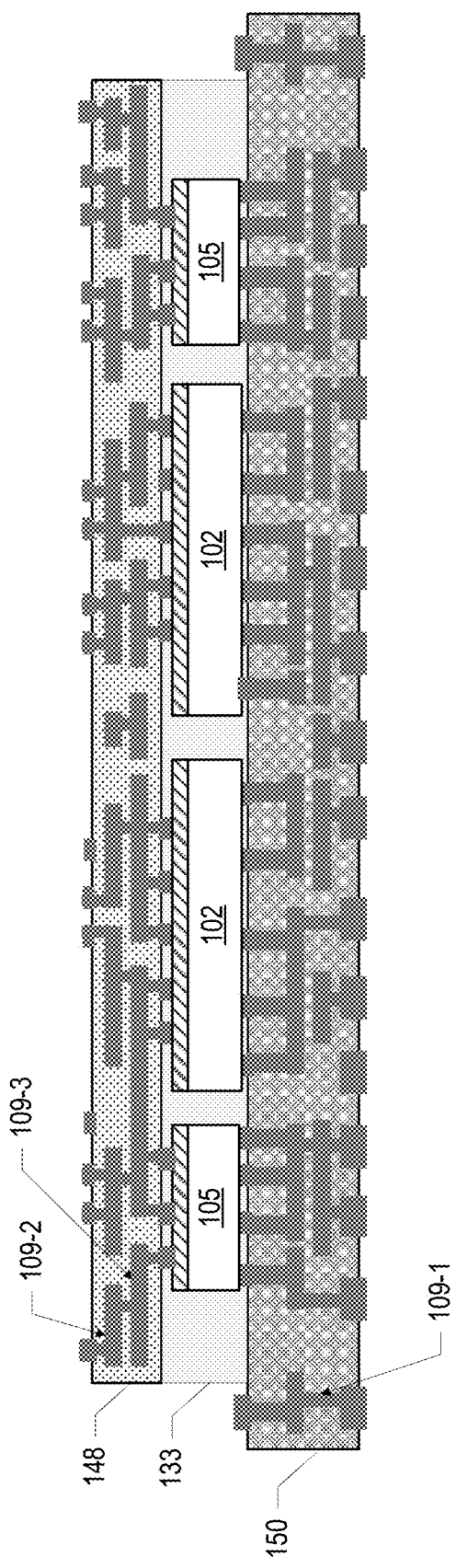

FIG. 14E illustrates an assembly subsequent to removing the first carrier 1402-1 from the assembly of FIG. 14C, electrically coupling the first and third microelectronic components 102, 105 to the package substrate 150 via FLIs 151, and removing the second carrier 1404-2 from the assembly of FIG. 14D.

Figure 14F:
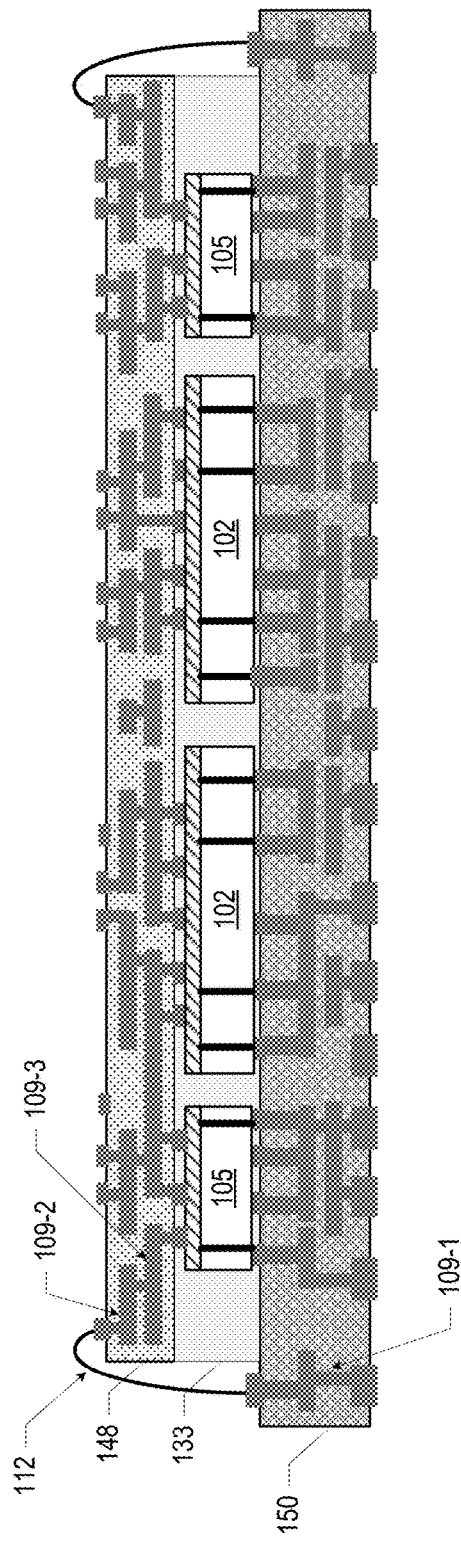

FIG. 14F illustrates an assembly subsequent to attaching a wire bond 112 and electrically coupling to the first conductive pathway 109-1 in the package substrate 150 and the second and/or third conductive pathways 109-2, 109-3 in the RDL 148.

Figure 14G:
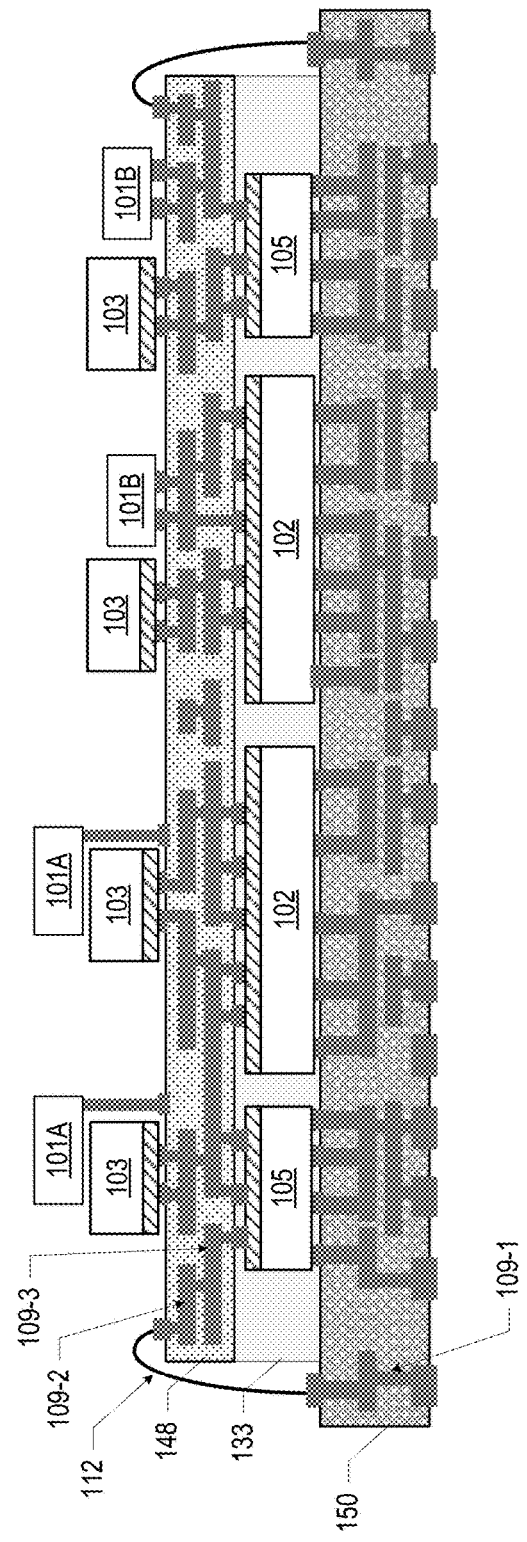

FIG. 14G illustrates an assembly subsequent to placing and electrically coupling a second and a fourth microelectronic component 103, 101 to the top surface of the RDL 148. The second and fourth microelectronic components 103, 101 may be placed and electrically coupled using any suitable techniques, as described above with reference to FIG. 6. The second and fourth microelectronic components 103, 101 may be electrically coupled to the second and/or third conductive pathways 109-2, 109-3 via the conductive contacts on the top surface of the RDL 148. In some embodiments, the fourth microelectronic component 101A may be mounted on a top surface of the second microelectronic component 103 and electrically coupled to the second microelectronic component 103 by conductive pathways in the RDL 148 (as shown) or by conductive contacts on the top and bottom surfaces of the second and fourth microelectronic components 103, 101, respectively (not shown). In some embodiments, the fourth microelectronic component 101B may be mounted on a top surface of the RDL 148 adjacent to (e.g., side-by-side) the second microelectronic component 103 and electrically coupled to the second microelectronic component 103 by conductive pathways in the RDL 148.

Figure 14H:
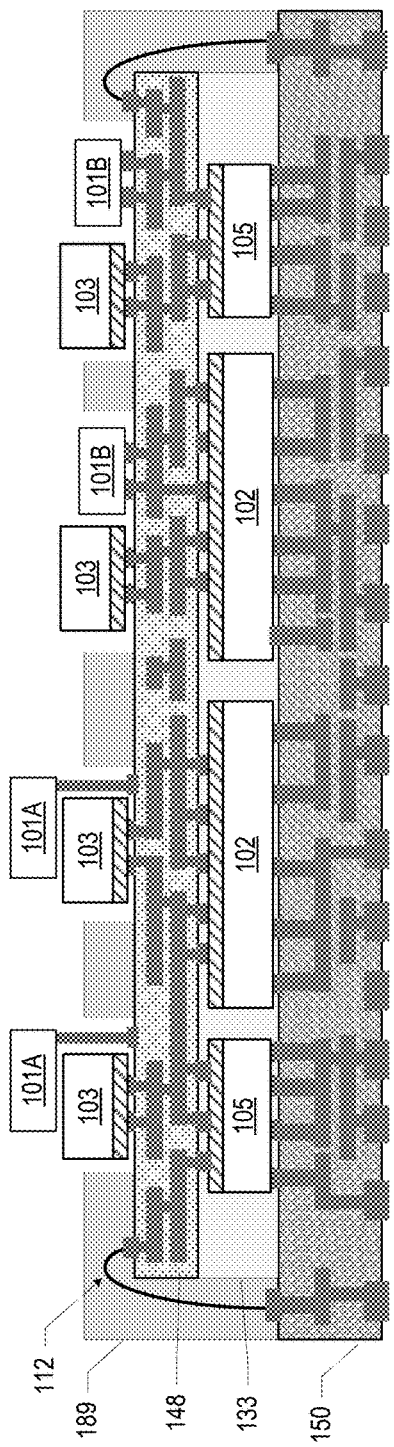

FIG. 14H illustrates an assembly subsequent to providing a mold material 189 on and around the assembly of FIG. 14G. The mold material 189 may extend around the wire bonds 112, the insulating material 133, the RDL 148, the second and fourth microelectronic components 103, 101, and on the surface of the package substrate 150. The mold material 189 may be formed using any suitable process, including lamination, or compression molding. The assembly of FIG. 14H may itself be a microelectronic assembly 100, as shown. Further manufacturing operations may be performed on the microelectronic assembly 100 of FIG. 14H to form other microelectronic assemblies 100, for example, as shown in FIG. 14I.

Figure 14I:
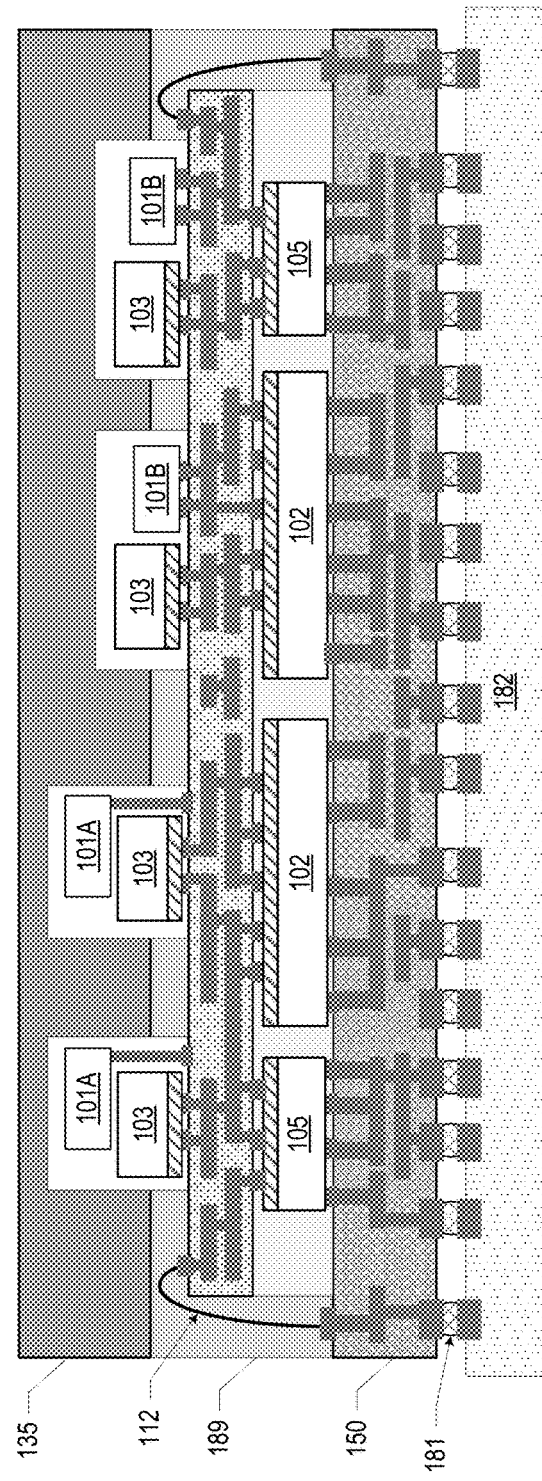

FIG. 14I illustrates the assembly subsequent to depositing a solder resist layer and attaching solder balls to the bottom surface of the package substrate 150, electrically coupling the bottom surface of the package substrate 150 to a circuit board 182 by SLIs 181, and providing a heat transfer structure 135 on the top surface of the assembly of FIG. 14H, similar to the microelectronic assembly 100 of FIG. 13B.

The microelectronic assemblies 100 disclosed herein may be used for any suitable application. For example, in some embodiments, a microelectronic assembly 100 may be used to enable very small form factor voltage regulation for field programmable gate array (FPGA) or processing units (e.g., a central processing unit, a graphics processing unit, a FPGA, a modem, an applications processor, etc.) especially in mobile devices and small form factor devices.

The microelectronic assemblies 100 disclosed herein may be included in any suitable electronic component. FIGS. 15-18 illustrate various examples of apparatuses that may include, or be included in, any of the microelectronic assemblies 100 disclosed herein.

Figure 15:
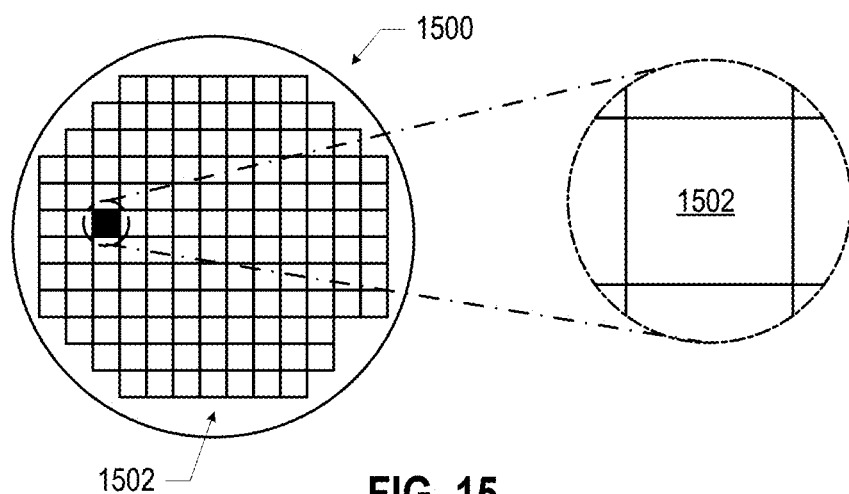
FIG. 15 is a top view of a wafer and dies that may be included in a microelectronic assembly, in accordance with any of the embodiments disclosed herein.

FIG. 15 is a top view of a wafer 1500 and dies 1502 that may be included in any of the microelectronic components 101, 102, 103, 105 disclosed herein. For example, a die 1502 may serve as a microelectronic component, or may be included in a microelectronic component. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the microelectronic components 101, 102, 103, 105 disclosed herein. The die 1502 may include one or more transistors (e.g., some of the transistors 1640 of FIG. 16, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 18) or other logic that is configured to store information in the memory devices or execute instructions stored in the memory array. In some embodiments, a die 1502 (e.g., a microelectronic component 102) may be a central processing unit, a radio frequency chip, a power converter, or a network processor. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 16:
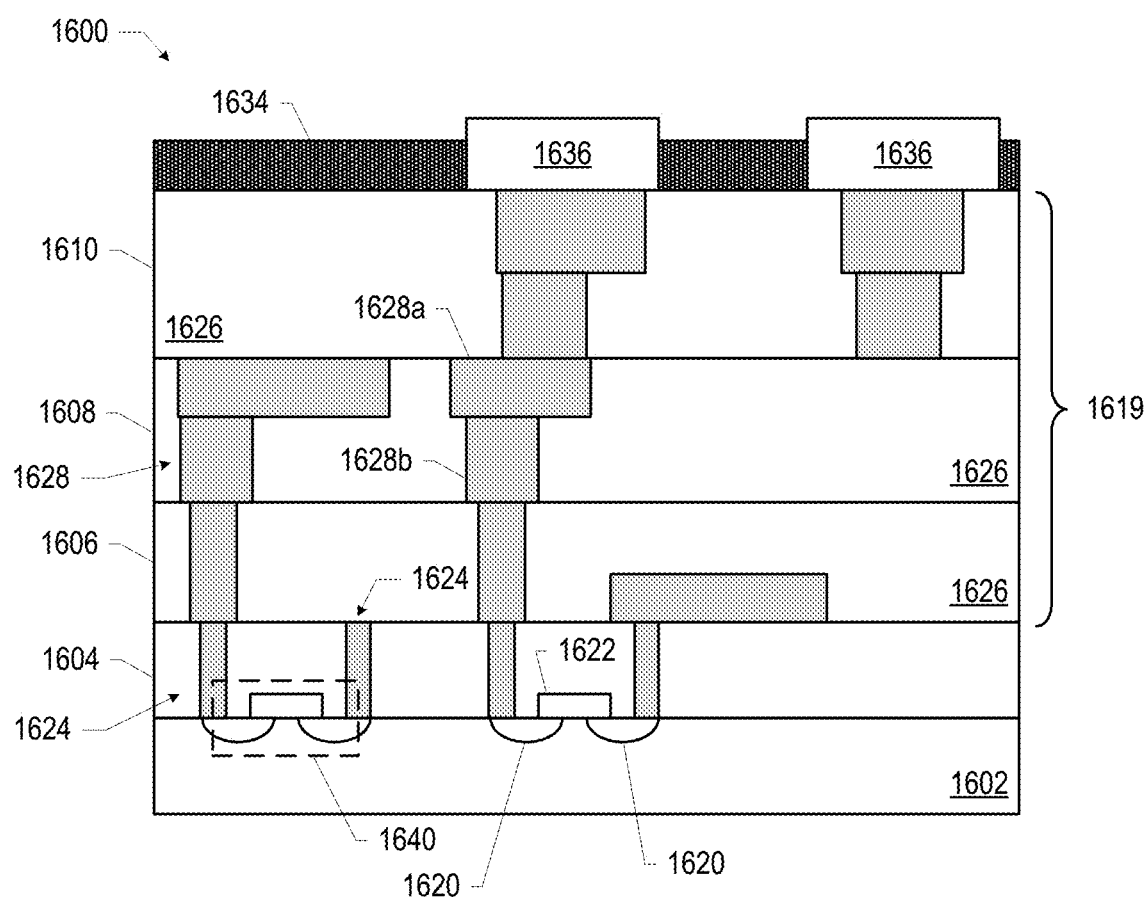
FIG. 16 is a cross-sectional side view of an IC device that may be included in a microelectronic assembly, in accordance with any of the embodiments disclosed herein.

FIG. 16 is a side, cross-sectional view of an IC device 1600 that may be included in any of the microelectronic components 101, 102, 103, 105 disclosed herein. For example, an IC device 1600 (e.g., as part of a die 1502, as discussed above with reference to FIG. 15) may serve as a microelectronic component, or may be included in a microelectronic component. One or more of the IC devices 1600 may be included in one or more dies 1502 (FIG. 15). The IC device 1600 may be formed on a die substrate 1602 (e.g., the wafer 1500 of FIG. 15) and may be included in a die (e.g., the die 1502 of FIG. 15). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 15) or a wafer (e.g., the wafer 1500 of FIG. 15).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 16 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a PMOS or a NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 16 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 16. Although a particular number of interconnect layers 1606-1610 is depicted in FIG. 16, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page from the perspective of FIG. 16. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 16. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 16, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die (e.g., like the microelectronic component 102-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die (e.g., like the microelectronic component 102-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 17:
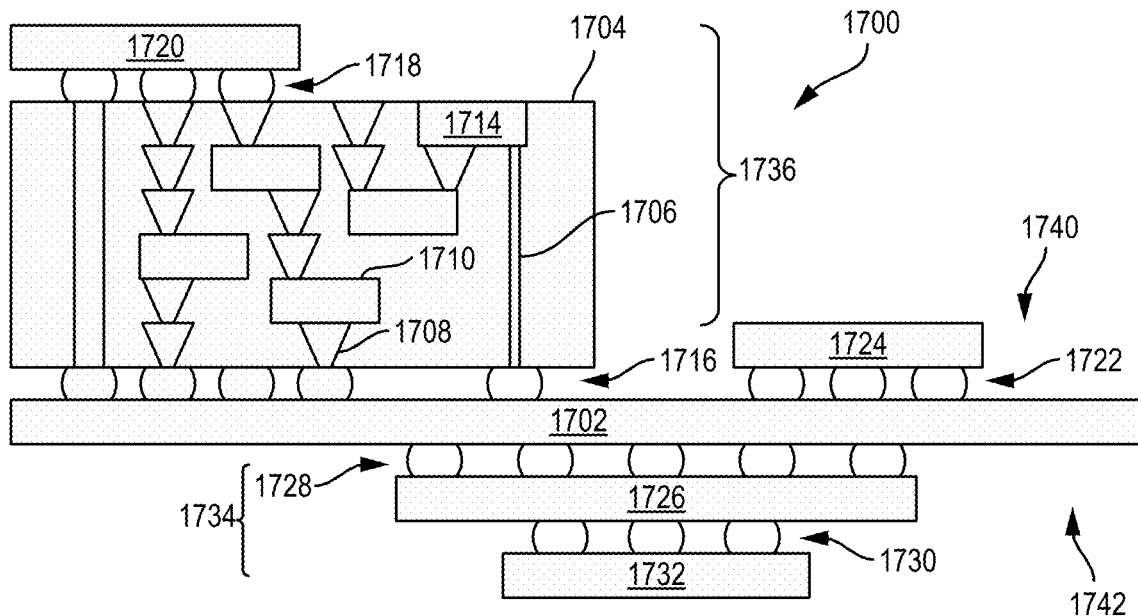
FIG. 17 is a cross-sectional side view of an IC device assembly that may include a microelectronic assembly, in accordance with any of the embodiments disclosed herein.

FIG. 17 is a cross-sectional side view of an IC device assembly 1700 that may include any of the microelectronic components 101, 102, 103, 105 and/or microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 17), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 17, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 15), an IC device (e.g., the IC device 1600 of FIG. 16), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 17, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 17 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 18:
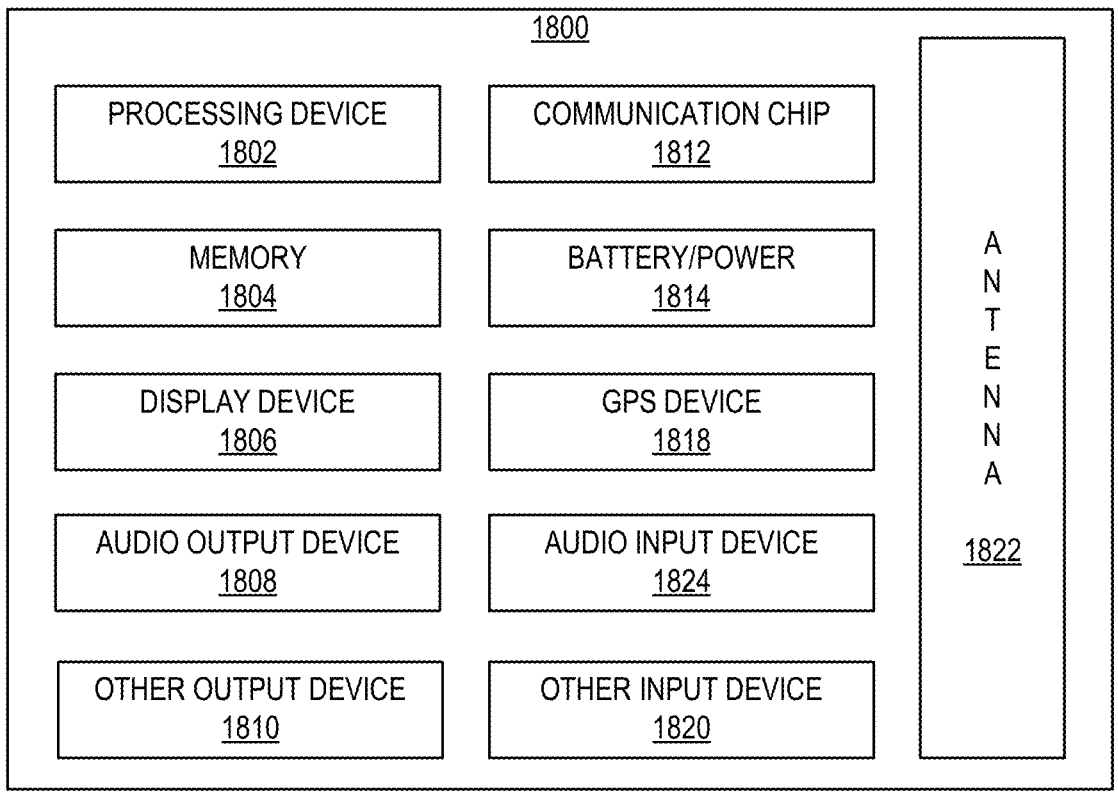
FIG. 18 is a block diagram of an example electrical device that may include a microelectronic assembly, in accordance with any of the embodiments disclosed herein.

FIG. 18 is a block diagram of an example electrical device 1800 that may include any of the microelectronic components 101, 102, 103, 105 and/or microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 18 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 18, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMLS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a hand-held, portable or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable computing device. In some embodiments, the electrical device 1800 may be any other electronic device that processes data.

The following paragraphs provide various examples of the embodiments disclosed herein.

Example 1 is a microelectronic assembly, including a package substrate, having a surface, including a first conductive pathway electrically coupled to a power source; an insulating material on the surface of the package substrate; a first microelectronic component, having a first surface and an opposing second surface, the first surface facing the package substrate, embedded in the insulating material; a second microelectronic component, having a first surface and an opposing second surface, the first surface facing the package substrate, embedded in the insulating material; a redistribution layer (RDL), on the insulating material, including a second conductive pathway electrically coupled to the second surface of the second microelectronic component and the second surface of the first microelectronic component; and a wire bond electrically coupling the first conductive pathway and the second conductive pathway.

Example 2 may include the subject matter of Example 1, and may further specify that the first surface of the first microelectronic component is an active side and the second surface of the first microelectronic component is a backside.

Example 3 may include the subject matter of Example 1, and may further specify that the first surface of the first microelectronic component is a backside and the second surface of the first microelectronic component is an active side.

Example 4 may include the subject matter of Example 1, and may further specify that the first surface of the second microelectronic component is an active side and the second surface of the second microelectronic component is a backside.

Example 5 may include the subject matter of Example 4, and may further specify that the first surface of the second microelectronic component is a backside and the second surface of the second microelectronic component is an active side.

Example 6 may include the subject matter of Example 1, and may further specify that the RDL has a first surface and an opposing second surface and the insulating material is at the first surface of the RDL, and may further include an inductor at the second surface of the RDL and electrically coupled to the second conductive pathway.

Example 7 may include the subject matter of Example 6, and may further include a capacitive element between the inductor and the second surface of the RDL, wherein the capacitive element is electrically coupled to the inductor and to the second conductive pathway.

Example 8 may include the subject matter of Example 6, and may further include a capacitive element, having a first surface and an opposing second surface, between the inductor and the second surface of the RDL, wherein the capacitive element is electrically coupled at the first surface to the second conductive pathway and electrically coupled at the second surface to the inductor.

Example 9 may include the subject matter of Example 1, and may further specify that the surface of the package substrate is a second surface and the package substrate further includes an opposing first surface, and may further include a circuit board electrically coupled to the first surface of the package substrate, wherein the power source is on the circuit board.

Example 10 may include the subject matter of Example 9, and may further include a capacitive element at the first surface of the package substrate and electrically coupled to the first conductive pathway.

Example 11 may include the subject matter of Example 1, and may further include a heat transfer structure at the second surface of the RDL.

Example 12 may include the subject matter of Example 1, and may further specify that the first microelectronic component is a central processing unit, a graphics processing unit, a digital signal processor, an application specific integrated circuit, a server processor, or a crypto processor.

Example 13 may include the subject matter of Example 1, and may further specify that the second microelectronic component is a voltage regulator.

Example 14 may include the subject matter of Example 13, and may further specify that the voltage regulator configured to convert a low current high voltage signal to a low voltage high current signal.

Example 15 is a microelectronic assembly, including a circuit board including a power source; a package substrate, having a first surface and an opposing second surface, on the circuit board with the first surface facing the circuit board and including a first conductive pathway electrically coupled to the power source; a first microelectronic component, having a first surface and an opposing second surface, embedded in a mold material on the second surface of the package substrate; a redistribution layer (RDL), having a first surface and an opposing second surface, on the mold material with the first surface facing the mold material, including a second conductive pathway; a second microelectronic component at the second surface of the RDL and electrically coupled to the second conductive pathway, wherein the conductive pathway electrically couples the second microelectronic component and the second surface of the first microelectronic component; and a wire bond electrically coupling the first conductive pathway and the second conductive pathway.

Example 16 may include the subject matter of Example 15, and may further specify that the first surface of the first microelectronic component is an active side and the second surface of the first microelectronic component is a backside.

Example 17 may include the subject matter of Example 15, and may further specify that the first surface of the first microelectronic component is a backside and the second surface of the first microelectronic component is an active side.

Example 18 may include the subject matter of Example 15, and may further include a third microelectronic component adjacent to the second microelectronic component at the second surface of the RDL and electrically coupled to the second conductive pathway.

Example 19 may include the subject matter of Example 15, and may further specify that the second microelectronic component has a first surface at the second surface of the RDL and an opposing second surface, and may further include a third microelectronic component at the second surface of the second microelectronic component and electrically coupled to the second conductive pathway.

Example 20 may include the subject matter of Example 15, and may further specify that the first microelectronic component is a central processing unit, a graphics processing unit, a digital signal processor, an application specific integrated circuit, a server processor, or a crypto processor.

Example 21 may include the subject matter of Example 15, and may further specify that the second microelectronic component is a voltage regulator.

Example 22 may include the subject matter of Example 21, and may further specify that the voltage regulator is configured to convert a low current high voltage signal to a low voltage high current signal.

Example 23 may include the subject matter of Example 18, and may further specify that the third microelectronic component is an inductor.

Example 24 may include the subject matter of Example 19, and may further specify that the third microelectronic component is an inductor.

Example 25 may include the subject matter of Example 15, and may further include a capacitive element at the first surface of the package substrate and electrically coupled to the first conductive pathway.

Example 26 may include the subject matter of Example 15, and may further include a heat transfer structure at the second surface of the RDL.

Example 27 is a microelectronic assembly, including a package substrate, having a surface, including a first conductive pathway electrically coupled to a power source; an insulating material on the surface of the package substrate; a first microelectronic component, having a first surface and an opposing second surface, embedded in the insulating material with the first surface facing the package substrate; a second microelectronic component, having a first surface and an opposing second surface, embedded in the insulating material with the first surface facing the package substrate; a through-mold via (TMV), positioned along a perimeter of the insulating material, extending through the insulating material and electrically coupled to the first conductive pathway; and a redistribution layer (RDL) on the insulating material including a second conductive pathway electrically coupling the TMV, the second surface of the second microelectronic component, and the second surface of the first microelectronic component.

Example 28 may include the subject matter of Example 27, and may further specify that the first surface of the first microelectronic component is an active side and the second surface of the first microelectronic component is a backside.

Example 29 may include the subject matter of Example 27, and may further specify that the first surface of the first microelectronic component is a backside and the second surface of the first microelectronic component is an active side.

Example 30 may include the subject matter of Example 27, and may further specify that the first surface of the second microelectronic component is an active side and the second surface of the second microelectronic component is a backside.

Example 31 may include the subject matter of Example 30, and may further specify that the first surface of the second microelectronic component is a backside and the second surface of the second microelectronic component is an active side.

Example 32 may include the subject matter of Example 27, and may further specify that the RDL has a first surface and an opposing second surface and the insulating material is at the first surface of the RDL, and may further include an inductor at the second surface of the RDL and electrically coupled to the second conductive pathway.

Example 33 may include the subject matter of Example 32, and may further include: a capacitive element between the inductor and the second surface of the RDL, wherein the capacitive element is electrically coupled to the inductor and to the second conductive pathway.

Example 33B may include the subject matter of Example 32, and may further include a capacitive element, having a first surface and an opposing second surface, between the inductor and the second surface of the RDL, wherein the capacitive element is electrically coupled at the first surface to the second conductive pathway and electrically coupled at the second surface to the inductor.

Example 34 may include the subject matter of Example 27, and may further specify that the surface of the package substrate is a second surface and the package substrate further includes an opposing first surface, and may further include a circuit board electrically coupled to the first surface of the package substrate, wherein the power source is on the circuit board.

Example 35 may include the subject matter of Example 34, and may further include a capacitive element at the first surface of the package substrate and electrically coupled to the first conductive pathway.

Example 36 may include the subject matter of Example 27, and may further include a heat transfer structure at the second surface of the RDL.

Example 37 may include the subject matter of Example 27, and may further specify that the first microelectronic component is a central processing unit, a graphics processing unit, a digital signal processor, an application specific integrated circuit, a server processor, or a crypto processor.

Example 38 may include the subject matter of Example 27, and may further specify that the second microelectronic component is a voltage regulator configured to convert a low current high voltage signal to a low voltage high current signal.

Example 39 is a microelectronic assembly, including a circuit board including a power source; a package substrate, having a first surface and an opposing second surface, on the circuit board with the first surface facing the circuit board and including a first conductive pathway electrically coupled to the power source; a first microelectronic component, having a first surface and an opposing second surface, embedded in a mold material on the second surface of the package substrate; a through-mold via (TMV), positioned along a perimeter of the mold material, extending through the mold material and electrically coupled to the first conductive pathway; a redistribution layer (RDL), having a first surface and an opposing second surface, on the mold material with the first surface facing the mold material, including a second conductive pathway electrically coupled to the TMV; and a second microelectronic component at the second surface of the RDL and electrically coupled to the second conductive pathway, wherein the second conductive pathway electrically couples the TMV, the second microelectronic component, and the second surface of the first microelectronic component.

Example 40 may include the subject matter of Example 39, and may further specify that the first surface of the first microelectronic component is an active side and the second surface of the first microelectronic component is a backside.

Example 41 may include the subject matter of Example 39, and may further specify that the first surface of the first microelectronic component is a backside and the second surface of the first microelectronic component is an active side.

Example 42 may include the subject matter of Example 39, and may further include a third microelectronic component adjacent to the second microelectronic component at the second surface of the RDL and electrically coupled to the second conductive pathway.

Example 43 may include the subject matter of Example 39, and may further specify that the second microelectronic component has a first surface at the second surface of the RDL and an opposing second surface, and may further include a third microelectronic component at the second surface of the second microelectronic component and electrically coupled to the second conductive pathway.

Example 44 may include the subject matter of Example 39, and may further specify that the first microelectronic component is a central processing unit, a graphics processing unit, a digital signal processor, an application specific integrated circuit, a server processor, or a crypto processor.

Example 45 may include the subject matter of Example 39, and may further specify that the second microelectronic component is a voltage regulator.

Example 46 may include the subject matter of Example 45, and may further specify that the voltage regulator is configured to convert a low current high voltage signal to a low voltage high current signal.

Example 47 may include the subject matter of Example 42, and may further specify that the third microelectronic component is an inductor.

Example 48 may include the subject matter of Example 43, and may further specify that the third microelectronic component is an inductor.

Example 49 may include the subject matter of Example 39, and may further include a capacitive element at the first surface of the package substrate and electrically coupled to the first conductive pathway.

Example 50 may include the subject matter of Example 39, and may further include a heat transfer structure at the second surface of the RDL.

Example 51 is a microelectronic assembly, including a package substrate, having a surface, including a first conductive pathway electrically coupled to a power source; a first microelectronic component, having a first surface electrically coupled to the surface of the package substrate and an opposing second surface, embedded in an insulating material on the surface of the package substrate and including a through-substrate via (TSV) electrically coupled to the first conductive pathway; a second microelectronic component, having a first surface electrically coupled to the surface of the package substrate and an opposing second surface, embedded in the insulating material; and a redistribution layer (RDL), on the insulating material, including a second conductive pathway electrically coupling the TSV, the second surface of the second microelectronic component, and the second surface of the first microelectronic component.

Example 52 may include the subject matter of Example 51, and may further specify that the first surface of the first microelectronic component is an active side and the second surface of the first microelectronic component is a backside.

Example 53 may include the subject matter of Example 1, and may further specify that the first surface of the first microelectronic component is a backside and the second surface of the first microelectronic component is an active side.

Example 54 may include the subject matter of Example 51, and may further specify that the TSV is a first TSV, and may further include a second TSV in the second microelectronic component electrically coupled to the first conductive pathway in the package substrate and to the second conductive pathway in the RDL.

Example 55 may include the subject matter of Example 54, and may further specify that the first surface of the second microelectronic component is an active side and the second surface of the second microelectronic component is a backside.

Example 56 may include the subject matter of Example 54, and may further specify that the first surface of the second microelectronic component is a backside and the second surface of the second microelectronic component is an active side.

Example 57 may include the subject matter of Example 51, and may further specify that the insulating material is a first insulating material, and may further include a capacitive element embedded in a second insulating material between the package substrate and the first insulating material and electrically coupled to the first conductive pathway and the TSV.

Example 58 may include the subject matter of Example 51, and may further specify that the RDL has a first surface and an opposing second surface and the insulating material is at the first surface of the RDL, and may further include an inductor at the second surface of the RDL and electrically coupled to the second conductive pathway.

Example 59 may include the subject matter of Example 58, and may further include a capacitive element between the inductor and the second surface of the RDL, wherein the capacitive element is electrically coupled to the inductor and to the second conductive pathway.

Example 60 may include the subject matter of Example 51, and may further specify that the surface of the package substrate is a second surface and the package substrate further includes an opposing first surface, and may further include a circuit board electrically coupled to the first surface of the package substrate, wherein the power source is on the circuit board.

Example 61 may include the subject matter of Example 60, and may further include a capacitive element at the first surface of the package substrate and electrically coupled to the first conductive pathway.

Example 62 may include the subject matter of Example 51, and may further include a heat transfer structure on the RDL.

Example 63 may include the subject matter of Example 51, and may further specify that the first microelectronic component is a central processing unit, a graphics processing unit, a digital signal processor, an application specific integrated circuit, a server processor, or a crypto processor.

Example 64 may include the subject matter of Example 51, and may further specify that the second microelectronic component is a voltage regulator configured to convert a low current high voltage signal to a low voltage high current signal.

Example 65 is a microelectronic assembly, including a package substrate, having a surface, including a first conductive pathway electrically coupled to a power source; a first microelectronic component, having a first surface electrically coupled to the surface of the package substrate and an opposing second surface, embedded in an insulating material on the surface of the package substrate; a second microelectronic component, having a first surface electrically coupled to the surface of the package substrate and an opposing second surface, embedded in the insulating material and including a through-substrate via (TSV) electrically coupled to the first conductive pathway; and a redistribution layer (RDL), on the insulating material, including a second conductive pathway electrically coupling the TSV, the second surface of the second microelectronic component, and the second surface of the first microelectronic component.

Example 66 may include the subject matter of Example 65, and may further specify that the first surface of the first microelectronic component is an active side and the second surface of the first microelectronic component is a backside.

Example 67 may include the subject matter of Example 65, and may further specify that the first surface of the first microelectronic component is a backside and the second surface of the first microelectronic component is an active side.

Example 68 may include the subject matter of Example 65, and may further specify that the first surface of the second microelectronic component is an active side and the second surface of the second microelectronic component is a backside.

Example 69 may include the subject matter of Example 65, and may further specify that the first surface of the second microelectronic component is a backside and the second surface of the second microelectronic component is an active side.

Example 70 may include the subject matter of Example 65, and may further specify that the RDL has a first surface and an opposing second surface and the insulating material is at the first surface of the RDL, and may further include an inductor at the second surface of the RDL and electrically coupled to the second conductive pathway.

Example 71 may include the subject matter of Example 70, and may further include a capacitive element, having a first surface and an opposing second surface, between the inductor and the second surface of the RDL, wherein the capacitive element is electrically coupled to the inductor and to the second conductive pathway.

Example 72 may include the subject matter of Example 65, and may further specify that the power source is on the package substrate.

Example 73 may include the subject matter of Example 65, and may further specify that the surface of the package substrate is a second surface and the package substrate further includes an opposing first surface, and may further include a circuit board electrically coupled to the first surface of the package substrate, wherein the power source is on the circuit board.

Example 74 may include the subject matter of Example 73, and may further include a capacitive element at the first surface of the package substrate and electrically coupled to the first conductive pathway.

Example 75 may include the subject matter of Example 65, and may further include a heat transfer structure at the second surface of the RDL.

Example 76 may include the subject matter of Example 65, and may further specify that the first microelectronic component is a central processing unit, a graphics processing unit, a digital signal processor, an application specific integrated circuit, a server processor, or a crypto processor.

Example 77 may include the subject matter of Example 65, and may further specify that the second microelectronic component is a voltage regulator.

Example 78 is a microelectronic assembly, including a circuit board including a power source; a package substrate on the circuit board and including a first conductive pathway electrically coupled to the power source; an insulating material on the package substrate; a first microelectronic component, having a first surface at the package substrate and an opposing second surface, embedded in the insulating material and including a first through-substrate via (TSV) electrically coupled to the first conductive pathway; a second microelectronic component, having a first surface at the package substrate and an opposing second surface, embedded in the insulating material and including a second TSV electrically coupled to the first conductive pathway; and a redistribution layer (RDL), on the insulating material, including a second conductive pathway electrically coupling the first and second TSVs, the second surface of the second microelectronic component, and the second surface of the first microelectronic component.

Example 79 may include the subject matter of Example 78, and may further specify that the first surface of the first microelectronic component is an active side and the second surface of the first microelectronic component is a backside.

Example 80 may include the subject matter of Example 78, and may further specify that the first surface of the first microelectronic component is a backside and the second surface of the first microelectronic component is an active side.

Example 81 may include the subject matter of Example 78, and may further specify that the first surface of the second microelectronic component is an active side and the second surface of the second microelectronic component is a backside.

Example 82 may include the subject matter of Example 78, and may further specify that the first surface of the second microelectronic component is a backside and the second surface of the second microelectronic component is an active side.

Example 83 may include the subject matter of Example 78, and may further include a capacitive element between the package substrate and the circuit board and electrically coupled to the first conductive pathway.

Example 84 may include the subject matter of Example 78, and may further include a heat transfer structure on the RDL.

Example 85 may include the subject matter of Example 78, and may further specify that the RDL has a first surface and an opposing second surface and the insulating material is at the first surface of the RDL, and may further include an inductor at the second surface of the RDL and electrically coupled to the second conductive pathway.

Example 86 may include the subject matter of Example 85, and may further include a capacitive element, having a first surface and an opposing second surface, between the inductor and the second surface of the RDL, wherein the capacitive element is electrically coupled to the inductor and to the second conductive pathway.

Example 87 may include the subject matter of Example 78, and may further specify that the insulating material is a dielectric material or a mold material.

Example 88 may include the subject matter of Example 78, and may further specify that the first microelectronic component is a central processing unit, a graphics processing unit, a digital signal processor, an application specific integrated circuit, a server processor, or a crypto processor.

Example 89 may include the subject matter of Example 78, and may further specify that the second microelectronic component is a voltage regulator.

Example 90 may include the subject matter of Example 89, and may further specify that the voltage regulator is configured to convert a low current high voltage signal to a low voltage high current signal.

Example 91 may include the subject matter of Example 78, and may further include a third microelectronic component, having a first surface, electrically coupled to the package substrate, and an opposing second surface, embedded in the insulating material and including a third TSV electrically coupled to the first conductive pathway and the second conductive pathway.

Example 92 may include the subject matter of Example 91, and may further specify that the third microelectronic component is a die including input and output circuitry.

Example 93 is a microelectronic assembly, including a package substrate, having a surface, including a first conductive pathway electrically coupled to a power source; a first microelectronic component, having a first surface electrically coupled to the surface of the package substrate and an opposing second surface, embedded in an insulating material on the surface of the package substrate and including a through-substrate via (TSV) electrically coupled to the first conductive pathway; a redistribution layer (RDL), having a first surface on the insulating material and an opposing second surface, including a second conductive pathway electrically coupled to the TSV; and a second microelectronic component at the second surface of the RDL and electrically coupled to the second conductive pathway, wherein the second conductive pathway electrically couples the TSV, the second microelectronic component, and the second surface of the first microelectronic component.

Example 94 may include the subject matter of Example 93, and may further specify that the first surface of the first microelectronic component is an active side and the second surface of the first microelectronic component is a backside.

Example 95 may include the subject matter of Example 93, and may further specify that the first surface of the first microelectronic component is a backside and the second surface of the first microelectronic component is an active side.

Example 96 may include the subject matter of Example 93, and may further include a third microelectronic component adjacent to the second microelectronic component at the second surface of the RDL and electrically coupled to the second conductive pathway.

Example 97 may include the subject matter of Example 93, and may further specify that the second microelectronic component has a first surface at the second surface of the RDL and an opposing second surface, and may further include a third microelectronic component at the second surface of the second microelectronic component and electrically coupled to the second conductive pathway.

Example 98 may include the subject matter of Example 93, and may further specify that the power source is on the package substrate.

Example 99 may include the subject matter of Example 93, and may further specify that the surface of the package substrate is a second surface and the package substrate further includes an opposing first surface, and may further include a circuit board electrically coupled to the first surface of the package substrate, wherein the power source is on the circuit board.

Example 100 may include the subject matter of Example 99, and may further include a capacitive element at the first surface of the package substrate and electrically coupled to the first conductive pathway.

Example 101 may include the subject matter of Example 93, and may further specify that the first microelectronic component is a central processing unit, a graphics processing unit, a digital signal processor, an application specific integrated circuit, a server processor, or a crypto processor.

Example 102 may include the subject matter of Example 93, and may further specify that the second microelectronic component is a voltage regulator.

Example 103 may include the subject matter of Example 102, and may further specify that the voltage regulator is configured to convert a low current high voltage signal to a low voltage high current signal.

Example 104 may include the subject matter of Example 96, and may further specify that the third microelectronic component is an inductor.

Example 105 may include the subject matter of Example 97, and may further specify that the third microelectronic component is an inductor.

Example 106 may include the subject matter of Example 93, and may further include a heat transfer structure at the second surface of the RDL.

Example 107 is a microelectronic assembly, including a circuit board including a power source; a package substrate, having a first surface and an opposing second surface, on the circuit board and including a first conductive pathway electrically coupled to the power source at the first surface of the package substrate; a first microelectronic component, having a first surface electrically coupled to the second surface of the package substrate and an opposing second surface, embedded in an insulating material on the second surface of the package substrate and including a first through-substrate via (TSV) electrically coupled to the first conductive pathway; a second microelectronic component, having a first surface electrically coupled to the second surface of the package substrate and an opposing second surface, embedded in the insulating material and including a second TSV electrically coupled to the first conductive pathway; a redistribution layer (RDL), having a first surface on the insulating material and an opposing second surface, including a second conductive pathway electrically coupled to the first and second TSVs; and a third microelectronic component at the second surface of the RDL and electrically coupled to the second conductive pathway, wherein the second conductive pathway electrically couples the first and second TSVs, the third microelectronic component, and the second surface of the first microelectronic component.

Example 108 may include the subject matter of Example 107, and may further specify that the first surface of the first microelectronic component is an active side and the second surface of the first microelectronic component is a backside.

Example 109 may include the subject matter of Example 107, and may further specify that the first surface of the first microelectronic component is a backside and the second surface of the first microelectronic component is an active side.

Example 110 may include the subject matter of Example 107, and may further specify that the first surface of the second microelectronic component is an active side and the second surface of the second microelectronic component is a backside.

Example 111 may include the subject matter of Example 107, and may further specify that the first surface of the second microelectronic component is a backside and the second surface of the second microelectronic component is an active side.

Example 112 may include the subject matter of Example 107, and may further include a capacitive element at the first surface of the package substrate and electrically coupled to the first conductive pathway.

Example 113 may include the subject matter of Example 107, and may further include a fourth microelectronic component adjacent to the third microelectronic component at the second surface of the RDL and electrically coupled to the second conductive pathway.

Example 114 may include the subject matter of Example 107, and may further specify that the third microelectronic component has a first surface at the second surface of the RDL and an opposing second surface, and may further include a fourth microelectronic component at the second surface of the third microelectronic component and electrically coupled to the second conductive pathway.

Example 115 may include the subject matter of Example 107, and may further specify that the first microelectronic component is a central processing unit, a graphics processing unit, a digital signal processor, an application specific integrated circuit, a server processor, or a crypto processor.

Example 116 may include the subject matter of Example 107, and may further specify that the second microelectronic component is a die including input/output circuitry.

Example 117 may include the subject matter of Example 107, and may further specify that the third microelectronic component is a voltage regulator.

Example 118 may include the subject matter of Example 113, and may further specify that the fourth microelectronic component is an inductor or a capacitive element.

Example 119 may include the subject matter of Example 114, and may further specify that the fourth microelectronic component is an inductor or a capacitive element.

Example 120 is a microelectronic assembly, including a package substrate, having a surface, including a first conductive pathway electrically coupled to a power source; a first microelectronic component, having a first surface electrically coupled to the surface of the package substrate and an opposing second surface, embedded in an insulating material on the surface of the package substrate and including a through-substrate via (TSV) electrically coupled to the first conductive pathway; a redistribution layer (RDL), having a first surface on the insulating material and an opposing second surface, including a second conductive pathway electrically coupled to the TSV; a second microelectronic component at the second surface of the RDL and electrically coupled to the second conductive pathway, wherein the second conductive pathway electrically couples the TSV, the second microelectronic component, and the second surface of the first microelectronic component; and a third microelectronic component at the second surface of the RDL and electrically coupled to the second conductive pathway.

Example 121 may include the subject matter of Example 120, and may further specify that the first surface of the first microelectronic component is an active side and the second surface of the first microelectronic component is a backside.

Example 122 may include the subject matter of Example 120, and may further specify that the first surface of the first microelectronic component is a backside and the second surface of the first microelectronic component is an active side.

Example 123 may include the subject matter of Example 120, and may further specify that the third microelectronic component is adjacent to the second microelectronic component at the second surface of the RDL.

Example 124 may include the subject matter of Example 120, and may further specify that the second microelectronic component has a first surface at the second surface of the RDL and an opposing second surface, and wherein the third microelectronic component is on the second surface of the second microelectronic component.

Example 125 may include the subject matter of Example 120, and may further specify that the first microelectronic component is a central processing unit, a graphics processing unit, a digital signal processor, an application specific integrated circuit, a server processor, or a crypto processor.

Example 126 may include the subject matter of Example 120, and may further specify that the second microelectronic component is a voltage regulator.

Example 127 may include the subject matter of Example 120, and may further specify that the third microelectronic component is an inductor.

Example 128 may include the subject matter of Example 120, and may further include a heat transfer structure at the second surface of the RDL.

Example 129 may include the subject matter of Example 120, and may further specify that the power source is on the package substrate.

Example 130 may include the subject matter of Example 120, and may further specify that the surface of the package substrate is a second surface and the package substrate further includes an opposing first surface, and may further include a circuit board electrically coupled to the first surface of the package substrate, wherein the power source is on the circuit board.

Example 131 may include the subject matter of Example 130, and may further include a capacitive element at the first surface of the package substrate and electrically coupled to the first conductive pathway.

Example 132 is a microelectronic assembly, including a package substrate, having a surface, including a first conductive pathway electrically coupled to a power source; a mold material on the surface of the package substrate including a first microelectronic component, having a first surface and an opposing second surface, embedded in the mold material, a second microelectronic component embedded in the mold material, and a through-mold via (TMV), between the first and second microelectronic components, the TMV electrically coupled to the first conductive pathway; a redistribution layer (RDL), having a first surface on the mold material and an opposing second surface, including a second conductive pathway electrically coupled to the TMV; and a third microelectronic component at the second surface of the RDL and electrically coupled to the second conductive pathway, wherein the second conductive pathway electrically couples the TMV, the third microelectronic component, and the second surface of the first microelectronic component.

Example 133 may include the subject matter of Example 132, and may further specify that the first surface of the first microelectronic component is an active side and the second surface of the first microelectronic component is a backside.

Example 134 may include the subject matter of Example 132, and may further specify that the first surface of the first microelectronic component is a backside and the second surface of the first microelectronic component is an active side.

Example 135 may include the subject matter of Example 132, and may further include a fourth microelectronic component adjacent to the third microelectronic component at the second surface of the RDL and electrically coupled to the second conductive pathway.

Example 136 may include the subject matter of Example 132, and may further specify that the second microelectronic component has a first surface at the second surface of the RDL and an opposing second surface, and may further include a fourth microelectronic component at the second surface of the third microelectronic component and electrically coupled to the second conductive pathway.

Example 137 may include the subject matter of Example 132, and may further specify that the power source is on the package substrate.

Example 138 may include the subject matter of Example 132, and may further specify that the surface of the package substrate is a second surface and the package substrate further includes an opposing first surface, and may further include a circuit board electrically coupled to the first surface of the package substrate, wherein the power source is on the circuit board.

Example 139 may include the subject matter of Example 138, and may further include a capacitive element at the first surface of the package substrate and electrically coupled to the first conductive pathway.

Example 140 may include the subject matter of Example 132, and may further specify that the first microelectronic component is a central processing unit, a graphics processing unit, a digital signal processor, an application specific integrated circuit, a server processor, or a crypto processor.

Example 141 may include the subject matter of Example 132, and may further specify that the third microelectronic component is a voltage regulator.

Example 142 may include the subject matter of Example 141, and may further specify that the voltage regulator is configured to convert a low current high voltage signal to a low voltage high current signal.

Example 143 may include the subject matter of Example 135, and may further specify that the fourth microelectronic component is an inductor.

Example 144 may include the subject matter of Example 136, and may further specify that the fourth microelectronic component is an inductor.

Example 145 may include the subject matter of Example 132, and may further include a heat transfer structure at the second surface of the RDL.

Example 146 is a microelectronic assembly, including a circuit board including a power source; a package substrate, having a first surface and an opposing second surface, on the circuit board and including a first conductive pathway electrically coupled to the power source; a first microelectronic component, having a first surface and an opposing second surface, embedded in a mold material on the second surface of the package substrate; a second microelectronic component embedded in the mold material; a through-mold via (TMV), between the first and second microelectronic components, extending through the mold material and electrically coupled to the first conductive pathway; a redistribution layer (RDL), having a first surface and an opposing second surface, on the mold material with the first surface facing the mold material, including a second conductive pathway electrically coupled to the TMV; and a third microelectronic component at the second surface of the RDL and electrically coupled to the second conductive pathway, wherein the second conductive pathway electrically couples the TMV, the third microelectronic component, and the second surface of the first microelectronic component.

Example 147 may include the subject matter of Example 146, and may further specify that the first surface of the first microelectronic component is an active side and the second surface of the first microelectronic component is a backside.

Example 148 may include the subject matter of Example 146, and may further specify that the first surface of the first microelectronic component is a backside and the second surface of the first microelectronic component is an active side.

Example 149 may include the subject matter of Example 146, and may further include a fourth microelectronic component adjacent to the third microelectronic component at the second surface of the RDL and electrically coupled to the second conductive pathway.

Example 150 may include the subject matter of Example 146, and may further specify that the second microelectronic component has a first surface at the second surface of the RDL and an opposing second surface, and may further include a fourth microelectronic component at the second surface of the second microelectronic component and electrically coupled to the second conductive pathway.

Example 151 may include the subject matter of Example 146, and may further specify that the first microelectronic component is a central processing unit, a graphics processing unit, a digital signal processor, an application specific integrated circuit, a server processor, or a crypto processor.

Example 152 may include the subject matter of Example 146, and may further specify that the third microelectronic component is a voltage regulator.

Example 153 may include the subject matter of Example 152, and may further specify that the voltage regulator is configured to convert a low current high voltage signal to a low voltage high current signal.

Example 154 may include the subject matter of Example 149, and may further specify that the fourth microelectronic component is an inductor.

Example 155 may include the subject matter of Example 150, and may further specify that the fourth microelectronic component is an inductor.

Example 156 may include the subject matter of Example 146, and may further include a capacitive element at the first surface of the package substrate and electrically coupled to the first conductive pathway.

Example 157 may include the subject matter of Example 146, and may further include a heat transfer structure at the second surface of the RDL.

Example 158 may include the subject matter of Example 146, and may further specify that the mold material includes an organic material.

Example 159 is a microelectronic assembly, including a package substrate, having a surface, including a first conductive pathway electrically coupled to a power source; a first microelectronic component, having a first surface and an opposing second surface, embedded in a mold material on the second surface of the package substrate; a through-mold via (TMV), adjacent to the first microelectronic component, extending through the mold material and electrically coupled to the first conductive pathway; a redistribution layer (RDL), having a first surface and an opposing second surface, on the mold material with the first surface facing the mold material, including a second conductive pathway electrically coupled to the TMV; a second microelectronic component at the second surface of the RDL and electrically coupled to the second conductive pathway, wherein the second conductive pathway electrically couples the TMV, the second microelectronic component, and the second surface of the first microelectronic component; and a third microelectronic component at the second surface of the RDL and electrically coupled to the second conductive pathway.

Example 160 may include the subject matter of Example 159, and may further specify that the first surface of the first microelectronic component is an active side and the second surface of the first microelectronic component is a backside.

Example 161 may include the subject matter of Example 159, and may further specify that the first surface of the first microelectronic component is a backside and the second surface of the first microelectronic component is an active side.

Example 162 may include the subject matter of Example 159, and may further specify that the third microelectronic component is adjacent to the second microelectronic component at the second surface of the RDL.

Example 163 may include the subject matter of Example 159, and may further specify that the second microelectronic component has a first surface at the second surface of the RDL and an opposing second surface, and wherein the third microelectronic component is on the second surface of the second microelectronic component.

Example 164 may include the subject matter of Example 159, and may further specify that the first microelectronic component is a central processing unit, a graphics processing unit, a digital signal processor, an application specific integrated circuit, a server processor, or a crypto processor.

Example 165 may include the subject matter of Example 159, and may further specify that the second microelectronic component is a voltage regulator.

Example 166 may include the subject matter of Example 159, and may further specify that the third microelectronic component is an inductor.

Example 167 may include the subject matter of Example 159, and may further include a heat transfer structure at the second surface of the RDL.

Example 168 may include the subject matter of Example 159, and may further specify that the power source is on the package substrate.

Example 169 may include the subject matter of Example 159, and may further specify that the surface of the package substrate is a second surface and the package substrate further includes an opposing first surface, and may further include a circuit board electrically coupled to the first surface of the package substrate, wherein the power source is on the circuit board.

Example 170 may include the subject matter of Example 169, and may further include a capacitive element coupled at the first surface of the package substrate and electrically coupled to the first conductive pathway.

The invention claimed is:

1. A microelectronic assembly, comprising:
   a package substrate, having a surface, including a first conductive pathway electrically coupled to a power source;
   a first microelectronic component, having a first surface electrically coupled to the surface of the package substrate and an opposing second surface, embedded in an insulating material on the surface of the package substrate and including a through-substrate via (TSV) electrically coupled to the first conductive pathway;
   a second microelectronic component, having a first surface electrically coupled to the surface of the package substrate and an opposing second surface, embedded in the insulating material; and
   a redistribution layer (RDL), on the insulating material, including a second conductive pathway electrically coupling the TSV, the second surface of the second microelectronic component, and the second surface of the first microelectronic component.

2. The microelectronic assembly of claim 1, wherein the TSV is a first TSV, and further comprising:
a second TSV in the second microelectronic component electrically coupled to the first conductive pathway in the package substrate and to the second conductive pathway in the RDL.

3. The microelectronic assembly of claim 1, wherein the insulating material is a first insulating material, and further comprising:
a capacitive element embedded in a second insulating material between the package substrate and the first insulating material and electrically coupled to the first conductive pathway and the TSV.

4. The microelectronic assembly of claim 1, wherein the RDL has a first surface and an opposing second surface and the insulating material is at the first surface of the RDL, and further comprising:
an inductor at the second surface of the RDL and electrically coupled to the second conductive pathway.

5. The microelectronic assembly of claim 4, further comprising:
a capacitive element between the inductor and the second surface of the RDL, wherein the capacitive element is electrically coupled to the inductor and to the second conductive pathway.

6. The microelectronic assembly of claim 1, wherein the surface of the package substrate is a second surface and the package substrate further includes an opposing first surface, and further comprising:
a circuit board electrically coupled to the first surface of the package substrate, wherein the power source is on the circuit board.

7. The microelectronic assembly of claim 6, further comprising:
a capacitive element at the first surface of the package substrate and electrically coupled to the first conductive pathway.

8. The microelectronic assembly of claim 1, further comprising:
a heat transfer structure on the RDL.

9. The microelectronic assembly of claim 1, wherein the first microelectronic component is a central processing unit, a graphics processing unit, a digital signal processor, an application specific integrated circuit, a server processor, or a crypto processor.

10. The microelectronic assembly of claim 1, wherein the second microelectronic component is a voltage regulator configured to convert a low current high voltage signal to a low voltage high current signal.

11. A microelectronic assembly, comprising:
a package substrate, having a surface, including a first conductive pathway electrically coupled to a power source;
a first microelectronic component, having a first surface electrically coupled to the surface of the package substrate and an opposing second surface, embedded in an insulating material on the surface of the package substrate;
a second microelectronic component, having a first surface electrically coupled to the surface of the package substrate and an opposing second surface, embedded in the insulating material and including a through-substrate via (TSV) electrically coupled to the first conductive pathway; and
a redistribution layer (RDL), on the insulating material, including a second conductive pathway electrically coupling the TSV, the second surface of the second microelectronic component, and the second surface of the first microelectronic component.

12. The microelectronic assembly of claim 11, wherein the surface of the package substrate is a second surface and the package substrate further includes an opposing first surface, and further comprising:
a circuit board electrically coupled to the first surface of the package substrate, wherein the power source is on the circuit board.

13. The microelectronic assembly of claim 11, further comprising:
a heat transfer structure at the second surface of the RDL.

14. The microelectronic assembly of claim 11, wherein the first microelectronic component is a central processing unit, a graphics processing unit, a digital signal processor, an application specific integrated circuit, a server processor, or a crypto processor.

15. The microelectronic assembly of claim 11, wherein the second microelectronic component is a voltage regulator.

16. A microelectronic assembly, comprising:
a circuit board including a power source;
a package substrate on the circuit board and including a first conductive pathway electrically coupled to the power source;
an insulating material on the package substrate;
a first microelectronic component, having a first surface at the package substrate and an opposing second surface, embedded in the insulating material and including a first through-substrate via (TSV) electrically coupled to the first conductive pathway;
a second microelectronic component, having a first surface at the package substrate and an opposing second surface, embedded in the insulating material and including a second TSV electrically coupled to the first conductive pathway; and
a redistribution layer (RDL), on the insulating material, including a second conductive pathway electrically coupling the first and second TSVs, the second surface of the second microelectronic component, and the second surface of the first microelectronic component.

17. The microelectronic assembly of claim 16, wherein the first microelectronic component is a central processing unit, a graphics processing unit, a digital signal processor, an application specific integrated circuit, a server processor, or a crypto processor.

18. The microelectronic assembly of claim 16, wherein the second microelectronic component is a voltage regulator.

19. The microelectronic assembly of claim 16, further comprising:
a third microelectronic component, having a first surface electrically coupled to the package substrate and an opposing second surface, embedded in the insulating material and including a third TSV electrically coupled to the first conductive pathway and the second conductive pathway.

20. The microelectronic assembly of claim 19, wherein the third microelectronic component is a die including input and output circuitry.

* * * * *